(12) United States Patent
Uya et al.

(10) Patent No.: US 8,030,608 B2
(45) Date of Patent: Oct. 4, 2011

(54) BACKSIDE ILLUMINATED IMAGING DEVICE, SEMICONDUCTOR SUBSTRATE, IMAGING APPARATUS AND METHOD FOR MANUFACTURING BACKSIDE ILLUMINATED IMAGING DEVICE

(75) Inventors: Shinji Uya, Miyagi (JP); Masanori Nagase, Miyagi (JP); Yosuke Nakahashi, Miyagi (JP); Toru Hachiya, Miyagi (JP)

(73) Assignee: FujiFilm Corporation, Tokyo (JP)

( * ) Notice: Subject to any disclaimer, the term of this patent is extended or adjusted under 35 U.S.C. 154(b) by 0 days.

(21) Appl. No.: 12/821,704

(22) Filed: Jun. 23, 2010

(65) Prior Publication Data

US 2010/0291730 A1 Nov. 18, 2010

Related U.S. Application Data

(62) Division of application No. 11/856,560, filed on Sep. 17, 2007, now Pat. No. 7,781,715.

(30) Foreign Application Priority Data

| Sep. 20, 2006 | (JP) | ................................ | P2006-254041 |
| Oct. 16, 2006 | (JP) | ................................ | P2006-281544 |
| Oct. 19, 2006 | (JP) | ................................ | P2006-285194 |
| Apr. 17, 2007 | (JP) | ................................ | P2007-108264 |
| Apr. 26, 2007 | (JP) | ................................ | P2007-117051 |
| May 8, 2007 | (JP) | ................................ | P2007-123376 |

(51) Int. Cl.
*H01L 27/146* (2006.01)
*H01L 31/18* (2006.01)

(52) U.S. Cl. .................. 250/208.1; 250/214.1; 257/292; 257/460; 257/E27.133; 438/73; 438/75; 438/233

(58) Field of Classification Search ............... 250/214.1, 250/208.1; 257/291, 292, 293, 431, 460, 257/E27.133; 438/57, 73, 75, 229, 232, 233
See application file for complete search history.

(56) References Cited

U.S. PATENT DOCUMENTS 5,523,241 A * 6/1996 Wan et al. ........................ 438/73
(Continued)

FOREIGN PATENT DOCUMENTS

| CN | 1763965 A | 4/2006 |
| JP | 06-216361 A | 8/1994 |
| JP | 2001-257337 A | 9/2001 |
| JP | 2002-151676 A | 5/2002 |
| JP | 2002-185864 A | 6/2002 |
| JP | 2002-231930 A | 8/2002 |
| JP | 2003-078826 A | 3/2003 |
| JP | 2003-115581 A | 4/2003 |
| JP | 2003-347537 A | 12/2003 |
| JP | 2006-049338 A | 2/2006 |
| JP | 2006-054263 A | 2/2006 |
| JP | 2006-093587 A | 4/2006 |
| JP | 2006-134915 A | 5/2006 |
| KR | 2001-0090448 A | 10/2001 |
| KR | 2003-0089496 | 11/2003 |
| KR | 2006-0048661 | 5/2006 |
| KR | 2006-0050804 A | 12/2007 |

OTHER PUBLICATIONS

Japanese Office Action dated Aug. 31, 2010.

*Primary Examiner* — John Lee
(74) *Attorney, Agent, or Firm* — Birch, Stewart, Kolasch & Birch, LLP

(57) ABSTRACT

A backside illuminated imaging device performs imaging by illuminating light from a back side of a p substrate to generate electric charges in the substrate based on the light and reading out the electric charges from a front side of the substrate. The device includes n layers located in the substrate and on an identical plane near a front side surface of the substrate and accumulating the electric charges; n+ layers between the respective n layers and the front side of the substrate, the n+ layers having an exposed surface exposed on the front side surface of the substrate and functioning as overflow drains for discharging unnecessary electric charges accumulated in the n layers; p+ layers between the respective n+ layers and the n layers and functioning as overflow barriers of the overflow drains; and an electrode connected to the exposed surface of each of the n+ layers.

8 Claims, 43 Drawing Sheets

U.S. PATENT DOCUMENTS

| | | |
|---|---|---|
| 7,535,073 B2 | 5/2009 | Ezaki |
| 7,656,000 B2 | 2/2010 | Hsu et al. |
| 7,781,715 B2 * | 8/2010 | Uya et al. .................. 250/208.1 |
| 2001/0032987 A1 | 10/2001 | Narui et al. |
| 2005/0077588 A1 | 4/2005 | Kasuga |
| 2006/0006488 A1 | 1/2006 | Kanbe |
| 2006/0043519 A1 | 3/2006 | Ezaki |
| 2006/0076590 A1 * | 4/2006 | Pain et al. .................... 257/294 |
| 2006/0125036 A1 | 6/2006 | Kasuga |
| 2008/0217724 A1 | 9/2008 | Uya |
| 2008/0283726 A1 | 11/2008 | Uya et al. |
| 2008/0290441 A1 | 11/2008 | Hsu et al. |
| 2009/0014793 A1 | 1/2009 | Manabe |
| 2009/0057803 A1 | 3/2009 | Kanbe |
| 2009/0200586 A1 * | 8/2009 | Mao et al. .................... 257/292 |

\* cited by examiner

INCIDENT LIGHT

INCIDENT LIGHT

IN CASE OF MIDDLE LAYER OF p-TYPE ($2 \times 10^{14}/cm^3$)

IN CASE OF MIDDLE LAYER OF n-TYPE ($2 \times 10^{14}/cm^3$)

IN CASE OF MIDDLE LAYER OF i-TYPE

IN CASE OF MIDDLE LAYER OF p-TYPE ($2 \times 10^{13}/cm^3$)

IN CASE OF MIDDLE LAYER OF n-TYPE ($2 \times 10^{13}/cm^3$)

IN CASE OF MIDDLE LAYER OF i-TYPE

IN CASE OF MIDDLE LAYER OF n-TYPE ($2 \times 10^{13}/cm^3$)

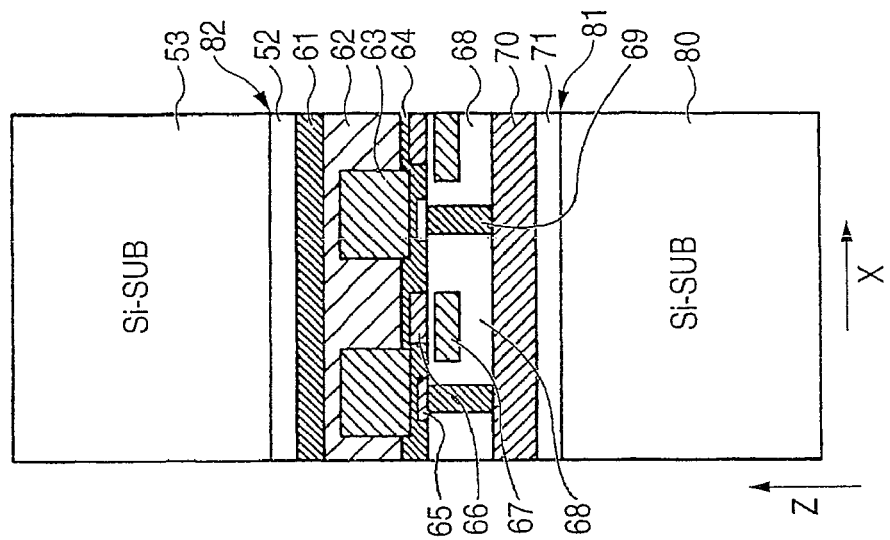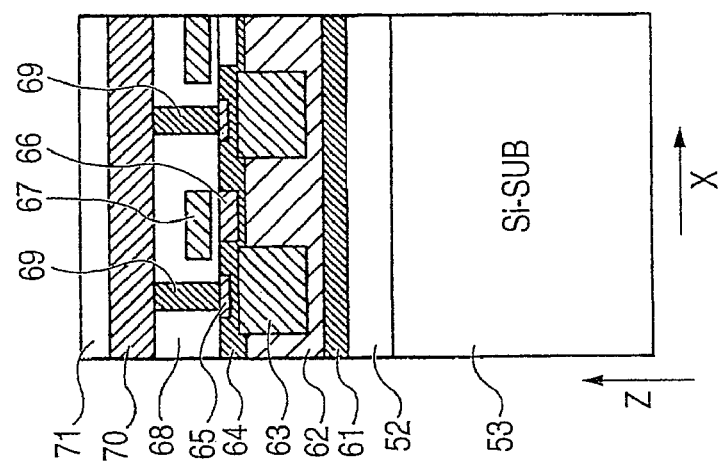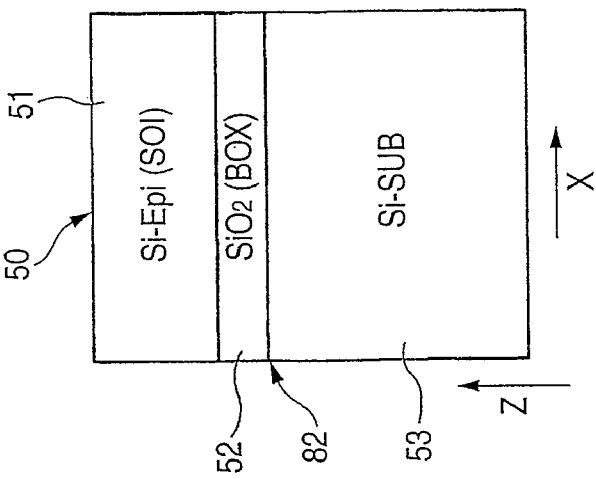

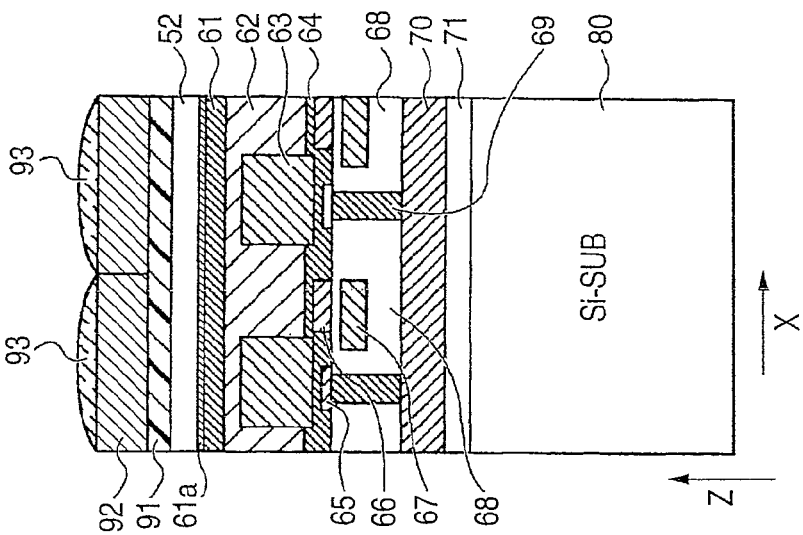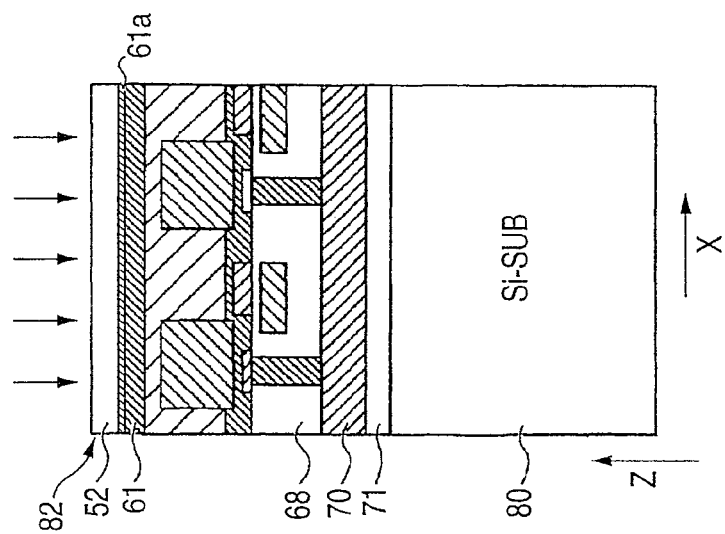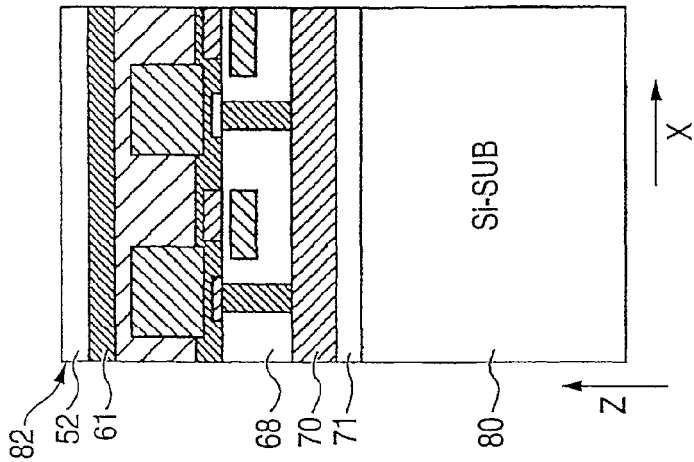

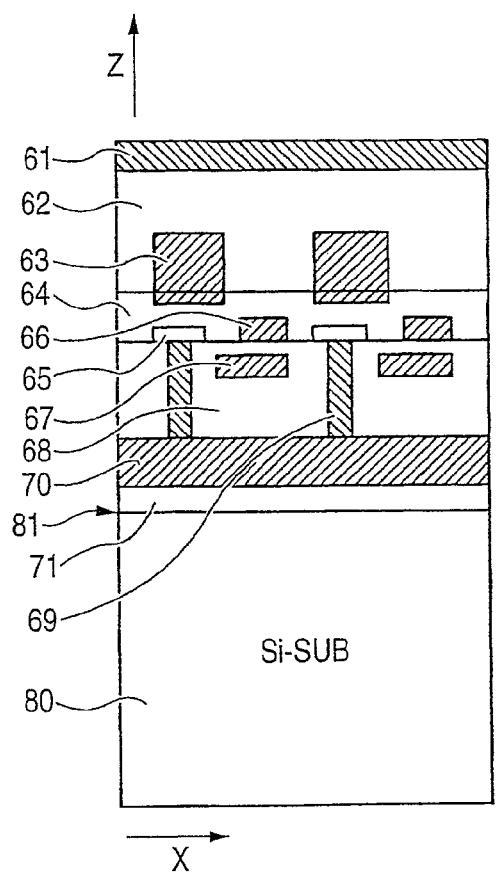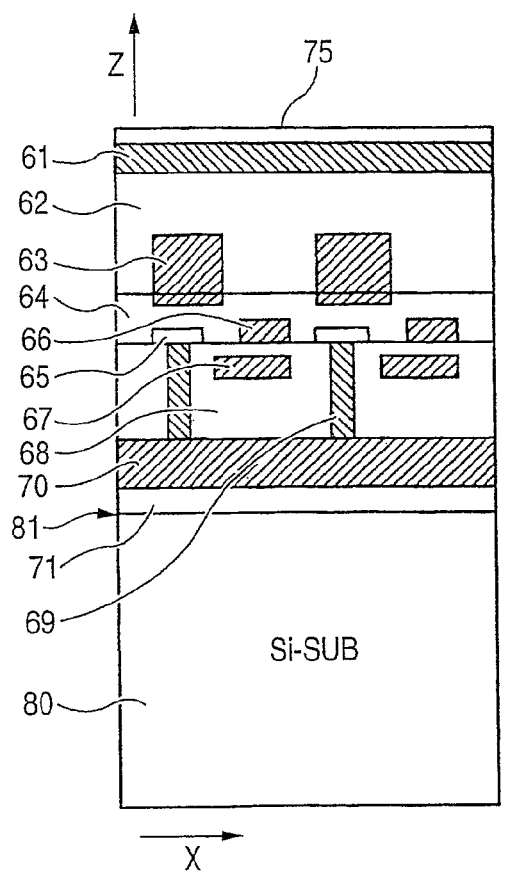
FIG. 34 (a) FIG. 34 (b)

BACKSIDE ILLUMINATED IMAGING DEVICE, SEMICONDUCTOR SUBSTRATE, IMAGING APPARATUS AND METHOD FOR MANUFACTURING BACKSIDE ILLUMINATED IMAGING DEVICE

This application is a divisional of U.S. application Ser. No. 11/856,560, filed on Sep. 17, 2007 now U.S. Pat. No. 7,781,715 which is based on and claims priority under 35 USC §119 from Japanese Patent Application Nos. 2006-254041, 2006-281544, 2006-285194, 2007-108264, 2007-117051 and 2007-123376, filed Sep. 20, 2006, Oct. 16, 2006, Oct. 19, 2007, Apr. 17, 2007, Apr. 26, 2007 and May 8, 2007, respectively, the entire disclosures of which are herein incorporated by reference.

BACKGROUND OF THE INVENTION

1. Field of the Invention

The present invention relates to a backside illuminated imaging device that performs imaging by illuminating light from a back side of a semiconductor substrate to generate electric charges in the semiconductor substrate based on the light and reading out the electric charges from a front side of the semiconductor substrate.

2. Description of Related Art

An imaging portion of a general solid-state imaging device is configured by arranging a plurality of fine photoelectric conversion cells including photodiodes in one or two dimensions. Since a high-resolution image can be captured by arranging an increased number of photoelectric conversion cells in a device of a limited size, it is desired to miniaturize the photoelectric conversion cells. The miniaturization limit is determined by a wavelength of light of a detection target and is determined by a wavelength (400-700 nm) of a visible light region in the case of a general visible light image sensor.

In the case of a general (frontside illuminated type) image sensor, a photoelectric conversion portion of each cell is formed below a wiring layer in which an electrode or the like is arranged. A wiring portion of the wiring layer interferes with transmission of light incident into each photoelectric conversion portion. For this, various devices are provided. For example, when an area of each cell is about 2×2 (μm), an effective opening area of a light receiving portion is 1×1 (μm) in most cases. It has been found that sensitivity is abruptly degraded according to cell miniaturization in principle.

Accordingly, a backside illuminated imaging device has been considered. That is, a light receiving portion is provided in a backside opposite to a front side surface of a semiconductor substrate in which a wiring layer of an electrode or the like is formed. Signal charges based on light incident from the backside are generated in a photoelectric conversion portion of each cell. Since the opening area of the light receiving portion of each cell is not affected by the wiring layer, a relatively large opening area can be achieved and sensitivity degradation can be prevented even when the photoelectric conversion cell is miniaturized.

FIG. 38 is a schematic cross-sectional view of the most common structure of a CCD type solid-state imaging device of an interline type.

As shown in FIG. 38, a p-type semiconductor 102 including p-type impurities is formed in a deep portion of an n-type silicon substrate 101. In the surface portion of the n-type silicon substrate 101, an n-type semiconductor layer 104 including n-type impurities for accumulating electric charges and a p-type semiconductor layer 105 including high-concentration p-type impurities for preventing a surface dark current are formed. Electric charges generated in a region from the surface of the silicon substrate 101 to the surface of the p-type semiconductor 102 (i.e., a photoelectric conversion region for generating electric charges contributing to imaging) are accumulated in the n-type semiconductor layer 104. An element separation layer 103 for separating adjacent photoelectric conversion regions is formed in the silicon substrate 101.

A potential profile taken along the line A-A of FIG. 38 is shown in FIG. 39. A depletion layer thickness of the photoelectric conversion region is about 2 μm. The electric charges generated in the deep portion of the silicon substrate 101 are not transferred to the n-type semiconductor layer 104 and does not contribute to imaging. FIG. 40 shows the relationship between the depletion layer thickness of the photoelectric conversion region and the optical absorptance of the photoelectric conversion region. An optical absorption coefficient of silicon depends on a wavelength as shown in FIG. 41. As a light wavelength is long, the light is transmitted up to the deep portion of the silicon substrate 101.

For example, when green light of a wavelength of 550 nm is considered, only light of 75% is absorbed in the depletion layer thickness of 2 μm and light of 97% is absorbed in the depletion layer thickness of 5 μm. From properties as shown in FIG. 40, it can be seen that it is preferable to form the depletion layer thickness of 5 μm or more in the photoelectric conversion region in order to implement high sensitivity.

A backside illuminated imaging device performs imaging by illuminating light from a back side of a semiconductor substrate, accumulating electric charges generated in the semiconductor substrate based on the light, and externally outputting signals base based on the accumulated electric charges by means of a charge coupled device (CCD) or complementary metal oxide semiconductor (CMOS) circuit or the like. This device is a solid-state imaging device for illuminating and employing light from the back side of the silicon substrate 101 in FIG. 38.

It is well known that this backside illuminated imaging device can realize high photoelectric conversion efficiency. Accordingly, if the depletion layer thickness has 10 μm or more in the backside illuminated imaging device, a device having very high sensitivity can be realized. However, a continuous potential slope from the backside of the silicon substrate into which light is incident to a charge accumulation layer formed on the surface of the silicon substrate should be formed to surely realize a signal charge separation between different photoelectric conversion regions. In other words, electric charges generated in the vicinity of the silicon substrate backside of each photoelectric conversion region should be able to be accurately transferred to the charge accumulation layer within the photoelectric conversion region.

In a general embedded photodiode, a depletion voltage is 3-4 V. A potential difference is only 3-4 V when the potential of a p-type semiconductor layer for reducing a dark current provided in a silicon substrate backside of a backside illuminated imaging device is set to 0 V. It is very difficult to form a depletion layer having a thickness of 10 μm in the continuous potential slope.

There has been proposed a technique capable of forming a continuous potential slope by stacking a plurality of n-type semiconductor layers formed by gradually varying an impurity concentration of the silicon substrate 101 between the p-type semiconductor layer 102 and the n-type semiconductor layer 104 shown in FIG. 38 (see JP-A-2006-134915).

FIG. 42 is a view showing simulation results of a backside illuminated imaging device in a concentration profile as shown in an embodiment of JP-A-2006-134915. In FIG. 42, a coordinate axis z represents the depth of a semiconductor substrate, and z=0 represents the surface of the semiconductor substrate. From device simulations executed in a concentration profile as shown in the embodiment of JP-A-2006-134915, it can be seen that the concentration profile of the embodiment is not actual since an electron pool is formed in a large portion of a photoelectric conversion region. As shown in FIG. 43, a maximum potential point occurs in a position of 3 μm from the semiconductor substrate surface even when similar device simulations are executed by decreasing the number of digits representing the concentration of the concentration profile as shown in the embodiment of JP-A-2006-134915 by 2. When signal charges accumulated in this depth are read out from a CCD or CMOS formed in the semiconductor substrate surface, there is a difficulty since a problem of a residual image or the like occurs.

Also in the backside illuminated imaging device like the frontside illuminated type imaging device, an overflow drain structure should be provided to discharge unwanted electric charges, unnecessary for image pickup, accumulated in a photoelectric conversion element. Overflow drain structures applicable to the backside illuminated imaging device are a vertical type overflow drain structure and a horizontal type overflow drain structure. Since a drain region is arranged adjacent and parallel to each photoelectric conversion element in the horizontal type overflow drain structure, a size of each constituent element may not sufficiently increase when miniaturization is carried out in this structure, such that it is difficult to keep a saturation signal amount (or to improve the sensitivity). On the other hand, the vertical type overflow drain structure may secure a size of each constituent element even when miniaturization is carried out since the drain region is provided below each photoelectric conversion element, such that a saturation signal amount may be kept (the sensitivity may be improved).

JP-A-2001-257337 discloses a configuration adopting the vertical overflow drain structure in the backside illuminated imaging device.

JP-A-2006-49338 discloses a configuration in which an overflow drain structure is provided on a surface of a backside illuminated imaging device.

Since the configuration disclosed in JP-A-2001-257337 is that in which light illuminated from a backside of the backside illuminated imaging device is incident into a vertical overflow drain region and the light passed through the vertical overflow drain region is incident into a photoelectric conversion element, electric charges generated in the vertical overflow drain region and its depletion layer are discharged from the drain region. Since this drain region is present in a swallow position within a semiconductor substrate viewed from an incident light side, a lot of light of a wavelength band of the blue color is absorbed therein. As a result, the imaging device has a remarkable low blue sensitivity.

According to the configuration as disclosed in JP-A-2006-49338, the degradation of blue sensitivity may be prevented. However, since a drain region is not provided above a position separated from a maximum potential point of a photodiode, excessive charges may not be sufficiently discharged. Specifically, when an electronic shutter function is realized by discharging all electric charges accumulated in the photodiode, fixed pattern noise or the like is caused by electric charges residual in the photodiode when the electronic shutter is turned on.

Incidentally, a defect of a semiconductor device occurs due to contamination by heavy metal during a fabrication process, such that a device property may be deteriorated or reliability may be degraded. There is a gettering technique for reducing the effect of this metal contamination. Since an image sensor is very sensitive to noise occurring due to a dark current, sufficient light shielding is required, but the dark current is apt to increase also in contamination by heavy metal. Accordingly, when the image sensor is manufactured, the sufficient gettering property is required for a semiconductor device.

When a frontside illuminated type imaging device is manufactured, a manufacturing method based on "backside gettering" is conventionally adopted to provide the sufficient gettering effect to a backside of a semiconductor substrate using a defect-free thick epitaxial wafer or a wafer based on phosphorus gettering or polyback seal.

However, since the light receiving portion is to be provided in the backside of the semiconductor substrate when the backside illuminated imaging device is manufactured, the two sides (or the top and bottom) of the semiconductor substrate are conventionally reversed during a manufacturing process. Accordingly, when the frontside illuminated type imaging device is manufactured, "backside gettering" to be conventionally performed may not be applied, such that there is a high possibility that the required sufficient gettering property is not obtained.

In general, a silicon-on-insulator (SOI) substrate is used as a semiconductor wafer when a backside illuminated imaging device is manufactured. In this case, since a $Si/SiO_2$ interface serving as an interface of an SOI layer and a BOX layer forming a semiconductor substrate functions as a robust gettering side, contaminated heavy metal may be protected. A backside of the substrate is thick (i.e., generally 600 μm) in the case of the backside illuminated imaging device, whereas an interface itself of the SOI layer and the BOX layer forming the semiconductor substrate is close to a device operation region (i.e., a depletion region). Accordingly, there is a high possibility that the gettering side becomes a dark current source, that is, a noise source.

SUMMARY OF THE INVENTION

A first object of an illustrative, non-limiting embodiment of the invention is to provide a backside illuminated imaging device having an overflow drain structure advantageous to miniaturization that can prevent the degradation of blue sensitivity.

A second object of an illustrative, non-limiting embodiment of the invention is to provide a backside illuminated imaging device having an overflow drain structure advantageous to miniaturization that can prevent the degradation of blue sensitivity and can completely discharge unnecessary charges or realize an electronic shutter function having reduced fixed pattern noise.

A third object of an illustrative, non-limiting embodiment of the invention is to provide a backside illuminated imaging device capable of surely realizing a signal charge separation between different photoelectric conversion regions even when a depletion layer of the photoelectric conversion region is thick.

A fourth object of an illustrative, non-limiting embodiment of the invention is to provide a method of manufacturing a backside illuminated imaging device, a backside illuminated imaging device, and an imaging apparatus using the same that can obtain a sufficient gettering property.

A fifth object of an illustrative, non-limiting embodiment of the invention is to provide a method of manufacturing a backside illuminated imaging device, a backside illuminated imaging device, and an imaging apparatus having the same that can stabilize a gettering capability and prevent an increase in a dark current.

<First Aspect>

(1-1) A backside illuminated imaging device that performs imaging by illuminating light from a back side of a semiconductor substrate to generate electric charges in the semiconductor substrate based on the light and reading out the electric charges from a front side of the semiconductor substrate, which comprises:

a plurality of first impurity diffusion layers located in the semiconductor substrate and on an identical plane near a front side surface of the semiconductor substrate, the first impurity diffusion layers having a first conductivity and accumulating the electric charges;

a plurality of second impurity diffusion layers between the respective first impurity diffusion layers and the front side of the semiconductor substrate, the second impurity diffusion layers having an exposed surface exposed on the front side surface of the semiconductor substrate, having the first conductivity, and functioning as overflow drains for discharging unnecessary electric charges accumulated in the plurality of first impurity diffusion layers;

a plurality of third impurity diffusion layers between the respective second impurity diffusion layers and the respective first impurity diffusion layers, the third impurity diffusion layers having a second conductivity opposite to the first conductivity, and functioning as overflow barriers of the overflow drains; and an electrode connected to the exposed surface of each of the second impurity diffusion layers.

(1-2) The backside illuminated imaging device according to item (1-1), wherein the electrode connected to the exposed surface of each of the plurality of second impurity diffusion layers is commonly connected to specific second impurity diffusion layers and is adapted to independently apply a voltage to each of the specific second impurity diffusion layers.

(1-3) The backside illuminated imaging device according to item (1-2), further comprising a color filter layer below the back side of the semiconductor substrate, wherein the color filter layer includes a plurality of color filters corresponding to the respective second impurity diffusion layers, the plurality of color filters are classified into a plurality of groups of color filters, the groups transmitting light of different wavelength bands, and the specific second impurity diffusion layers corresponds to the same group of color filters.

(1-4) The backside illuminated imaging device according to item (1-2), wherein the plurality of second impurity diffusion layers are classified into a first group corresponding to the first impurity diffusion layers in which the electric charges are read out in a specific imaging mode and a second group corresponding to the first impurity diffusion layers in which the electric charges are not read out in the specific imaging mode, and all of the specific second impurity diffusion layers belongs to one of the first and second groups.

(1-5) The backside illuminated imaging device according to any one of items (1-1) to (1-4), further comprising: a diffusion prevention layer that prevents diffusion of a conductivity material constituting the electrode, the diffusion prevention layer being between the electrode and each of the second impurity diffusion layers.

(1-6) The backside illuminated imaging device according to any one of items (1-1) to (1-5), wherein the electrode is made of W, Ti, Mo, or silicide thereof.

(1-7) The backside illuminated imaging device according to any one of items (1-1) to (1-6), further comprising:

an insulating layer below a back side surface of the semiconductor substrate;

a fourth impurity diffusion layer inside from the back side surface of the semiconductor substrate, having the second conductivity, and having a higher concentration than the semiconductor substrate; and a terminal that applies a voltage to the fourth impurity diffusion layer.

(1-8) The backside illuminated imaging device according to any one of items (1-1) to (1-6), further comprising:

an insulating layer below a back side surface of the semiconductor substrate;

a transparent electrode below the insulating layer, the transparent electrode being transparent to the light; and a terminal that applies a voltage to the transparent electrode.

(1-9) The backside illuminated imaging device according to any one of items (1-1) to (1-8), wherein a distance from a back side surface to the front side surface of the semiconductor substrate is equal to or more than 5 μm.

(1-10) The backside illuminated imaging device according to item (1-9), wherein the distance is equal to or more than 10 μm.

(1-11) The backside illuminated imaging device according to any one of items (1-1) to (1-10), which read out a signal, in a frame interline method, based on the electric charges accumulated in the first impurity diffusion (1-12) The backside illuminated imaging device according to any one of items (1-1) to (1-10), further comprising a metal oxide semiconductor circuit that read out a signal based on the electric charges accumulated in the first impurity diffusion layer.

(1-13) The backside illuminated imaging device according to any one of items (1-1) to (1-12), further comprising a voltage application unit that applies to the electrode a voltage for adjusting a saturation charge amount of the first impurity diffusion layers.

(1-14) The backside illuminated imaging device according to any one of items (1-1) to (1-12), further comprising a voltage application unit that applies to the electrode a voltage required to eliminate an overflow barrier in the third impurity diffusion layers.

(1-15) The backside illuminated imaging device according to any one of items (1-1) to (1-12), further comprising:

a first voltage application unit that applies to the electrode a voltage for adjusting a saturation charge amount of the first impurity diffusion layers; and a second voltage application unit that applies to the electrode a voltage required to eliminate an overflow barrier in the third impurity diffusion layers.

(1-16) A method for manufacturing a backside illuminated imaging device according to item (1-1), comprising:

forming a first impurity diffusion layer and a fifth impurity diffusion layer in the semiconductor substrate such that the fifth impurity diffusion layer is formed in a direction from the front side surface to an inner side of the semiconductor substrate and the first impurity diffusion layer is formed below the fifth impurity diffusion layer, the fifth impurity diffusion layer having the second conductivity and preventing a dark current;

forming an insulating layer on the semiconductor substrate in which the first impurity diffusion layer and the fifth impurity diffusion layer are formed;

forming an opening in a portion of the insulating layer to expose a portion of a surface of the fourth impurity diffusion layer;

forming a second impurity diffusion layer in the fifth impurity diffusion layer by self-alignment in which the insulating layer serves as a mask; and embedding a conductivity material in the opening to form an electrode, wherein a portion except the second impurity diffusion layer of the fifth impurity diffusion layer has a function of a third impurity diffusion layer.

(1-17) The method according to item (1-16), wherein the second impurity diffusion layer is formed by vertical ion implantation to a surface of the fifth impurity diffusion layer exposed from the opening.

(1-18) The method according to item (1-16), wherein the second impurity diffusion layer is formed by oblique ion implantation in at least four directions to a surface of the fourth impurity diffusion layer exposed from the opening.

(1-19) The method according to any one of items (1-16) to (1-19), further comprising:

forming a sixth impurity diffusion layer having the second conductivity below the second impurity diffusion layer by self-alignment in which the insulating layer serves as the mask, between the forming of the second impurity diffusion layer and the forming of the electrode, wherein a portion except the second impurity diffusion layer of the fifth impurity diffusion layer and the sixth impurity diffusion layer has a function of the third impurity diffusion layer.

(1-20) The method according to item (1-19), wherein the sixth impurity diffusion layer includes impurities having a diffusion coefficient having larger than that of impurities in the second impurity diffusion layer.

(1-21) The method according to item (1-19) or (1-20), wherein the sixth impurity diffusion layer is formed by vertical ion implantation to a surface of the fifth impurity diffusion layer exposed from the opening.

(1-22) The method according to item (1-19) or (1-20), wherein the sixth impurity diffusion layer is formed by oblique ion implantation in at least four directions to a surface of the fourth impurity diffusion layer exposed from the opening.

(1-23) The method according to any one of items (1-16) to (1-22), wherein the conductivity material is tungsten.

An exemplary embodiment of the first aspect can provide a backside illuminated imaging device having an overflow drain structure advantageous to miniaturization that can prevent the degradation of blue sensitivity.

<Second Aspect>

(2-1) According to an aspect of A backside illuminated imaging device that performs imaging by illuminating light from a back side of a semiconductor substrate to generate electric charges in the semiconductor substrate based on the light and reading out the electric charges from a front side of the semiconductor substrate, which comprises:

a plurality of first impurity diffusion layers located in the semiconductor substrate and on an identical plane near a front side surface of the semiconductor substrate, the first impurity diffusion layers having a first conductivity and accumulating the electric charges;

a plurality of second impurity diffusion layers between the respective first impurity diffusion layers and the front side of the semiconductor substrate, the second impurity diffusion layers having the first conductivity, and functioning as overflow drains for discharging unnecessary electric charges accumulated in the plurality of first impurity diffusion layers; and a plurality of third impurity diffusion layers between the respective second impurity diffusion layers and the respective first impurity diffusion layers, the third impurity diffusion layers having a second conductivity opposite to the first conductivity, and functioning as overflow barriers of the overflow drains, wherein each of the second impurity diffusion layers is located in a position overlapping with a maximum potential point of the corresponding first impurity diffusion layer in plan view.

(2-2) The backside illuminated imaging device according to item (2-1), wherein the maximum potential point is in a center of the corresponding first impurity diffusion layer in the plan view.

(2-3) The backside illuminated imaging device according to item (2-1) or (2-2), wherein the maximum potential point is in a depth of within 0.3 μm from a boundary surface of the corresponding first impurity diffusion layer and the corresponding third impurity diffusion layer.

(2-4) The backside illuminated imaging device according to any one of items (2-1) to (2-3), further comprising a depletion-layer extension layer for extending a depletion layer formed by each of the second impurity diffusion layers in a direction parallel to the front side surface of the semiconductor substrate, the depletion-layer extension layer being located in the vicinity of each of the second impurity diffusion layers and being an impurity diffusion layer having a first conductivity and a lower concentration than that of the second impurity diffusion layers.

(2-5) The backside illuminated imaging device according to any one of items (2-1) to (2-4), wherein each of the second impurity diffusion layer is a depletion layer covering ⅔ or more of the corresponding first impurity diffusion layer.

(2-6) The backside illuminated imaging device according to any one of items (2-1) to (2-5), wherein each of the second impurity diffusion layers has an exposed surface exposed on the front side surface of the semiconductor substrate, the exposed surface being connected to an electrode.

(2-7) An imaging device, comprising:

a backside illuminated imaging device according to item (2-6);

a first voltage application unit that applies to the electrode a first voltage determining a saturation charge amount of the first impurity diffusion layers; and a second voltage application unit that applies to the electrode a second voltage higher than the first voltage to eliminate the overflow bathers formed by the third impurity diffusion layers when the first voltage is applied.

(2-8) The imaging device according to item (2-7), wherein the second voltage application unit variably controls an application time of the second voltage to adjust an exposure time of the backside illuminated imaging device.

(2-9) The imaging device according to item (2-7) or (2-8), wherein the first voltage application unit variable controls the first voltage to adjust the saturation charge amount of the first impurity diffusion layers.

(2-10) The imaging device according to any one of items (2-7) to (2-9), wherein the second voltage is determined by a value based on the first voltage.

(2-11) The imaging device according to any one of items (2-7) to (2-10), wherein the backside illuminated imaging device includes: a vertical charge transfer device that transfers electric charges accumulated in each of the first impurity diffusion layers in a vertical direction; and a horizontal charge transfer device that transfers the electric charges transferred from the vertical charge transfer device in a horizontal direction orthogonal to the vertical direction, the first voltage is less than or equal to a driving voltage of the horizontal charge transfer device, and the second voltage is less than or equal to a readout voltage for reading out the electric charges to the vertical charge transfer device.

(2-12) The imaging device according to item (2-11), wherein
the first impurity diffusion layers is classified into n groups, wherein n is a natural number of 2 or more,
an addition transfer mode in which electric charges accumulated in the respective groups are added and transferred in the vertical transfer device and a non-addition mode in which electric charges accumulated in the respective groups are transferred in the vertical transfer device without addition are set, and
the first voltage application unit variably controls the first voltage such that the saturation charge amount of the first impurity diffusion layers when the addition transfer mode is set is 1/n of the saturation charge amount of the first impurity diffusion layer determined by the first voltage to be applied to the electrode when the non-addition transfer mode is set.

(2-13) The imaging device according to item (2-11) or (2-12), wherein
the backside illuminated imaging device includes a source follower circuit that converts electric charges transferred from the horizontal charge transfer device into a voltage signal to output the voltage signal,
the vertical charge transfer device operates at three voltages of VH representing a highest voltage, VL representing a lowest voltage, and VM representing a voltage between VH and VL, and
the second voltage is a value computed by adding the first voltage and one of an application voltage for a drain of a transistor of a last stage of the source follower circuit, a difference between the VL and the VM, and a difference between the VH and the VM.

(2-14) The imaging device according to any one of items (2-7) to (2-10), wherein the backside illuminated imaging device includes: a charge accumulation layer that reads out and accumulates electric charges accumulated in each of the first impurity diffusion layers; and a CMOS circuit that outputs a signal based on the electric charges accumulated in the charge accumulation layer.

An exemplary embodiment of the second aspect can provide a backside illuminated imaging device having an overflow drain structure advantageous to miniaturization that can prevent the degradation of blue sensitivity and can completely discharge unnecessary charges or realize an electronic shutter function having reduced fixed pattern noise.

<Third Aspect>

(3-1) A backside illuminated imaging device that performs imaging by illuminating light from a back side of a semiconductor substrate to generate electric charges in the semiconductor substrate based on the light and reading out the electric charges from a front side of the semiconductor substrate, which comprises:
a first semiconductor layer in the semiconductor substrate, the first semiconductor layer having a first conductivity and accumulating the electric charges;
a second semiconductor layer inside from a back side surface of the semiconductor substrate and having a second conductivity opposite to the first conductivity type; and
a third semiconductor layer between the first semiconductor layer and the second semiconductor layer, the third semiconductor layer having an impurity concentration of $1.0\times10^{14}/cm^3$ or less.

(3-2) The backside illuminated imaging device according to item (3-1), wherein the third semiconductor layer is n-type or p-type and has an impurity concentration of more than $2.0\times10^{13}/cm^3$ and less than $1.0\times10^{14}/cm^3$.

(3-3) A backside illuminated imaging device that performs imaging by illuminating light from a back side of a semiconductor substrate to generate electric charges in the semiconductor substrate based on the light and reading out the electric charges from a front side of the semiconductor substrate, which comprises:
a first semiconductor layer in the semiconductor substrate, the first semiconductor layer having a first conductivity and accumulating the electric charges;
a second semiconductor layer inside from a back side surface of the semiconductor substrate and having a second conductivity opposite to the first conductivity type;
a third semiconductor layer having the first conductivity and having an impurity concentration is $2.0\times10^{14}/cm^3$ or less; and
a fourth semiconductor layer having the second conductivity and having an impurity concentration of $2.0\times10^{14}/cm^3$ or less,
the third and fourth semiconductor layers being between the first semiconductor layer and the second semiconductor layer.

(3-4) The backside illuminated imaging device according to item (3-3), further comprising a fifth semiconductor layer between the third and fourth semiconductor layers, the fifth semiconductor layer having an impurity concentration of $1.0\times10^{14}/cm^3$ or less.

(3-5) A semiconductor substrate for use in a semiconductor device, comprising:
a first semiconductor layer inside from one surface of the semiconductor substrate, the first semiconductor layer having a first conductivity; and
a second semiconductor layer on the first semiconductor layer, the second semiconductor layer having an impurity concentration of $1.0\times10^{14}/cm^3$ or less.

(3-6) The semiconductor substrate according to item (3-5), wherein the second semiconductor layer is n-type or p-type and has an impurity concentration of more than $2.0\times10^{13}/cm^3$ and less than $1.0\times10^{14}/cm^3$.

(3-7) A semiconductor substrate for use in a semiconductor device, comprising:
a first semiconductor layer inside from one surface of the semiconductor substrate, the first semiconductor layer having a first conductivity;
a second semiconductor layer on the first semiconductor layer, the second semiconductor layer having the first conductivity or a second conductivity opposite to the first conductivity and having an impurity concentration of $2.0\times10^{14}/cm^3$ or less; and
a third semiconductor layer on the second semiconductor layer, the third semiconductor layer having a conductivity opposite to that of the second semiconductor layer and having an impurity concentration of $2.0\times10^{14}/cm^3$ or less.

(3-8) The semiconductor substrate according to item (3-7), further comprising a fourth semiconductor layer between the second and third semiconductor layers, the fourth semiconductor layer having an impurity concentration of $1.0\times10^{14}/cm^3$ or less.

(3-9) The backside illuminated imaging device according to any one of items (3-1) to (3-4) wherein a thickness from a front side surface to a back side surface of the semiconductor substrate is 5 μm or more.

(3-10) The backside illuminated imaging device according to item (3-9), wherein the thickness is 8 μm or more.

(3-11) The backside illuminated imaging device according to any one of items (3-5) to (3-8) wherein a thickness from a front side surface to a back side surface of the semiconductor substrate is 5 μm or more.

(3-12) The backside illuminated imaging device according to item (3-11), wherein the thickness is 8 μm or more.

An exemplary embodiment of the third aspect can provide a backside illuminated imaging device capable of surely realizing a signal charge separation between different photoelectric conversion regions even when a depletion layer of the photoelectric conversion region is thick.

<Fourth Aspect>

(4-1) A method for manufacturing a backside illuminated imaging device that performs imaging by illuminating light from a back side of a semiconductor substrate, which is opposite to a front side of the semiconductor substrate having an electrode, to generate electric charges in the semiconductor substrate based on the light and reading out the electric charges from the front side, which comprises the steps of:

a first step of forming a photoelectric conversion region and a charge transfer portion in a conductive semiconductor layer of an SOI substrate including a first semiconductor support substrate, an insulating layer, and a conductive semiconductor layer in this order, the photoelectric conversion region including a light receiving portion, the charge transfer portion transferring signal charges generated in the photoelectric conversion region to a signal output portion;

a second step of fixing a surface of the SOI substrate opposite to the first semiconductor support substrate to a second semiconductor support substrate;

a third step of removing the first semiconductor support substrate from the SOI substrate; and a fourth step of performing ion implantation for gettering into the conductive semiconductor layer of the SOI substrate.

According to the method of manufacturing the backside illuminated imaging device, contamination by heavy metal in which transition metal is a main body occurs in a surface opposite to a conductivity type semiconductor layer of an SOI substrate in a process result related to the first step. When a defect is formed on the contaminated surface by ion implantation of the fourth step, the defect formed by the ion implantation functions as a gettering side for protecting the heavy metal of contamination, such that the required sufficient gettering property can be obtained and a dark current occurring due to the effect of heavy metal of contamination can be reduced.

(4-2) The method according to item (4-1), further comprising removing the insulating layer formed on the conductive semiconductor layer before the ion implantation in the fourth step.

According to the method of manufacturing the backside illuminated imaging device, a layer contaminated by the heavy metal is eliminated by removing the insulating layer, such that the occurrence of the dark current can be surely prevented.

(4-3) The method according to item (4-2), further comprising forming a protection film on the conductive semiconductor layer from which the insulating layer is removed, wherein the performing of the ion implantation in the fourth step is a process of implanting ions into the conductive semiconductor layer through the protection film.

According to the method of manufacturing the backside illuminated imaging device, the conductivity type semiconductor layer can be protected after removing the insulating film by forming the protection layer.

(4-4) The method according to any one of items (4-1) to (4-3), wherein the ion implantation in the fourth step is performed with an ion of one selected of the group consisting of carbon, oxygen, fluorine, silicon, hydrogen, and nitride.

According to the method of manufacturing the backside illuminated imaging device, a better gettering effect can be achieved in each ion type of carbon, oxygen, fluorine, and silicon exhibiting the gettering effect. Specifically, an interface of an insulating film ($SiO_2$) and a silicon (Si) forming the SOI substrate is suitable for an ion type of each of hydrogen and nitride. When the above-described ion types are used, a side effect other than gettering to the silicon bulk and the interface does not occur and the defect functioning as the gettering side can be surely formed.

(4-5) The method according to any one of items (4-1) to (4-4), further comprising performing a low-temperature anneal treatment in an environment of 500° C. or less after the performing of the ion implantation.

According to the backside illuminated imaging device, the more stable gettering property can be achieved by carrying out a low-temperature anneal treatment. In this case, the wiring layer already formed is not damaged by carrying out the treatment at a temperature of less than an upper limit temperature set to 500° C.

(4-6) A backside illuminated imaging device that performs imaging by illuminating light from a back side of a semiconductor substrate, which is opposite to a front side of the semiconductor substrate having an electrode, to generate electric charges in the semiconductor substrate based on the light and reading out the electric charges from the front side, which comprises:

a photoelectric conversion region an a charge transfer portion on the front side of the semiconductor substrate, the photoelectric conversion region including a light receiving portion, the charge transfer portion transferring signal charges generated in the photoelectric conversion region to a signal output portion; and an impurity layer for gettering on the back side of the semiconductor substrate, the impurity layer being formed by ion implantation.

According to the backside illuminated imaging device, the photoelectric conversion region and the charge transfer portion are formed on the surface of the semiconductor substrate and an impurity layer for gettering is formed by the ion implantation into a surface layer of the backside of the semiconductor substrate, such that a gettering treatment similar to "backside gettering" conventionally performed in the case where the backside illuminated imaging device is manufactured can be carried out and the heavy metal of contamination occurred during the process can be protected.

(4-7) An imaging apparatus comprising:

a backside illuminated imaging device according to item (4-6); and an image signal generation unit that generates an image signal based on an output signal from the backside illuminated imaging device.

According to the imaging apparatus, high-quality image pickup in which a dark current is reduced can be carried out by configuring an imaging apparatus using the backside illuminated imaging device in which the impurity layer of contamination is formed by the ion implantation into the backside of the semiconductor substrate.

According to an exemplary embodiment of the fourth aspect, the required sufficient gettering property can be achieved since a gettering side for protecting heavy metal of contamination is formed by a defect formed by ion implantation into a backside of an SOI substrate. Therefore, there can be provided an imaging device capable of obtaining a high-quality image according to stability by reducing a dark current occurring due to the effect of heavy metal of contamination.

<Fifth Aspect>

(5-1) A method for manufacturing a backside illuminated imaging device that performs imaging by illuminating light from a back side of a semiconductor substrate, which is opposite to a front side of the semiconductor substrate having an electrode, to generate electric charges in the semiconductor substrate based on the light and reading out the electric charges from the front side, which comprises the steps of:

a first step of forming a photoelectric conversion region and a charge transfer portion in a conductive semiconductor layer of an SOI substrate including a first semiconductor support substrate, an insulating layer, and a conductive semiconductor layer in this order, the photoelectric conversion region including a light receiving portion, the charge transfer portion transferring signal charges generated in the photoelectric conversion region;

a second step of fixing a surface of the SOI substrate opposite to the first semiconductor support substrate to a second semiconductor support substrate;

a fourth step of removing the first semiconductor support substrate from the SOI substrate; and a fifth step of exposing a gettering region on a surface of the conductive semiconductor layer and forming a low-temperature oxide film.

According to the method of manufacturing the backside illuminated imaging device, a backside of an SOI substrate is contaminated by heavy metal in which transition metal is a main body in a process result related to the first step. The contaminated backside is exposed on a device surface by removing a first semiconductor support substrate and an insulating layer in the third step. Since this exposed surface is an interface of an SOI layer and a BOX layer forming the semiconductor substrate (or a Si/SiO$_2$ interface), the exposed surface functions as a gettering side (or a gettering region) and contains heavy metal or the like. Since this gettering region is close to a device operation region (or a depletion region), there is a high possibility that the gettering side becomes a dark current source (or a noise source). Thus, the gettering region is exposed in the fourth step and a low-temperature oxide film is formed. Consequently, since the gettering region is insulated by this low-temperature oxide film, the dark current source to the device operation region can be prevented. Accordingly, the backside illuminated imaging device capable of stabilizing a gettering capability and preventing an increase in a dark current can be easily and surely obtained without largely changing a conventional manufacturing process.

(5-2) The method according to item (5-1), wherein the low-temperature oxide film is formed by performing a low-temperature anneal treatment in an environment of 500° C. or less.

According to the method of manufacturing the backside illuminated imaging device, a bad influence to a metal wiring layer formed on the device can be avoided before the fourth step is performed by forming the low-temperature oxide film in a low-temperature anneal treatment of 500° C. or less.

(5-3) The method according to item (5-1) or (5-2), further comprising:

a fifth step of removing the low-temperature oxide film and the gettering region after the fourth step;

a sixth step of performing a follow-up oxidation treatment for the exposed surface of the SOI substrate; and a seventh step of depositing a thin film by means of a CVD treatment to the exposed surface of the SOI substrate to provide an incident light side surface.

According to the method of manufacturing the backside illuminated imaging device, the layer contaminated by heavy metal or the like can be completely eliminated and the occurrence of a dark current can be more surely suppressed, since the gettering region is removed in the sixth step. Sine a very long time is required when an oxide film of a required film thickness is formed with only the low-temperature oxidation treatment, a predefined film thickness can be obtained in a short time by depositing a thin film through a chemical vapor deposition (CVD) treatment in the fifth step in order to obtain a required film thickness in a practically shortened time.

(5-4) The method according to item (5-1) or (5-2), further comprising a seventh step of depositing a thin film by means of a CVD treatment to a surface of the low-temperature oxide film on the SOI substrate after the fourth step to provide an incident light side surface.

According to the method of manufacturing the backside illuminated imaging device, the low-temperature oxide film containing the gettering region is residual to form the CVD film, such that process simplification is achieved.

(5-5) The method according to item (5-1) or (5-2), further comprising:

a fifth step of removing the low-temperature oxide film formed on the exposed surface of the SOI substrate and the gettering region, after the fourth step; and depositing a thin film by means of a CVD treatment on the SOI substrate to provide an incident light side surface.

According to the method of manufacturing the backside illuminated imaging device, process simplification is achieved in a minimum number of required processes.

(5-6) The method according to any one of items (5-1) to (5-5), wherein the low-temperature oxide film is formed by oxidizing the conductive semiconductor layer with oxygen radical or high-concentration ozone.

According to the method of manufacturing the backside illuminated imaging device, sacrificial oxidation is performed using highly active oxygen radical or high-concentration ozone, such that a high-quality oxide film can be formed on the device also under a relatively low-temperature environment.

(5-7) A backside illuminated imaging device that performs imaging by illuminating light from a back side of a semiconductor substrate, which is opposite to a front side of the semiconductor substrate having an electrode, to generate electric charges in the semiconductor substrate based on the light and reading out the electric charges from the front side, the backside illuminated imaging device being manufactured by the method of manufacturing the backside illuminated imaging device according to item (5-1), comprising:

a photoelectric conversion region an a charge transfer portion on the front side of the semiconductor substrate, the photoelectric conversion region including a light receiving portion, the charge transfer portion transferring signal charges generated in the photoelectric conversion region; and an oxide film and a CVD film on an outer side of the oxide film, in this order on a surface of the back side of the semiconductor substrate.

According to the backside illuminated imaging device, the occurrence of a dark current can be surely suppressed since a contaminated layer is removed even when the backside of the semiconductor substrate is contaminated by heavy metal in which transition metal is a main body in a process of forming each layer of the surface of the semiconductor substrate.

(5-8) A backside illuminated imaging device that performs imaging by illuminating light from a back side of a semiconductor substrate, which is opposite to a front side of the semiconductor substrate having an electrode, to generate electric charges in the semiconductor substrate based on the light and reading out the electric charges from the front side, the backside illuminated imaging device being manufactured by the method of manufacturing the backside illuminated imaging device according to item (5-1), comprising:

a photoelectric conversion region an a charge transfer portion on the front side of the semiconductor substrate, the photoelectric conversion region including a light receiving portion, the charge transfer portion transferring signal charges generated in the photoelectric conversion region; and an oxide film containing heavy metal and a CVD film on an outer side of the oxide film, in this order on a surface of the back side of the semiconductor substrate.

According to the backside illuminated imaging device, the occurrence of a dark current can be surely suppressed since a contaminated layer is removed even when the backside of the semiconductor substrate is contaminated by heavy metal in which transition metal is a main body in a process of forming each layer of the surface of the semiconductor substrate.

(5-9) A backside illuminated imaging device that performs imaging by illuminating light from a back side of a semiconductor substrate, which is opposite to a front side of the semiconductor substrate having an electrode, to generate electric charges in the semiconductor substrate based on the light and reading out the electric charges from the front side, the backside illuminated imaging device being manufactured by the method of manufacturing the backside illuminated imaging device according to item (5-1), comprising:

a photoelectric conversion region an a charge transfer portion on the front side of the semiconductor substrate, the photoelectric conversion region including a light receiving portion, the charge transfer portion transferring signal charges generated in the photoelectric conversion region; and a CVD film on a surface of the back side of the semiconductor substrate.

According to the backside illuminated imaging device, the occurrence of a dark current can be surely suppressed since the contaminated layer is removed even when the backside of the semiconductor substrate is contaminated by heavy metal in which transition metal is a main body in a process of forming each layer of the surface of the semiconductor substrate.

(5-10) An imaging apparatus, comprising:

a backside illuminated imaging device according to any one of items (5-7) to (5-9); and an image signal generation unit that generates an image signal based on an output signal from the backside illuminated imaging device.

According to the imaging apparatus, high-quality image pickup can be performed in a state in which a dark current is reduced.

An exemplary embodiment of the fifth aspect can provide a backside illuminated imaging device and a method of manufacturing a backside illuminated imaging device that can stabilize a gettering capability and prevent an increase in a dark current, and an imaging apparatus for picking up a high-quality image.

BRIEF DESCRIPTION OF THE DRAWINGS

The features of the invention will appear more fully upon consideration of the exemplary embodiments of the inventions, which are schematically set forth in the drawings, in which:

FIG. 27 is a longitudinal cross-sectional view showing the configuration of the backside illuminated imaging device according to processes (a)-(c) of an exemplary embodiment of the fourth aspect;

FIG. 28 is a longitudinal cross-sectional view showing the configuration of the backside illuminated imaging device according to processes (a)-(c) of an exemplary embodiment of the fourth aspect;

FIG. 34 is a cross-sectional view showing a configuration in a device thickness direction in each process in the course of manufacturing the backside illuminated imaging device in accordance with an exemplary embodiment of the fifth aspect;

Figure 1:
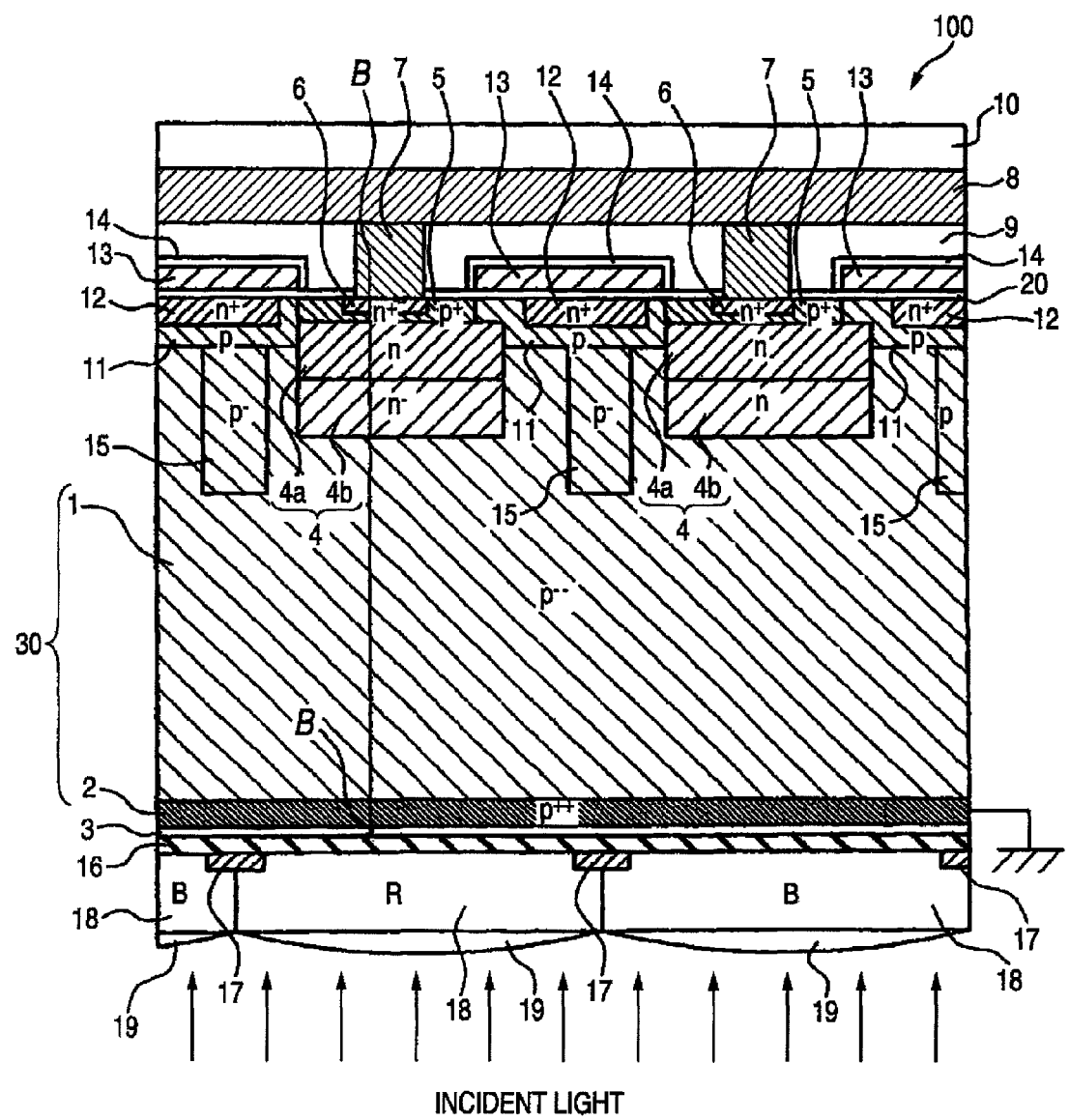
FIG. 1 is a schematic partial cross-sectional view of a backside illuminated imaging device of an interline type illustrating an exemplary embodiment of the invention.

1: p layer
2: $p^{++}$ layer
3, 9, 14: insulating layer
4: n layer
5: $p^+$ layer (overflow barrier)
6: $n^+$ layer (overflow drain)
7, 8: electrode
10: protection layer
11: p layer
12: charge transfer channel
13: charge transfer electrode/charge readout electrode
15: element separation layer
16: high refractive index transparent layer
17: light shielding member
18: color filter
19: microlens
20: gate insulating layer
50: semiconductor substrate
51: semiconductor layer (SOI layer)
52: insulating layer
53: first semiconductor support substrate
61: $p^+$ layer
62: p layer
63: photoelectric conversion region (n-type semiconductor region)
64: $p^+$ layer
65: $n^+$ layer
66: charge transfer region (n– layer)
67: $n^+$ polysilicon region
68: insulating layer
69: electrode (tungsten)
70: electrode (aluminum)
71: insulating layer
75, 76: oxide layer
77: CVD film
80: second semiconductor support substrate
81, 82: boundary surface
91: planarizatio layer (resist)
92: color filter
93: microlens

DETAILED DESCRIPTION OF THE INVENTION

Hereinafter, exemplary embodiments of the invention will be described with reference to the accompanying drawings.
<First Aspect>

FIG. 1 is a schematic partial cross-sectional view of a backside illuminated imaging device of an interline type illustrating an exemplary embodiment of the invention.

As shown in FIG. 1, a backside illuminated imaging device 100 includes a p-type semiconductor substrate 60 (hereinafter, referred to as a p substrate 30) having a p-type semiconductor (e.g., silicon) layer 1 (hereinafter, referred to as a p layer 1) and a $p^{++}$-type semiconductor (e.g., silicon) layer 2 (hereinafter, referred to as a p++ layer 2) whose impurity concentration is higher than that of the p layer 1. The backside illuminated imaging device 100 forms an image by making light incident from the lower side to the upper side in FIG. 1. In this specification, in two planes vertical to an incident light direction of the p substrate 30, the plane of the incident light side is referred to as a back side surface and the other plane thereof is referred to as a front side surface. On the basis of components constituting the backside illuminated imaging device 100, an incident light traveling direction is defined as an upward direction. A direction reverse to the incident light traveling direction is defined as a downward direction. A direction orthogonal to the back side and front side surfaces of the p substrate 30 is defined as a vertical direction and a direction parallel to the back side and front side surfaces of the p substrate 30 is defined as a horizontal direction.

On the same plane extending in the horizontal direction in the vicinity of the front side surface of the p substrate 30 within the p layer 1, a plurality of n-type semiconductor layers (impurity diffusion layers) 4 (hereinafter, referred to as n layers 4) are arranged to accumulate electric charges generated in the p substrate 30 in accordance the incident light. The n layer 4 is formed in a two-layer structure of an n semiconductor layer 4a (hereinafter, referred to as n layer 4a) formed on the front side of the p substrate 30 and an n semiconductor layer 4b (hereinafter, referred to as n layer 4b), formed below the n layer 4a, having a lower impurity concentration than the n layer 4a, but is not limited thereto. The electric charges generated in the n layer 4 and the electric charges generated in the p substrate 30 on a path of the light incident into the n layer 4 are accumulated in the n layer 4.

A p-type semiconductor layer (impurity diffusion layer) 5 of a high concentration (hereinafter, referred to as a $p^+$ layer 5) for preventing a dark current generated in the front side surface of the p substrate 30 from being accumulated in each n layer 4 is formed on each n layer 4. An n-type semiconductor layer (impurity diffusion layer) 6 (hereinafter, referred to as an $n^+$ layer 6) having a higher impurity concentration than the n layer 4 is formed in each $p^+$ layer 5 and inside from the front side surface of the p substrate 30. The $n^+$ layer 6 functions as an overflow drain for discharging unnecessary electric charges accumulated in the n layer 4, and the $p^+$ layer 5 also functions as an overflow barrier of the overflow drain. As shown, the $n^+$ layer 6 has an exposed surface exposed on the front side surface of the p substrate 30.

At the right side of the $p^+$ layer 5 and the n layer 4, a charge transfer channel 12 including an n-type semiconductor layer (impurity diffusion layer) having a higher impurity concentration than the n layer 4 is formed with slight separation. A p-type semiconductor layer 11 (hereinafter, referred to as a p layer 11) whose impurity concentration is lower than that of the $p^+$ layer 5 is formed around the charge transfer channel 12. The charge transfer channel 12 transfers the electric charges read out from the n layer 4 in a direction orthogonal to the paper of FIG. 1.

A charge readout region (not shown) for reading out electric charges accumulated in the n layer 4 to the charge transfer channel 12 is formed in the p layer 11 and the p layer 1 among the $p^+$ layer 5, the n layer 4, and the charge transfer channel 12. Above the charge transfer channel 12 and the charge readout region, an electrode 13 containing polysilicon or the like is formed for a charge transfer electrode for controlling a charge transfer operation by supplying a voltage to the charge transfer channel 12 through a gate insulating layer 20 containing a silicon oxide film or an oxide-nitride-oxide (ONO) film and a charge readout electrode for controlling a charge readout operation by supplying a readout voltage to the charge readout region. An insulating film 14 of oxide silicon or the like is formed around the electrode 13. A CCD (vertical charge transfer device VCCD) is constituted by the charge transfer channel 12 and the electrode 13 placed thereabove.

Although not shown in FIG. 1, a charge transfer channel for receiving electric charges transferred from a charge transfer channel 12 and transferring the electric charges in a direction orthogonal to a charge transfer direction of the charge transfer channel 12 is formed on the surface of a p layer 1, a charge transfer electrode for controlling a charge transfer operation of the charge transfer channel is formed on the upper side thereof, and a horizontal charge transfer device (HCCD) is configured by the charge transfer channels and the charge transfer electrode. Thus, a floating diffusion (FD) region for accumulating electric charges transferred from the HCCD is provided at the end of the HCCD. This FD region is connected to a signal output amplifier including a source follower circuit for outputting a signal based on electric charges accumulated in the FD region.

An element separation layer 15 including a p-type semiconductor layer (impurity diffusion layer) below the p layer 11 is formed between the adjacent n layers 4. The element separation layer 15 prevents electric charges to be accumulated in the n layer 4 from being leaked to its adjacent n layer 4.

The gate insulating layer 20 is formed on the front side surface of the p substrate 30, an insulating layer 9 of oxide silicon or the like is formed on the gate insulating layer 20, and the electrode 13 and the insulating film 14 are embedded into the insulating layer 9. In the gate insulating layer 20 and the insulating layer 9, a contact hole whose area is equal to or less than that of an exposed surface of the $n^+$ layer 6 is formed on the exposed surface in plan view. An electrode 7 is formed within the contact hole.

The electrode 7 can be made of a conductivity material. In particular, it is preferable that the electrode 7 is made of a metal material of tungsten (W), titanium (Ti), molybdenum (Mo) or the like, or silicide thereof. It is preferable that a diffusion prevention layer for preventing the conductivity material constituting the electrode 7 from being diffused is formed between the electrode 7 and the $n^+$ layer 6. For example, a constituent material of the diffusion prevention layer uses titanium nitride (TiN). As the diffusion prevention layer is provided, a PN junction of the n+ layer 6 and the $p^+$ layer 5 can be uniformly formed and a saturation fluctuation between pixels can be reduced.

An electrode 8 is formed on the insulating layer 9, and is connected to the electrode 7. A protection layer 10 is formed on the electrode 8. It is preferable that the electrode 8 is a conductivity material. A terminal is connected to the electrode 8. A voltage can be applied to the terminal.

Since electric charges transferred to the $n^+$ layer 6 are transferred to the electrode 7 connected to the exposed surface of the $n^+$ layer 6 and the electrode 8 connected thereto, the $n^+$ layer 6 can function as an overflow drain.

The $p^{++}$ layer 2 for preventing dark charges generated in the back side surface of the p substrate 30 from being transferred to the n layer 4 is formed inside from the back side surface of the p substrate 30. The $p^{++}$ layer 2 is connected to a terminal and a voltage (including a ground voltage) can be applied to the terminal. For example, the impurity concentration of the $p^{++}$ layer 2 is $1 \times 10^{17}/cm^3$ to $1 \times 10^{20}/cm^3$.

An insulating layer 3 of oxide silicon, nitride silicon, or the like transparent to the incident light is formed below the $p^{++}$ layer 2. In order to prevent light reflection in the back side surface of the p substrate 30 due to a refractive index difference between the insulating layer 3 and the p substrate 30, a high refractive index transparent layer 16 of a carbon film of a nitride silicon or diamond structure transparent to the incident light is formed below the insulating layer 3. It is preferable that the high refractive index transparent layer 16 is a layer of a refractive index exceeding n=1.46 (e.g., n=1.8 to 2.2) of amorphous nitride silicon or the like capable of being formed at a low temperature of 400° C. or less in plasma chemical vapor deposition (CVD) or optical CVD.

A color filter layer formed by arranging a plurality of color filters 18 in the horizontal direction is formed below the high refractive index transparent layer 16. The color filters 18 are classified into various types of color filters for transmitting light of different wavelength bands. For example, the color filter layer is formed by arranging an R color filter for transmitting light of a wavelength band of the red color, a G color filter for transmitting light of a wavelength band of the green color, and a B color filter for transmitting light of a wavelength band of the blue color. The color filters 18 are respectively formed below the n layers 4. One color filter 18 is provided in correspondence with each n layer 4. Since each n layer 4 corresponds to one $n^+$ layer 6, it can be said that the color filter 18 corresponds to one of the $n^+$ layers 6.

A light shielding member 17 for preventing color mixture is formed between the color filters 18 adjacent to each other. It is preferable that the light shielding member 17 has a function for preventing light from being transmitted. The light shielding member 17 can use a black filter or metal of W, Mo, aluminum (Al), or the like whose visible light transmittance is low.

It is preferable that a cross-sectional form of the light shielding member 17 has a tapered shape extending to the backside of the p substrate 30 (or a trapezoid in which a top point is a triangle toward the incident light side or an upper base is longer than a lower base). This can lead the light to the p substrate 30 by reflecting the light vertically incident into the light shielding member 17 in a tapered surface and can improve light use efficiency.

A microlens 19 is formed below each color filter 18. A shape of the microlens 19 is determined such that a light path is formed in which refracted light avoids the light shielding member 17 between the color filter 18 above the microlens 19 and its adjacent color filter 18. It is designed to position a focus of the microlens 19 in the center of the n layer 4. Since shading is reduced according to characteristics of an available optical system, it is desirable that an arrangement pitch of microlens 19 is designed to be different from that of n layers 4.

In a region from the upper surface of the n layer 4 to the back side surface of the p substrate 30, a region divided by the element separation layer 15 in plan view is hereinafter referred to as a photoelectric conversion region for carrying out photoelectric conversion contributing to imaging. Since a signal based on electric charges generated in one photoelectric conversion region becomes one-pixel data of image data, the photoelectric conversion region is also referred to as a pixel in the specification. In other words, the backside illuminated imaging device 100 is configured to have a plurality of pixels and a CCD or CMOS type signal readout section for reading out a signal based on electric charges generated in each of the plurality of pixels.

In the backside illuminated imaging device 100 configured as described above, light incident into one microlens 19 is incident into the color filter 18 above the microlens 19 and the light passed through the color filter 18 is incident into the n layer 4 corresponding to the color filter 18. At this time, electric charges are generated also in a portion forming an incident light path in the p substrate 30. These charges are transferred to the n layer 4 through a potential slope formed in the photoelectric conversion region and are accumulated in the n layer 4. Electric charges generated by light incident into the n layer 4 are also accumulated therein. The electric charges accumulated in the n layer 4 are read out and transferred to the charge transfer channel 12. The electric charges are converted into a signal by an output amplifier and are externally output.

Figure 2:
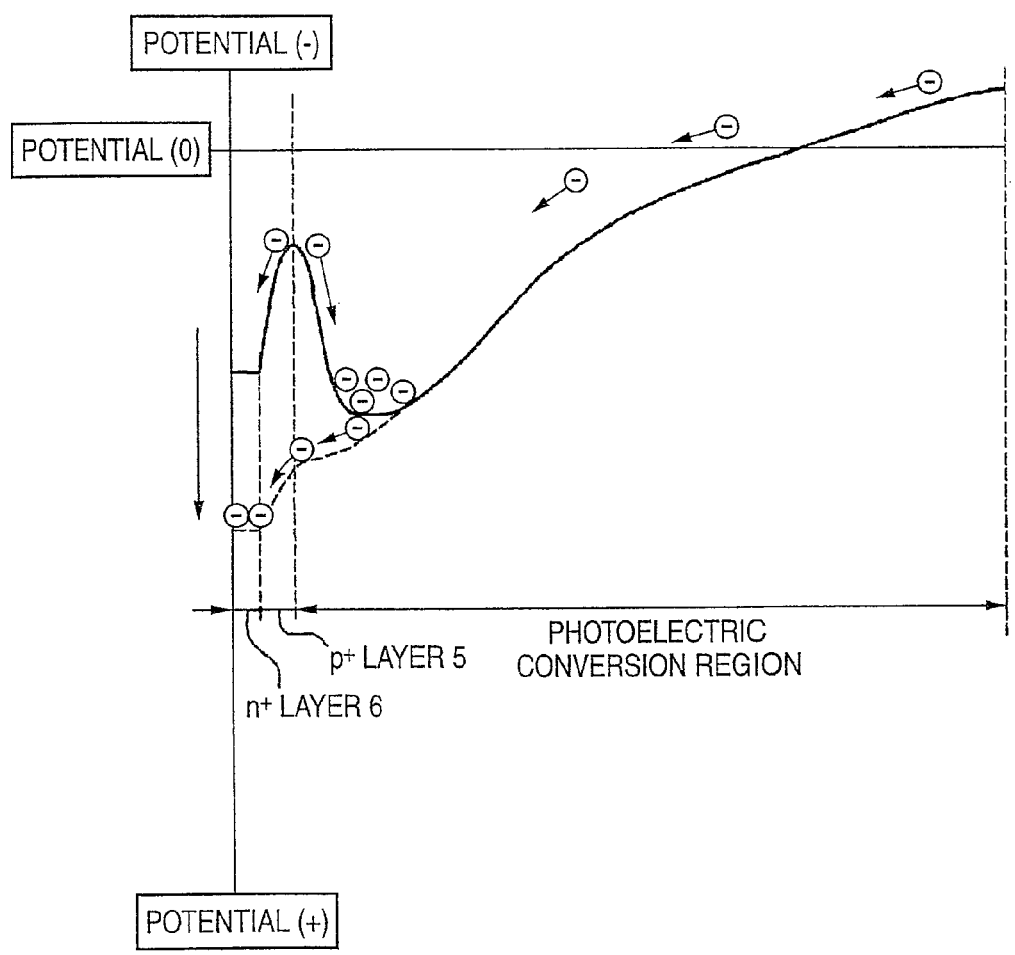
FIG. 2 is a view showing a potential profile taken along the line B-B of FIG. 1.

FIG. 2 is a view showing a potential profile taken along the line B-B of FIG. 1.

As shown in FIG. 2, it can be seen that potential wells are respectively formed in an $n^+$ layer 6 and the photoelectric conversion region, and a $p^+$ layer 5 functions as a barrier between these potential wells. Electric charges exceeding a saturation capacity of the potential well formed in the photoelectric conversion region flows into the potential well formed in the $n^+$ layer 6. The incoming charges are transferred to an electrode 7 and are externally discharged. Thus, the saturation capacity of the n layer 4 can be controlled by varying a voltage to be applied to the electrode 7 connected to the $n^+$ layer 6 and adjusting the height of the barrier of the $p^+$ layer 5. For example, in a motion image photography mode for adding and reading out signals, an overflow in a charge transfer channel 12 can be prevented by carrying out a control operation for reducing the saturation capacity of the n layer 4.

As indicated by the dashed line of FIG. 2, the electric charges within the potential well formed in the photoelectric conversion region can be reset by supplying the electrode 7 connected to the $n^+$ layer 6 with a voltage for eliminating the barrier formed in the $p^+$ layer 5. Using this, an electronic shutter can be realized.

Furthermore, a configuration is considered in which the electrode 7 connected to the $n^+$ layer 6 is commonly connected to the types of color filters 18 respectively corresponding to n+ layers 6 and a voltage can be independently applied to each electrode 7 commonized for the types of color filters 18. In this case, the electronic shutter can be independently applied to each photoelectric conversion region corresponding to each type of color filter. A charge accumulation time in each photoelectric conversion region can be changed in each color of light incident thereinto and an output aligned with color balance can be obtained in control of the charge accumulation time.

Furthermore, a configuration is considered in which the $n^+$ layers 6 are classified into a first group including the $n^+$ layer 6 corresponding to the n layer 4 for reading electric charges in an imaging mode for carrying out a thinning-out readout operation of the motion imaging mode or the like and a second group including the n+ layer 6 corresponding to the n layer 4 in which the electric charges are not read out in the imaging mode, the electrode 7 is commonly connected between the $n^+$ layers 6 belonging to the same group, and a voltage is independently applied to each common electrode 7. In this case, the effect of suppressing grooming between pixels to highlight can be raised by varying an application voltage to each group.

A voltage application to electrodes 7 and 8 can be carried out by a driver for driving the backside illuminated imaging device 100 in an imaging apparatus of a digital camera or the like having the backside illuminated imaging device 100.

Figure 40:
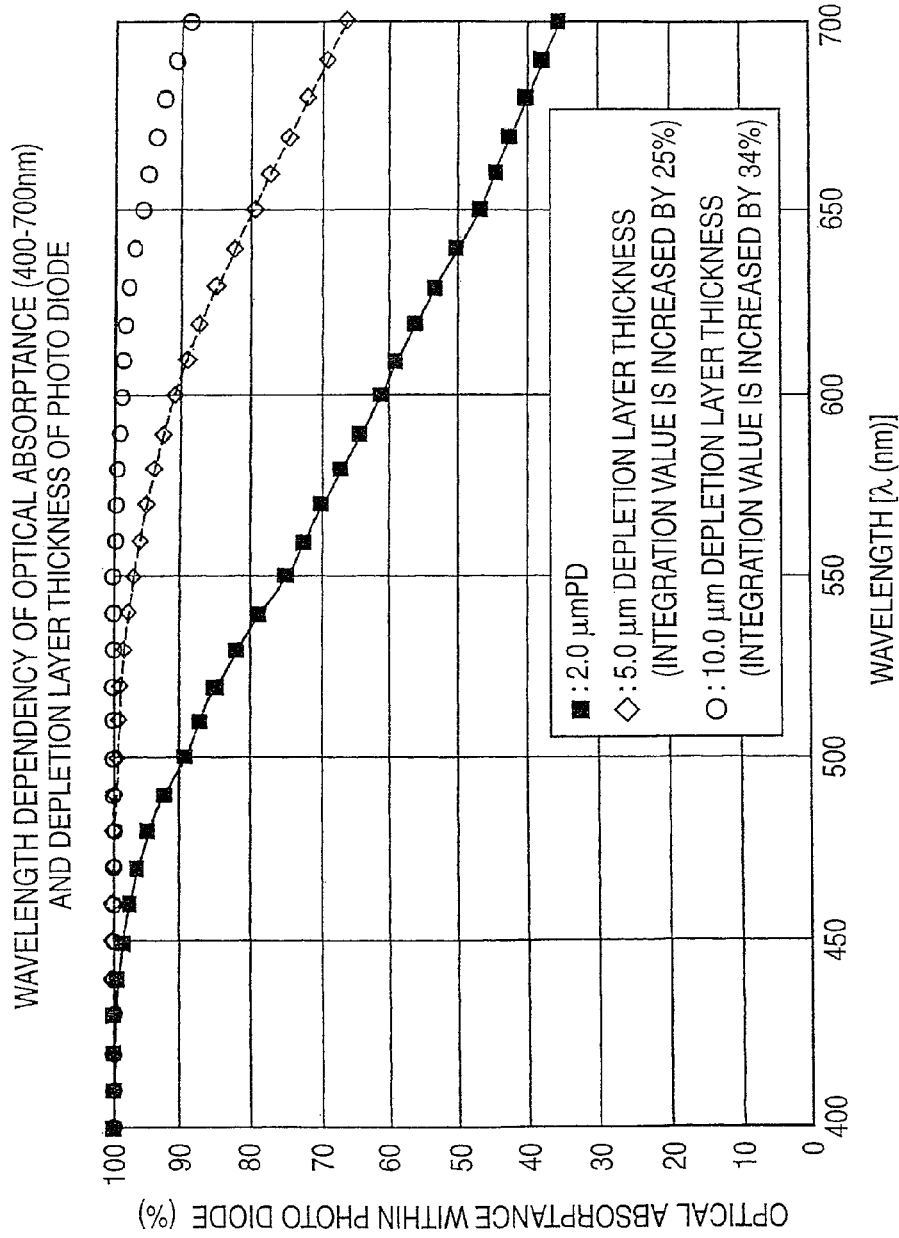
FIG. 40 is a view showing the relationship between a depletion layer thickness of a photoelectric conversion region and optical absorptance.
Figure 41:
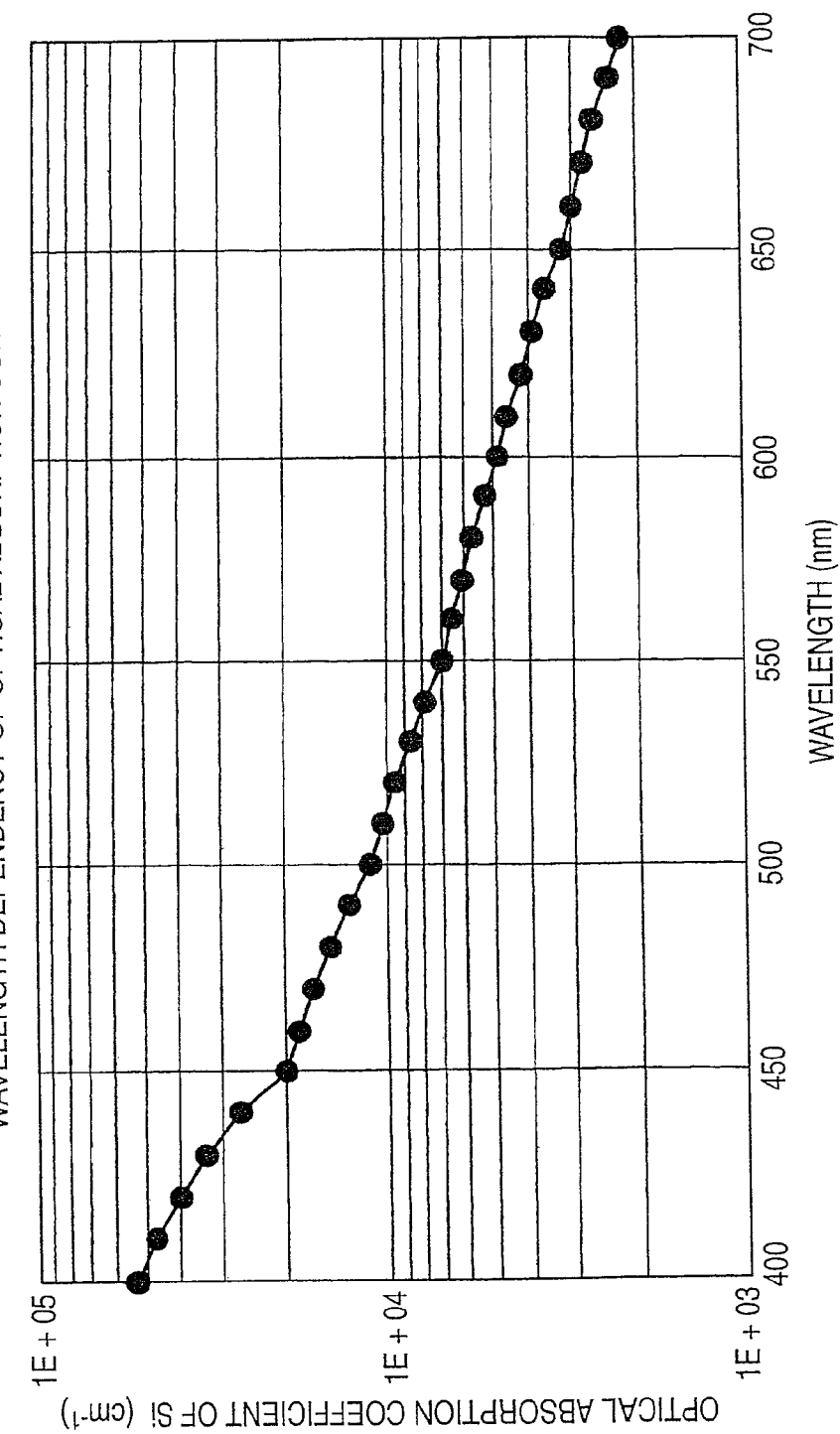
FIG. 41 is a view showing wavelength dependency of an optical absorption coefficient of silicon.
Figure 42:
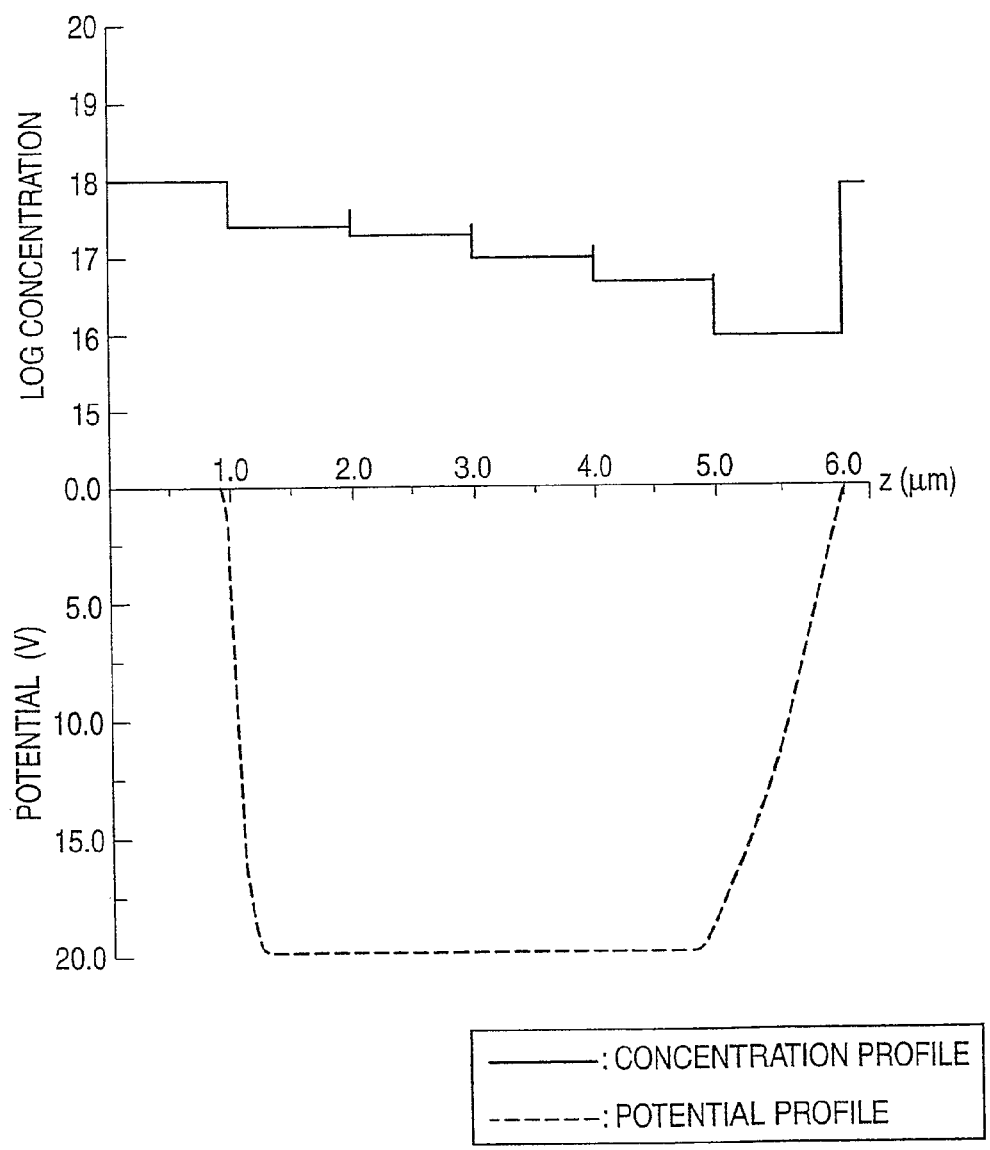
FIG. 42 is a view showing results of simulating a backside illuminated imaging device in a concentration profile shown in the embodiment of JP-A-2006-134915.
Figure 43:
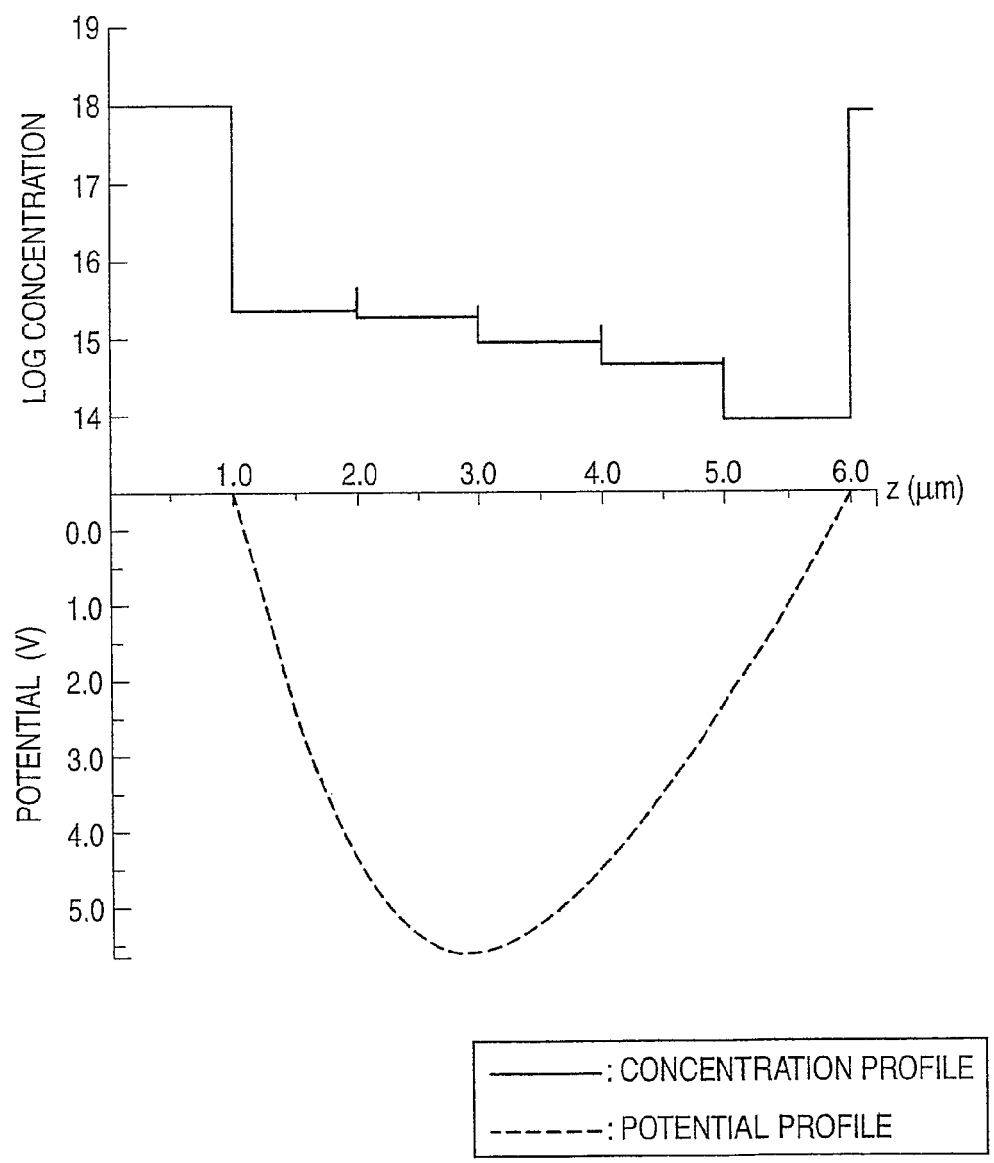
FIG. 43 is a view showing results of simulating a backside illuminated imaging device by decreasing the number of digits representing a concentration shown in the embodiment of JP-A-2006-134915 by 2, wherein reference numerals and signs in the drawings are set forth below.

As shown in FIG. 40, it is experimentally proved that a thickness of about 9 μm or more or about 10 μm is actually required to completely (about 90% or more) absorb light of a visible range in a silicon substrate since an optical-absorption coefficient is different between wavelengths. Thus, it is preferable that the length in the vertical direction of the p substrate 30 is 9 μm or more or about 10 μm also in the backside illuminated imaging device 100. Accordingly, the visible light can be completely absorbed and sensitivity can be improved.

Of course, if the length in the vertical direction of the p substrate 30 is 5 μm or more as seen from data of FIG. 40, higher sensitivity can be sufficiently realized in comparison with that of the conventional case.

When the length in the vertical direction of the p substrate 30 is 9 μm or more or about 10 μm, the following advantages are present.

- An imaging device in which smear is sufficiently reduced can be realized in an interline type, without providing a light shielding layer for light shielding the charge transfer channel 12 such that light does not almost reaches the charge transfer channel 12, and without forming the backside illuminated imaging device in a frame interline type.
- Quantum efficiency increases and sensitivity is improved.
- Long-wavelength sensitivity becomes high.
- Near-infrared sensitivity rapidly increases.

However, when the length in the vertical direction of the p substrate 30 is set to be thick like 10 μm, it is difficult to form a depletion layer in each photoelectric conversion region at a low depletion voltage of the n layer 4 (about 3 V used in the imaging device of the present situation) due to the effect of the charge separation layer 15 or the like. Thus, the concentration of the p substrate 30 should be optimally designed to have a potential gradient such that the depletion layer can be formed in each photoelectric conversion region and electric charges generated in the depletion layer can be transferred to the n layer 4.

From simulation results, the inventors has found that the above-described conditions are satisfied when the p substrate 30 has the following (1)-(3) configurations.

(1) Configuration including at least an n or p layer of $1 \times 10^{14}/cm^3$ or less, or an i layer as a middle layer between the n layer 4 and the $p^{++}$ layer 2 in FIG. 1

(2) Configuration including an n layer of $2 \times 10^{14}/cm^3$ or less and a p layer of $2 \times 10^{14}/cm^3$ or less in the middle layer (3) Configuration including at least one of an n layer of $1 \times 10^{14}/cm^3$ or less, a p layer of $1 \times 10^{14}/cm^3$ or less, and an i layer between the n and p layers of (2)

Since the backside illuminated imaging device 100 is the interline type, there is a possibility that light is incident into the charge transfer channel 12 during an exposure period and this leads to smear. Hereinafter, the case where the smear is reduced if the length in the vertical direction of the p substrate 30 is 9 µm or more as described above will be demonstrated on the basis of simulation results.

Figure 3:
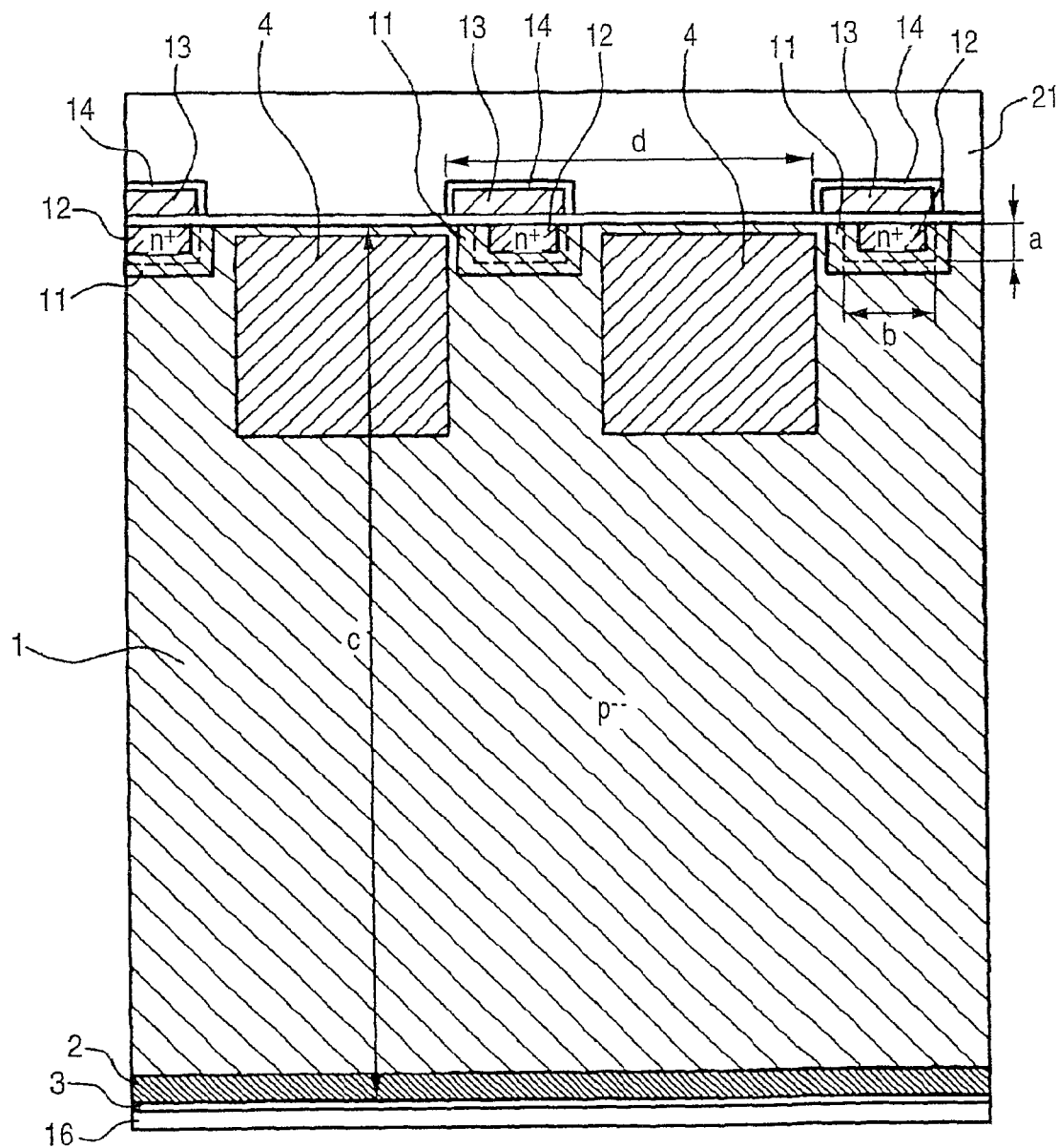
FIG. 3 is a view showing a configuration of the backside illuminated imaging device using simulations.

FIG. 3 is a schematic view showing a part of the backside illuminated imaging device 100. In FIG. 3, the same elements as those of FIG. 1 are assigned the same reference numerals.

In FIG. 3, a sign "a" denotes the length in the vertical direction of the depletion layer of the charge transfer channel 12, a sign "b" denotes the length in the horizontal direction of the depletion layer of the charge transfer channel 12, a sign "c" denotes the length in the vertical direction of the p substrate 30, and a sign "d" denotes an arrangement pitch of the p layer 4. In a model as shown in FIG. 3, a light absorption layer 21 for absorbing light is provided in place of the insulating layer 9.

Herein, it was assumed that a=0.00004 cm, b=0.00005 cm, c=0.0005 cm, and d=0.0002 cm, and all electrons generated out of the depletion layer formed in the charge transfer channel 12 become a signal flowing into the n layer 4 corresponding to the charge transfer channel 12, and all electrons generated in the depletion layer of the charge transfer channel 12 become a smear signal. An array of the n layers 4 was a square array, a signal readout method was an interline method, and light passed through the p substrate 30 was set to be completely absorbed by the light absorption layer 21.

Since the optical absorptance Y of silicon of a thickness x (cm) is $Y=\{1-Exp(-\alpha \times x)\}$ (where $\alpha$ is an optical absorption coefficient), 0.032% was obtained when an infrared (IR) cut filter was arranged below the backside of the p substrate 30 of the backside illuminated imaging device as shown in FIG. 3, an average value was computed by calculating a signal and a smear signal in each wavelength (400- to 700 nm at an interval of 10 nm) from a transmitted spectrum of each pixel in the case where light was illuminated from a 3300K light source to the IR cut filter, and a ratio of the smear signal to the signal was computed in the condition that implantation occurred in a region of 1/10 in the vertical direction of the p substrate 30 (or 0.056% was obtained when the n layers 4 was arranged in a honeycomb array) (see FIG. 4).

Figure 4:
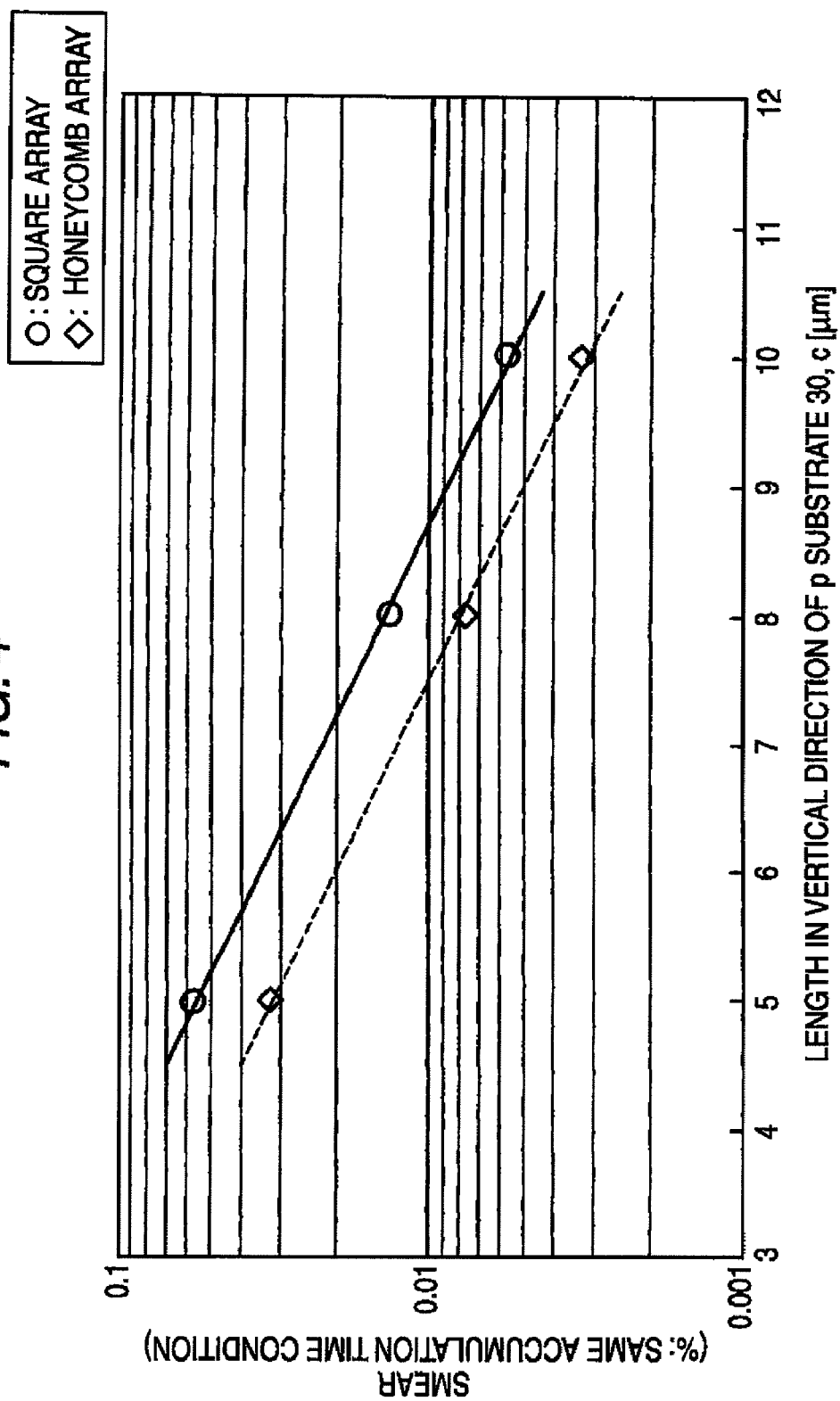
FIG. 4 is a view showing simulation results for computing a relation between the thickness of a p substrate and smear.

The ratio of the smear signal was 0.0075% (or 0.013% in the case where the n layers 4 was arranged in the honeycomb array) when c=8 µm=0.0008 cm, and the ratio of the smear signal was 0.0032% (or 0.0056% in the case where the n layers 4 was arranged in the honeycomb array) when c=10 µm=0.001 cm (see FIG. 4).

In the honeycomb array, multiple rows respectively including a plurality of n layers 4 arranged in a row direction are arranged in a column direction orthogonal to the row direction. In the honeycomb array, an even row and an odd row are shifted by about a half of the pitch in the row direction. Since an area of the charge transfer channel of the honeycomb array is 1.75 times larger than that of the square array, an estimation value of the honeycomb array is set to a multiple of 1.75 of the result of the square array.

From the simulation results as shown in FIG. 4, it has been found that the backside illuminated imaging device 100 of the interline type can further reduce the smear in comparison with the frontside illuminated type imaging device of the interline type for obtaining the same sensitivity if the length in the vertical direction of the p substrate 30 is 5 µm or more. It has been found that the smear can be further suppressed if the length in the vertical direction of the p substrate 30 is 8 µm or more and the smear can be still further suppressed if the length in the vertical direction of the p substrate 30 is 10 µm or more.

Since an overflow drain is provided in the front side surface of the p substrate 30 at which the incident light does not almost arrive according to the backside illuminated imaging device 100 as described above, this structure can improve the blue sensitivity in comparison with a conventional structure in which the overflow drain is provided in the backside of the p substrate 30.

A charge accumulation time or a saturation capacity of each photoelectric conversion region can be uniformly or independently controlled by controlling a voltage to be applied to the overflow drain, such that the operations of various patterns can be easily realized.

According to the backside illuminated imaging device 100, the amplitude of a voltage applied to the $n^+$ layer 6 can be significantly reduced when an electronic shutter is realized in comparison with a conventional structure in which an overflow drain is provided in the backside of the p substrate 30 (23 V→15V, e.g., 8 V). On the contrary, if the voltage amplitude is the same as that of the conventional structure, the saturation capacity of each photoelectric conversion region can increase.

In FIG. 1, the $p^{++}$ layer 2 is omitted and, instead, a transparent electrode such as indium tin oxide (ITO) or the like transparent to the incident light is provided below the insulating layer 3. A configuration is made in which a voltage can be applied to the transparent electrode. If a negative voltage is applied to the transparent electrode, a dark current generated in the back side surface of the p substrate 30 can be suppressed.

Since the smear can be sufficiently suppressed when the length in the vertical direction of the p substrate 30 is 8 µm or more as described above, the backside illuminated imaging device 100 is set to the interline type. However, the smear slightly occurs even when the depth of the photoelectric conversion region is 8 µm or more. For this reason, if the backside illuminated imaging device 100 is the frame interline type, the smear can be further reduced.

As described above, the backside illuminated imaging device 100 is configured in the CCD type. Of course, the backside illuminated imaging device 100 can be configured in the MOS type. In other words, a signal based on electric charges accumulated in the n layer 4 can be read out in the MOS circuit such as a complementary metal-oxide semiconductor (CMOS) circuit or an n-channel metal-oxide semiconductor (NMOS) circuit.

The configuration of the above-described backside illuminated imaging device can be common to those of the second to fifth aspect of the invention.

Next, an example of a method of manufacturing a silicon-on-insulator (SOI) substrate including the p substrate 30 and the insulating layer 3 of the backside illuminated imaging device 100 as shown in FIG. 1 will be described.

Figure 5:
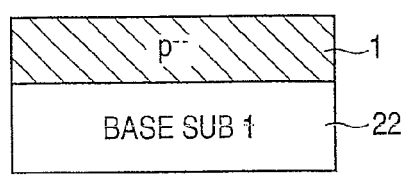
FIG. 5 is a view illustrating a process of manufacturing an SOI substrate using the backside illuminated imaging device.
Figure 5:
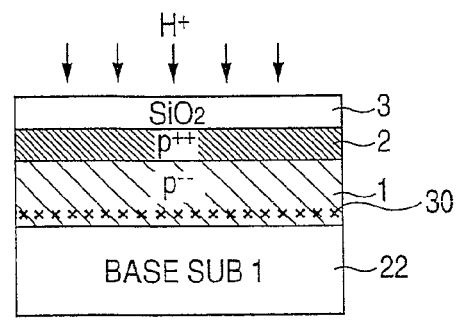
Figure 5:
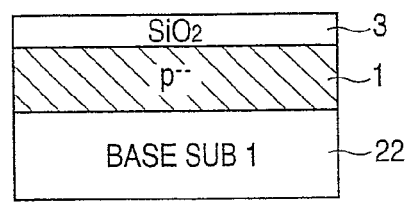
Figure 5:
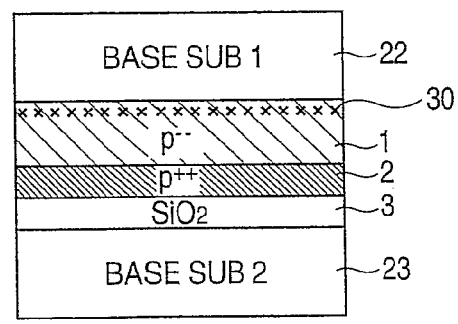
Figure 5:
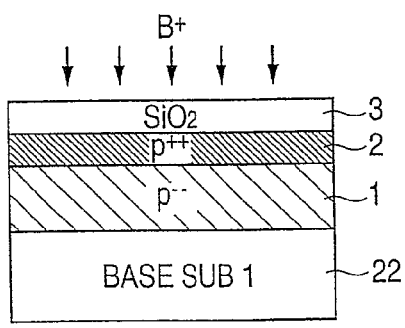
Figure 5:
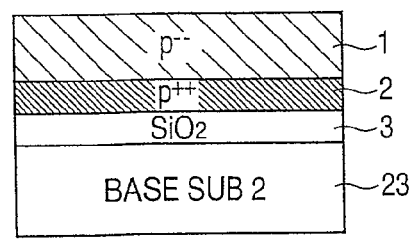

FIG. 5 is a view illustrating a process of manufacturing the SOI substrate using the backside illuminated imaging device. In FIG. 5, the same components as those of FIG. 1 are assigned the same reference numerals.

First, a p layer 1 is formed on a base substrate 22 of silicon or the like by epitaxial growth (FIG. 5(a)). In FIG. 5(a), an exposed surface of the p layer 1 becomes a back side surface of a p substrate 30. Next, an insulating layer 3 containing oxide silicon or the like is formed on the exposed surface of the p layer 1 by chemical vapor deposition (CVD), thermal oxidation, or the like (FIG. 5(b)).

Next, a $p^{++}$ layer 2 is formed in an interface of the p layer 1 and the insulating layer 3 by carrying out ion implantation of boron or the like from the upper side of the insulating layer 3 (FIG. 5(c)). Then, hydrogen ions are implanted around an interface of the base substrate 22 and the p layer 1 (FIG. 5(d)). According to this ion implantation, a boundary layer 30 for separating the base substrate 22 and the p layer 1 is formed.

After a base substrate 23 of silicon or the like is connected on the insulating layer 3, the base substrate 23 is rotated to the lower side such that base substrate 22 becomes the upper side (FIG. 5(e)). Then, along with the boundary layer 30, the base substrate 22 is exfoliated from the p layer 1 (FIG. 5(f)).

From the state of FIG. 5(f), an element located around the surface of the p substrate 30 is formed. After formation, the base substrate 23 is etched and removed using the insulating layer 3 as a stopper. The process of manufacturing the backside illuminated imaging device 100 is completed by forming a color filter 18, a microlens 19, and the like.

In a method of removing the base substrate 23 in FIG. 5(f), an etching method using a potassium hydroxide (KOH) etchant is considered. Furthermore, etching using an optical excitation method can be considered. The insulating layer 3 can use nitride silicon other than oxide silicon. In this case, etching can be used with the nitride silicon serving as the stopper.

Next, a method of forming an $n^{++}$ layer 6 and an electrode 7 of the backside illuminated imaging device 100 will be described.

Unstable characteristics of the overflow drain of the backside illuminated imaging device 100 are caused by an alignment deviation of the $p^+$ layer 5 and the $n^+$ layer 6, an alignment deviation of the $n^+$ layer 6 and the electrode 7, and defective covering of the electrode 7 of a contact hole formed in an insulating layer 9. To improve the alignment deviation or covering property, the simplest measure is to increase an area of the $p^+$ layer 5 and the $n^+$ layer 6 and an area of the electrode 7 in plan view. This measure becomes an obstacle of pixel miniaturization. In this embodiment, there is proposed a method capable of realizing pixel miniaturization while improving the alignment deviation or covering property.

Figure 6:
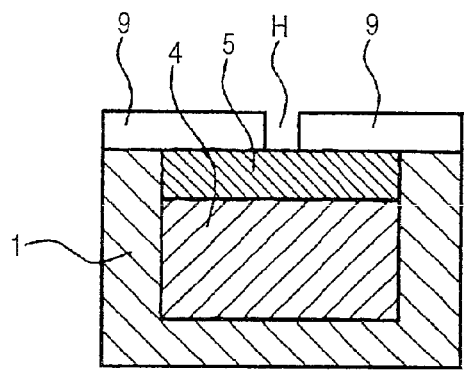
FIG. 6 is a view illustrating a method of forming an n layer 6, an electrode 7, and an electrode 8 of the backside illuminated imaging device.
Figure 6:
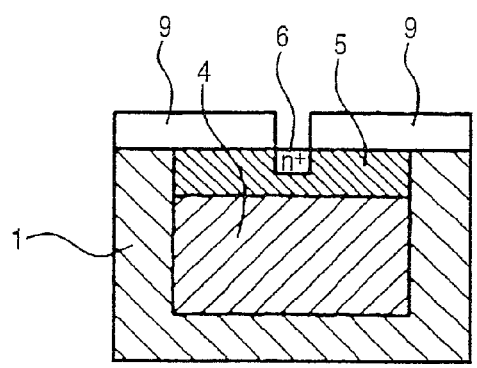
Figure 6:
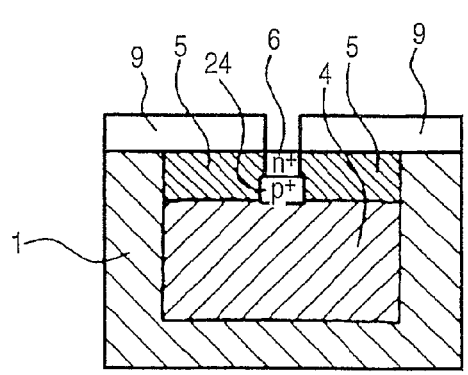
Figure 6:
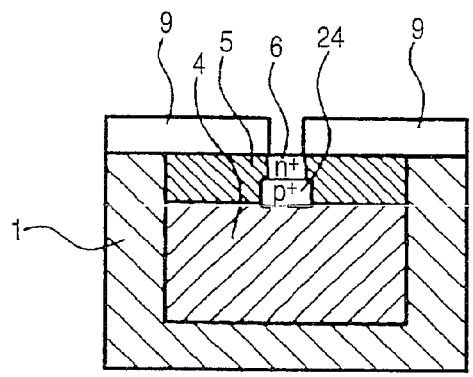
Figure 6:
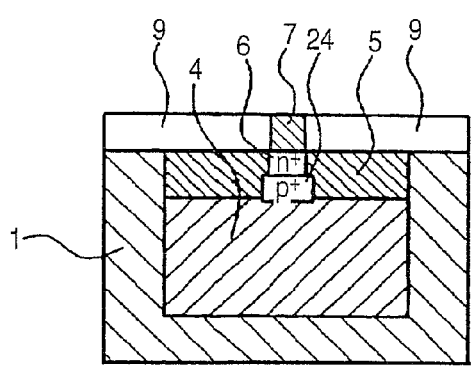
Figure 6:
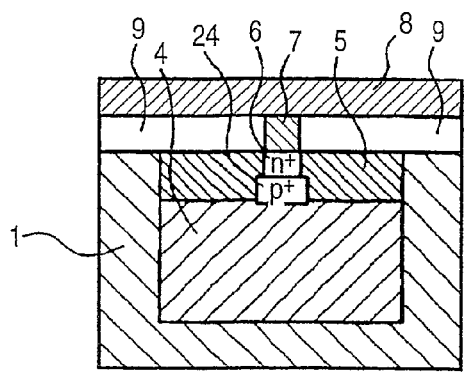

FIG. 6 is a view illustrating a method of forming the $n^+$ layer 6, the electrode 7, and the electrode 8 of the backside illuminated imaging device 100. In FIG. 6, the same components as those of FIG. 1 are assigned the same reference numerals.

First, after an n layer 4 and a $p^+$ layer 5 thereon are formed by ion implantation from the upper side of a p substrate 30 from the state of FIG. 5(f), a gate insulating layer 20 is formed on the surface of the p substrate 30 (although not shown), and an insulating layer 9 is formed thereon. In plan view, a contact hole H is formed in a portion of a region of the gate insulating layer 20 and the insulating layer 9 overlapping with the $p^+$ layer 5 by a photolithography method and etching (FIG. 6(a)).

Next, for example, arsenic (As) ions are implanted using the gate insulating layer 20 and the insulating layer 9 as a mask and the $n^+$ layer 6 is formed within the $p^+$ layer 5 by self-alignment (FIG. 6(b)). From this state, for example, tungsten serving as a metal material constituting the electrode 7 is film-formed by a CVD method or the like. The metal material film is planarized by etching, chemical-mechanical polishing (CMP), or the like and is buried and packed in the contact hole H, thereby forming the electrode 7. Accordingly, the $n^+$ layer 6, the electrode 7, and the electrode 8 are completely formed by forming a conductivity material film constituting the electrode 8 on the insulating layer 9 and the electrode 7.

When the upper surface of the $n^+$ layer 6 is in contact with the n layer 4, an overflow barrier is absent and the $n^+$ layer 6 cannot function as an overflow drain. A method of preventing this state will be described with reference to FIGS. 6(b) to (f).

After the $n^+$ layer 6 is formed in self-alignment, ion implantation of impurities, for example, boron (B), whose diffusion coefficient is more than that of impurities of the $n^+$ layer 6 is carried out using the gate insulating layer 20 and the insulating layer 9 as the mask, thereby forming a $p^+$ layer 24 below the $n^+$ layer 6 (FIG. 6(c)). Since As has a larger diffusion coefficient than B when an anneal treatment for activation is performed, the $p^+$ layer 24 is extended to cover an end portion of the $n^+$ layer 6 (FIG. 6(d)). Then, a metal material constituting the electrode 7, for example, tungsten, is film-formed by a CVD method or the like. The metal material film is planarized by etching, CVD, or the like and is buried and packed in the contact hole H, thereby forming the electrode 7 (FIG. 6(e)). Accordingly, the $n^+$ layer 6, the electrode 7 and the electrode 8 are completely formed by forming a conductivity material film constituting the electrode 8 on the insulating layer 9 and the electrode 7 (FIG. 6(f)).

Herein, the gate insulating layer 20 and the insulating layer 9 serves as the mask. Alternatively, when a resist material layer used to form an opening in the gate insulating layer 20 is residual, the resist material layer can be additionally used as the mask. Before the gate insulating layer 20 and the insulating layer 9 are formed, the resist material layer is formed on the surface of the p substrate 30. After the opening is formed in the resist material layer, the $n^+$ layer 6 and the $p^+$ layer 24 can be formed using the resist material layer as the mask. In this case, after forming the electrode 7 by forming the $n^+$ layer 6 and the $p^+$ layer 24, the gate insulating layer 20 and the insulating layer 9 can be formed by removing the resist material layer.

According to the method as shown in FIGS. 6(c) to (f), the $p^+$ layer 24 can be formed between the $n^+$ layer 6 and the n layer 4 even when the lower surface of the $n^+$ layer 6 is in contact with the n layer 4 in the state of FIG. 6(b). The $p^+$ layer 24 can function as an overflow barrier and the $n^+$ layer 6 can function as an overflow drain.

According to this method, the $n^+$ layer 6 is formed by self-alignment using the gate insulating layer 20 and the insulating layer 9 as the mask, such that an alignment deviation of the $n^+$ layer 6 and the electrode 7 does not occur. Thus, the width in the horizontal direction of the contact hole H can be minimized and an obstacle of pixel miniaturization does not occur.

If tungsten is used as the material of the electrode 7 even when an aspect ratio of the contact hole H is strict, the electrode 7 can be embedded and the insulating layer 9 can be thickly formed.

Since an opening does not need to be provided above the n layer 4 in the case of the backside illuminated imaging device 100, the length in the horizontal direction of a portion protruding from a portion overlapping with a charge transfer channel 12 of an electrode 13 to the n layer 4 can extend in the horizontal direction. If this portion can extend, a readout voltage can be reduced when electric charges are read out from the n layer 4 to the charge transfer channel 12. On the contrary, if the readout voltage is not changed, it is preferable to increase the saturation capacity by increasing the concentration of the n layer 4. Accordingly, in the backside illuminated imaging device 100, it is effective that the length in the horizontal direction of a portion protruding from a portion overlapping with the charge transfer channel 12 of the electrode 13 to the n layer 4 can extend in the horizontal direction.

When the consideration is made as described above, the method as shown in FIG. 6 is very effective to increase an expansion amount of the electrode 13, decrease the readout voltage, and increase the saturation capacity (improve the sensitivity) since the width in the horizontal direction of the electrode 7 can be thickly formed.

Moreover, it is preferable that the $n^+$ layer 6 is formed by carrying out vertical ion implantation to the surface of the $p^+$ layer 5 exposed from the contact hole H or by carrying out oblique ion implantation to the surface of the $p^+$ layer 5 exposed from the contact hole H in at least four directions such that the shadow of the insulating layer 9 does not occur upon ion implantation.

When the oblique ion implantation (other than the horizontal or vertical ion implantation) is applied to the surface of the $p^+$ layer 5 exposed from the contact hole H in only one direction, there is a problem that the electrode 7 and the $p^+$ layer 5 are in contact with each other and are short-circuited since positions of the $n^+$ layer 6 and the contact hole H are shifted by the shadow of the insulating layer 9. Accordingly, since the shadow of the insulating layer 9 is disabled when the vertical ion implantation is carried out or the oblique ion implantation is carried out in at least four directions, the electrode 7 and the $p^+$ layer 5 can be prevented from contacting with each other. When the oblique ion implantation is performed in at least four directions, it is more preferable since a size of the $n^+$ layer 6 can be larger than that of the contact hole H.

Moreover, when the vertical ion implantation is performed, it is preferable to perform the ion implantation at low acceleration. The issue of channeling is almost negligible.

Similarly, it is preferable that the $p^+$ layer 24 is formed by carrying out vertical ion implantation to the surface of the $p^+$ layer 5 exposed from the contact hole H or by carrying out oblique ion implantation to the surface of the $p^+$ layer 5 exposed from the contact hole H in at least four directions such that the shadow of the insulating layer 9 does not occur upon ion implantation.

When the oblique ion implantation (other than the horizontal or vertical ion implantation) is applied to the surface of the $p^+$ layer 5 exposed from the contact hole H in only one direction, the $p^+$ layer 24 cannot function as the overflow barrier since a position of the $p^+$ layer 24 is shifted by the shadow of the insulating layer 9. Accordingly, since the shadow of the insulating layer 9 is disabled when the vertical ion implantation is carried out or the oblique ion implantation is carried out in at least four directions, the $p^+$ layer 24 can be formed to cover the lower surface of the $n^+$ layer 6, such that the $p^+$ layer 24 can surely function as the overflow barrier.

When the oblique ion implantation is performed in at least four directions, it is more preferable since a size of the $p^+$ layer 24 can be larger than that of the $n^+$ layer 6.

Next, an example of a method of gettering contamination of the p substrate 30 of the SOI substrate will be enumerated.

A gettering side is formed in an interface of the p substrate 30 and the insulating layer 3 and contamination impurities are attached within the insulating layer 3 by implanting oxygen ions (SIOX (Separation by Implanted Oxigen)) from the side of the insulating layer 3.

There is a method of implanting fluorine or carbon into the interface from the side of the insulating layer 3 as a method of forming the gettering side in the interface of the p substrate 30 and the insulating layer 3.

The gettering side is formed in the interface of the p substrate 30 and the insulating layer 3, the insulating layer 3 and the gettering side are removed by etching or the like, and an insulating layer serving as an alternative to the insulating layer 3 is formed by low temperature oxidation (radical oxidation or the like).

Next, a modified example of the configuration or manufacturing method of the backside illuminated imaging device 100 will be enumerated.

In a specific color filter 18, the light shielding member 17 is provided on the overall surface between the color filter 18 and the high refractive index layer 16. According to this configuration, a photoelectric conversion region for detecting light passed through the specific color filter 18 can be used as a photoelectric conversion region for detecting an optical black level. If the position of the specific color filter 18 is around the backside illuminated imaging device 100, smear correction or black level correction is possible as in the general imaging device. In this case, since the light shielding member 17 is provided between the color filter layer and the insulating layer 3, its fabrication is easy.

The light shielding member 17 is also provided below a peripheral circuit of the backside illuminated imaging device 100.

The $p^{++}$ layer 2 can be changed to a layer including p-type amorphous SiC, the insulating layer 3 can serve as a transparent electrode transparent to incident light of the ITO or the like, and a voltage can be applied to the transparent electrode.

When the p substrate 1 is configured with a plurality of impurity diffusion layers, each impurity diffusion layer is formed by dividing a process.

When the p substrate 1 is configured with a plurality of impurity diffusion layers, each impurity diffusion layer is formed by dividing a process and then a potential difference is rounded in an anneal treatment.

When the p substrate 1 is configured with a plurality of impurity diffusion layers, each impurity diffusion layer is formed while a gas atmosphere concentration is varied in an analog form in the same process.

<Second Aspect>

The same configuration as in the backside illuminated imaging device 100 of FIG. 1 can be adopted as one of the second aspect. The manufacturing method of the first aspect can be also applied to the second aspect.

In order to completely reset electric charges within a potential well formed in a photoelectric conversion region, a formation position of an $n^+$ layer 6 is important. Since a maximum potential point of the n layer 4 (equal to that of the photoelectric conversion region) is the deepest position of the potential well, the electric charges within the potential well formed in the photoelectric conversion region can be completely reset if electric charges accumulated in the position can be transferred to the n⁺ layer 6. In a backside illuminated imaging device 100, the n⁺ layer 6 is formed in a position overlapping with the maximum potential point of the n layer 4 in plan view. In this positional relationship, the electric charges within the potential well formed in the photoelectric conversion region can be completely reset. When the n⁺ layer 6 is formed in a position with which the maximum potential point of the n layer 4 does not overlap as shown in JP-A-2006-49338, there is a problem that electric charges accumulated in the deepest position of the potential well formed in the photoelectric conversion region may not be transferred to the n⁺ layer 6, such that the electronic shutter function may not be suitably realized. According to the configuration of the backside illuminated imaging device 100, the electronic shutter function can be sufficiently realized.

Figure 7:
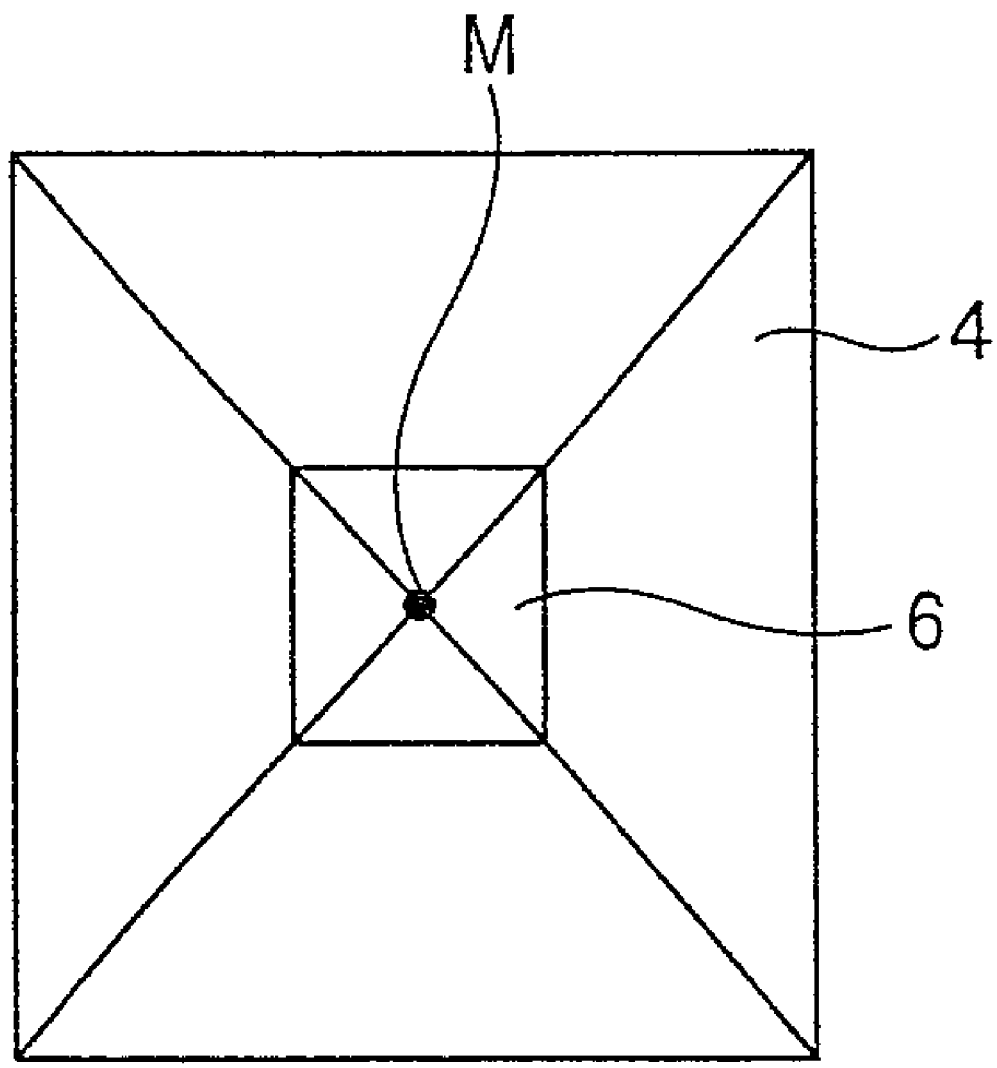
FIG. 7 is a plan view of an n layer 4 shown in FIG. 1.

FIG. 7 is a plan view of the n layer 4. As shown in FIG. 7, a maximum potential point M is present in the center of the n layer 4 since the n layer 4 has a constant concentration in the horizontal direction. Thus, the backside illuminated imaging device 100 can realize the electronic shutter function by providing the n⁺ layer 6 in a position overlapping with the center of the n layer 4.

Figure 8:
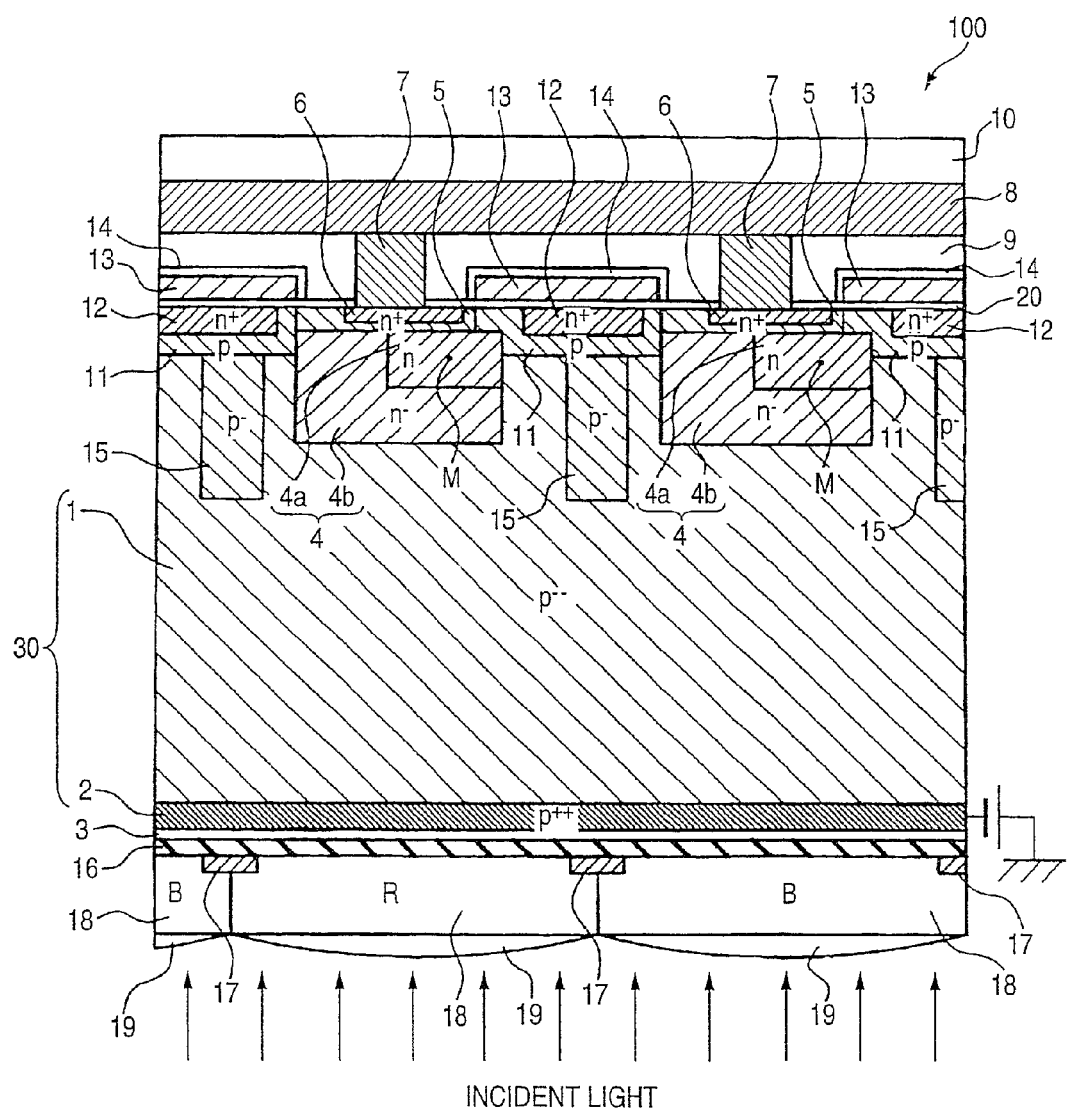
FIG. 8 is a view showing a modified example of the backside illuminated imaging device shown in FIG. 1.

The maximum potential point of the n layer 4 is not limited to the center of the n layer 4. For example, when the n layer 4 is configured as shown in FIG. 8, the maximum potential point of the n layer 4 is present in a position shifted from the center as shown in FIG. 8. In this case, it is desirable that the n⁺ layer 6 is provided in the position overlapping with the maximum potential point M as shown in FIG. 4.

It is preferable that a distance (or depth) of the maximum potential point of the n layer 4 from a boundary surface of the n layer 4 and a p⁺ layer 5 is within 0.3 μm in order to completely discharge electric charges from the potential well formed in the photoelectric conversion region and further reduce a voltage to be applied to electrodes 7 and 8 when the electric charges are discharged.

Next, an exemplary configuration of an imaging apparatus having the backside illuminated imaging device 100 will be described.

Figure 9:
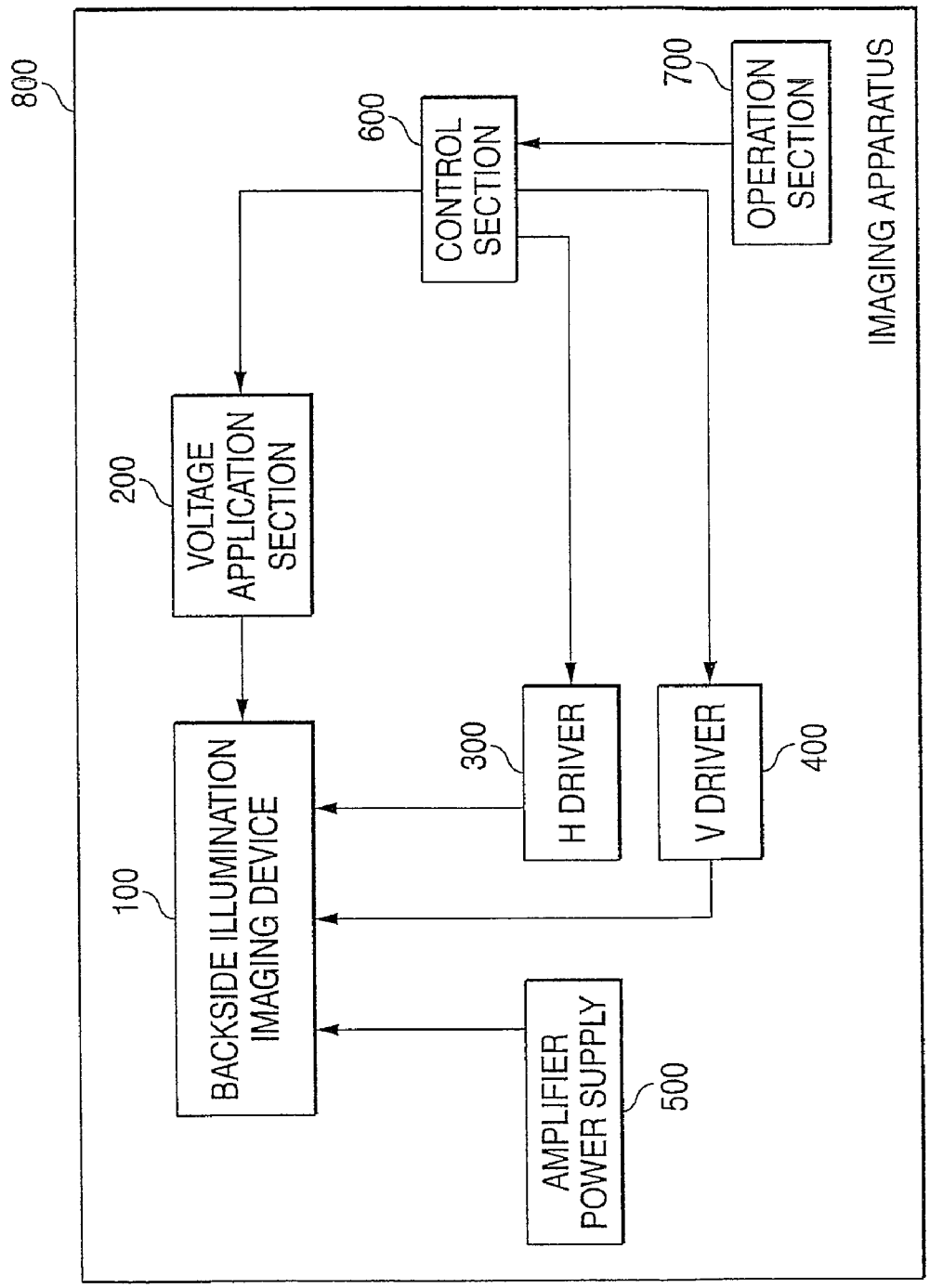
FIG. 9 is a block diagram showing a configuration example of an imaging apparatus having the backside illuminated imaging device shown in FIG. 1.

FIG. 9 is a block diagram showing the configuration example of the imaging apparatus having the backside illuminated imaging device 100.

As shown in FIG. 9, an imaging apparatus 800 includes the backside illuminated imaging device 100, a voltage application section 200 for applying a voltage to the electrode 8 of the backside illuminated imaging device 100, an H driver 300 for driving the HCCD of the backside illuminated imaging device 100, a V driver 400 for driving the VCCD of the backside illuminated imaging device 100, an amplifier power supply 500 serving as a power supply of a signal output amplifier of the backside illuminated imaging device 100, a control section 600 for controlling the overall imaging device, and an operation section 700.

The V driver 400 drives the VCCD by supplying the backside illuminated imaging device 100 with a readout voltage VH for reading out electric charges from the n layer 4 to the VCCD and voltages VM and VL for transferring the electric charges. Furthermore, VH>VM>VL, and VH is, for example, about 15 V.

The H driver 300 drives the HCCD by supplying the backside illuminated imaging device 100 with the voltages VH and VL required to transfer the electric charges. Furthermore, VH>VL, and VH is, for example, about 3.3 V.

The amplifier power supply 500 is the power supply for supplying a drain voltage of a transistor of each stage of a source follower circuit of the signal output amplifier.

The voltage application section 200 has a first function for supplying the electrode 8 with a first voltage determining a saturation charge amount of the n layer 4 (equal to that of the photoelectric conversion region) and a second function for supplying the electrode 8 with a second voltage higher than the first voltage to eliminate an overflow barrier formed by the p⁺ layer 5 in a state in which the first voltage has been applied. It is preferable that the first voltage is less than or equal to a driving voltage of the HCCD (having the amplitude of 3.3 V) and the second voltage is less than or equal to the readout voltage VH (having the amplitude of 15 V). Thus, the first voltage and the second voltage can be generated from an existing power supply, such that a new power supply is not required.

It is preferable that the second voltage is set by a value based on the first voltage. For example, the second voltage is a value in which the first voltage is added to any one of an application voltage for a drain of the transistor of the last stage of the source follower circuit, a difference between VL and VM, and a difference between VH and VM. Thus, the first voltage and the second voltage can be generated from an existing power supply, such that a new power supply is not required.

The voltage application section 200 adjusts a saturation charge amount of the n layer 4 by variably controlling the first voltage or adjusts an exposure time of the backside illuminated imaging device by variably controlling an application timing of the second voltage. For example, in the imaging apparatus 800, an addition transfer mode for adding and transferring electric charges accumulated in each group in the VCCD and a non-addition transfer mode for transferring electric charges accumulated in each group without addition in the VCCD can be set by dividing a plurality of n layers 4 into n groups (where n is a natural number of 2 or more). For example, the non-addition transfer mode is temporarily executed at the time of a still image photography mode requiring a high-quality image. For example, the addition transfer mode is executed at the time of a motion image photography mode requiring a fast operation.

Figure 10:
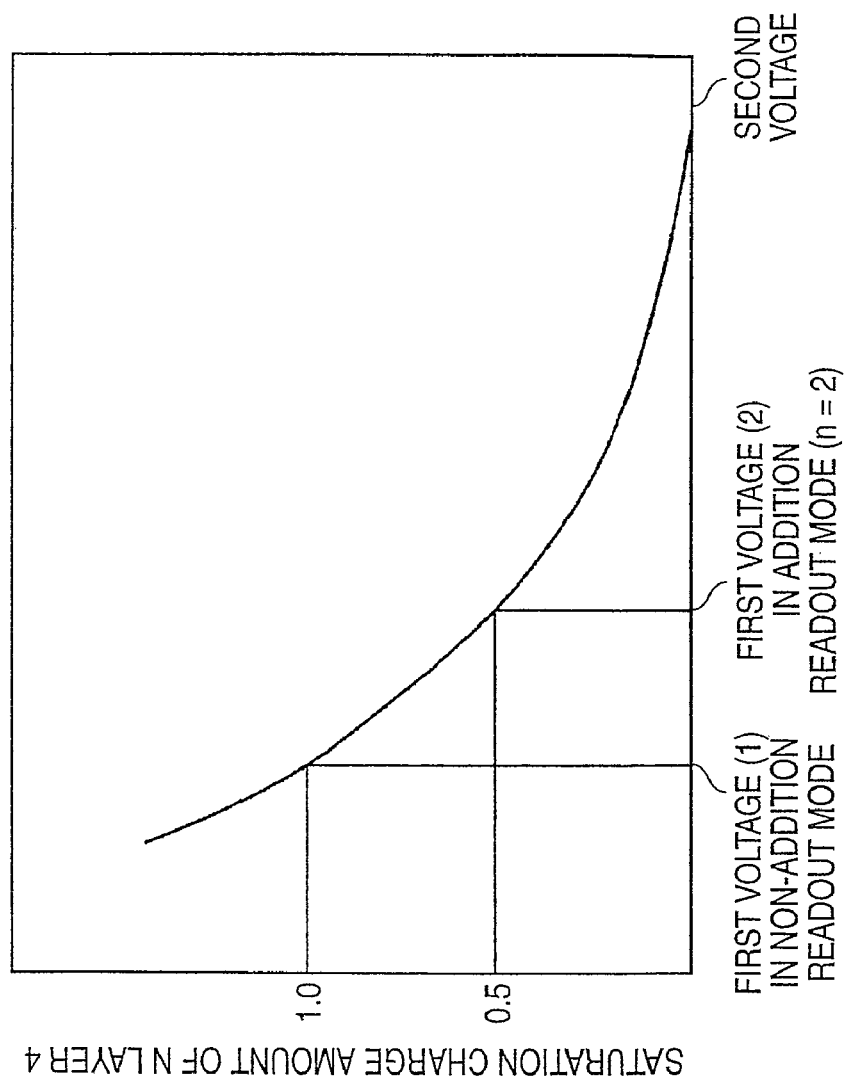
FIG. 10 is a view showing a relationship between a saturation charge amount of the n layer 4 and a voltage applied to a drain of the backside illuminated imaging device shown in FIG. 1.

The voltage application section 200 variably controls the first voltage such that the saturation charge amount of the n layer 4 when the addition transfer mode is set is 1/n of the saturation charge amount determined by the first voltage to be applied to the electrode 8 when the non-addition transfer mode is set (see FIG. 10). Accordingly, a charge overflow in the VCCD or HCCD can be prevented.

The operation of the imaging apparatus 800 configured as described above will be described.

When a user sets the still image photography mode through the operation section 700 and the control section 600 sets an exposure time, the voltage application section 200 repeatedly applies the second voltage as shown in FIG. 10 to the electrode 8 until just before the start of the exposure time set by the control section 600. Simultaneously with the exposure start, the voltage to be applied to the electrode 8 is switched to the first voltage (1) as shown in FIG. 10. After the end of the exposure period, electric charges accumulated in the n layer 4 are transferred to the signal output amplifier by the H driver 300 and the V driver 400. The electric charges are converted into a signal and are outputted.

On the other hand, when the user sets the motion image photography mode through the operation section 700 and the control section 600 sets an exposure time, the voltage application section 200 repeatedly applies the second voltage as shown in FIG. 10 to the electrode 8 until just before the start of the exposure time set by the control section 600. Simultaneously with the exposure start, the voltage to be applied to the electrode 8 is switched to the first voltage (2) as shown in FIG. 10. After the end of the exposure period, electric charges accumulated in the n layer 4 are transferred to the signal output amplifier by the H driver 300 and the V driver 400. The electric charges are converted into a signal and are outputted.

Next, another exemplary embodiment of the backside illuminated imaging device will be described.

Figure 11:
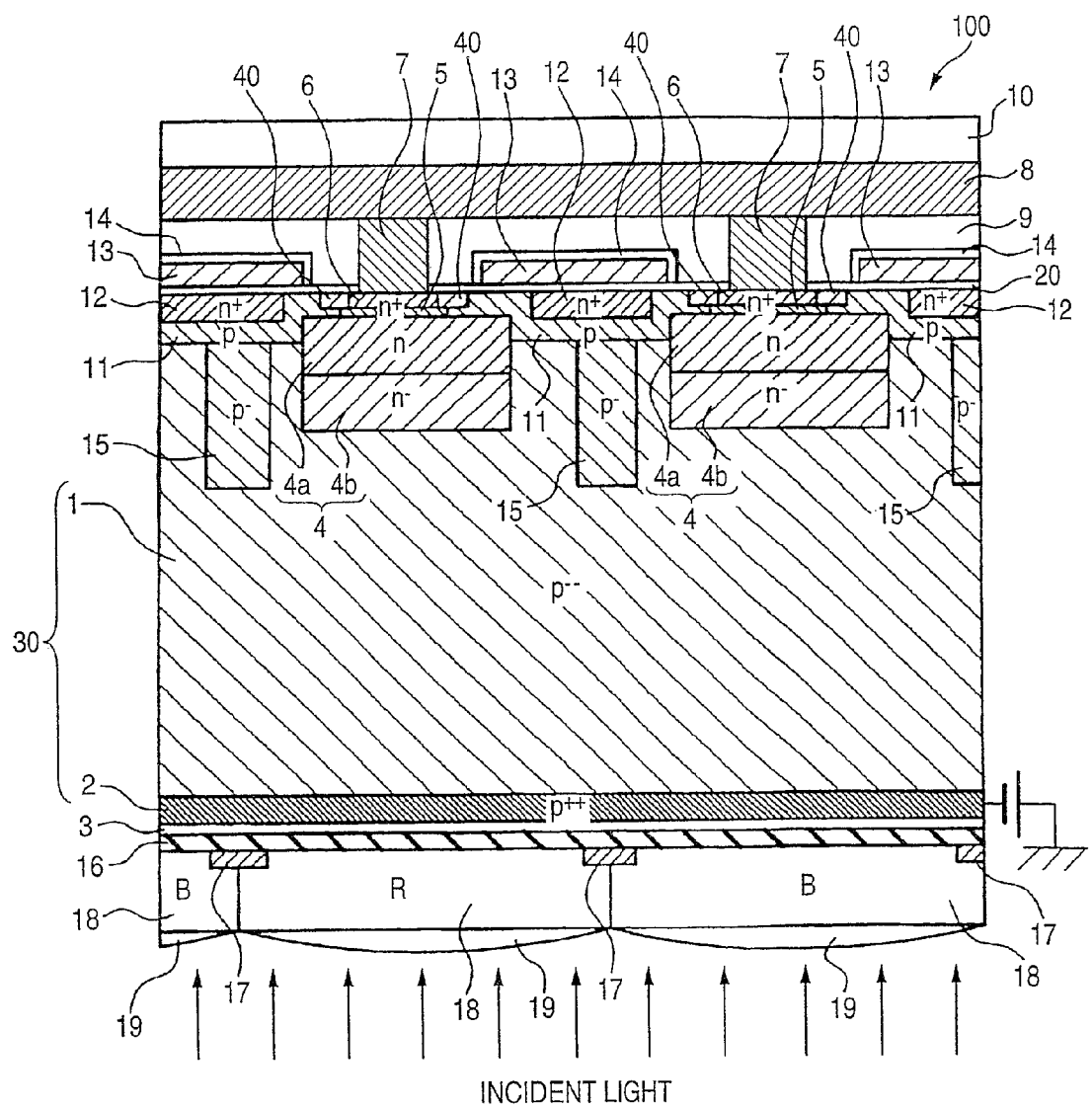
FIG. 11 is a schematic partial cross-sectional view of the backside illuminated imaging device of an interline type illustrating another exemplary embodiment of the invention.

In the backside illuminated imaging device 100 shown in FIG. 1, the p⁺ layer 5 is formed to surround the n⁺ layer 6. Since it is desirable that the p⁺ layer 5 is a layer functioning as at least an overflow barrier, the p⁺ layer 5 can be formed only between the n⁺ layer 6 and the n layer 4 in the configuration shown in FIG. 11. However, in this case, a p layer 11 rather than the n⁺ layer 6 is present between the surface of the p layer 1 and the n layer 4, such that dark charges are transferred from the p layer 11 to the n layer 4.

If the n⁺ layer 6 is as large as possible in the horizontal direction, the dark charges can be suppressed from being transferred via the p layer 11. When the n⁺ layer 6 is too large, an element separation is undesirably obstructed. In this embodiment, the n⁺ layer 6 has a required minimum size (similar to that of a bottom area of the electrode 7) and an n-type impurity diffusion layer (or n layer) 40 having a lower concentration than the n⁺ layer 6 is provided to extend a depletion layer formed by the n⁺ layer 6. Thus, the dark charges transferred to the n layer 40 can be transferred to the n⁺ layer 6, and an amount of dark charges transferred to the n layer 4 can be reduced without interfering with the element separation.

In order to effectively reduce the dark charges transferred to the n layer 4, it is preferable that the depletion layer formed by the n⁺ layer 6 covers ⅔ or more of the n layer 4 in plan view.

The case where the backside illuminated imaging device 100 is the CCD type in the second aspect has been described. Alternatively, the backside illuminated imaging device 100 can be the CMOS type. That is, a CMOS circuit including a CMOS transistor for converting electric charges accumulated in the n layer 4 into a signal can be formed on the surface of the p layer 1. In the case of the CMOS type, it is preferable that a charge accumulation layer for temporarily accumulating electric charges read out from the n layer 4 is formed in the vicinity of the n layer 4 and a signal based on the electric charges accumulated in the charge accumulation layer is output by the CMOS circuit. Therefore, a global exposure time control operation is possible and a unique drawback of a CMOS type image sensor due to a distorted image of an object in operation can be eliminated.

<Third Aspect>

The same configuration as in the backside illuminated imaging device 100 of FIG. 1 can be adopted as one of the third aspect.

Hereinafter, simulations in relation to the third aspect, executed by the inventors, will be described.

(Simulation 1)

Figure 12:
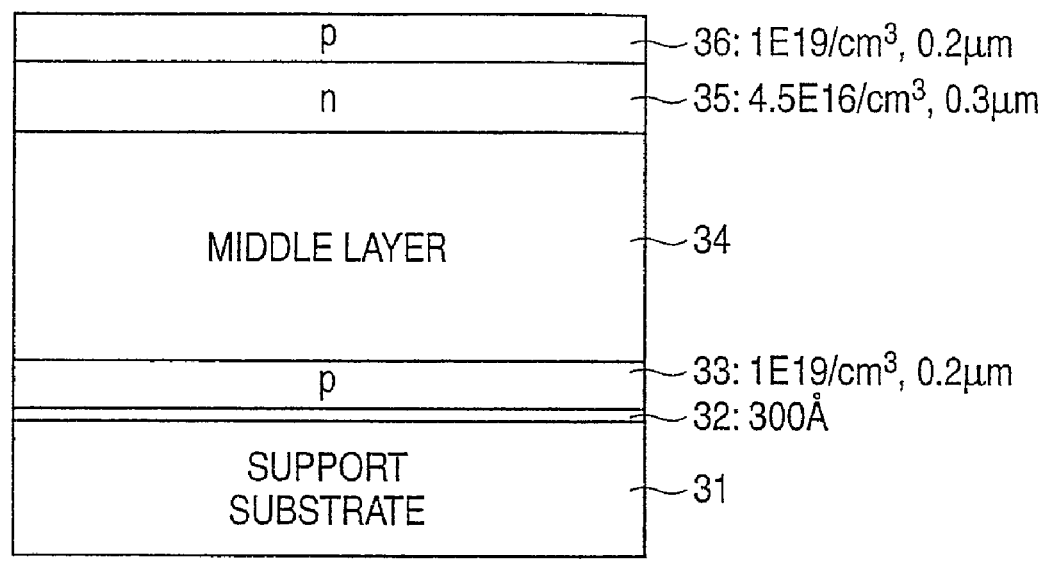
FIG. 12 is a view showing a model configuration of a semiconductor substrate used in Simulation 1.

FIG. 12 is a view showing a model configuration of a semiconductor substrate using Simulation 1.

The semiconductor substrate as shown in FIG. 12 includes an oxide silicon layer 32 (of a thickness of 300 angstroms) corresponding to the insulating layer 3 of FIG. 1 formed on a support substrate 31, a p-type semiconductor layer 33 (of an impurity concentration=1×10¹⁹/cm³ and a thickness=0.2 μm) corresponding to the p⁺⁺ layer 2 of FIG. 1 formed on the oxide silicon layer 32, an n-type semiconductor layer 35 (of an impurity concentration=4.5×10¹⁶/cm³ and a thickness=0.3 μm) corresponding to the n layer 4 formed on the p-type semiconductor layer 33, a p-type semiconductor layer 36 (of an impurity concentration=1.0×10¹⁹/cm³ and a thickness=0.2 μm) corresponding to the p⁺ layer 5 of FIG. 1 formed on the n-type semiconductor layer 35, and a middle layer 34 between the p-type semiconductor layer 33 and the n-type semiconductor layer 35. Furthermore, the thickness from the surface of the semiconductor substrate as shown in FIG. 12 to the backside was 8 μm and the depletion potential of the n-type semiconductor layer 35 was adjusted to 3 to 4 V.

Since the p-type semiconductor layer 33 is biased to 0 V, a potential difference of about 3 V occurs between the p-type semiconductor layer 33 and a maximum potential point of the photoelectric conversion region (at 0.5 μm from the semiconductor substrate surface in the model of FIG. 12). To form the depletion layer of the thickness of about 8 μm, the middle layer 34 should be able to be easily depleted, and an impurity concentration of this layer should be significantly lowered.

Figure 13:
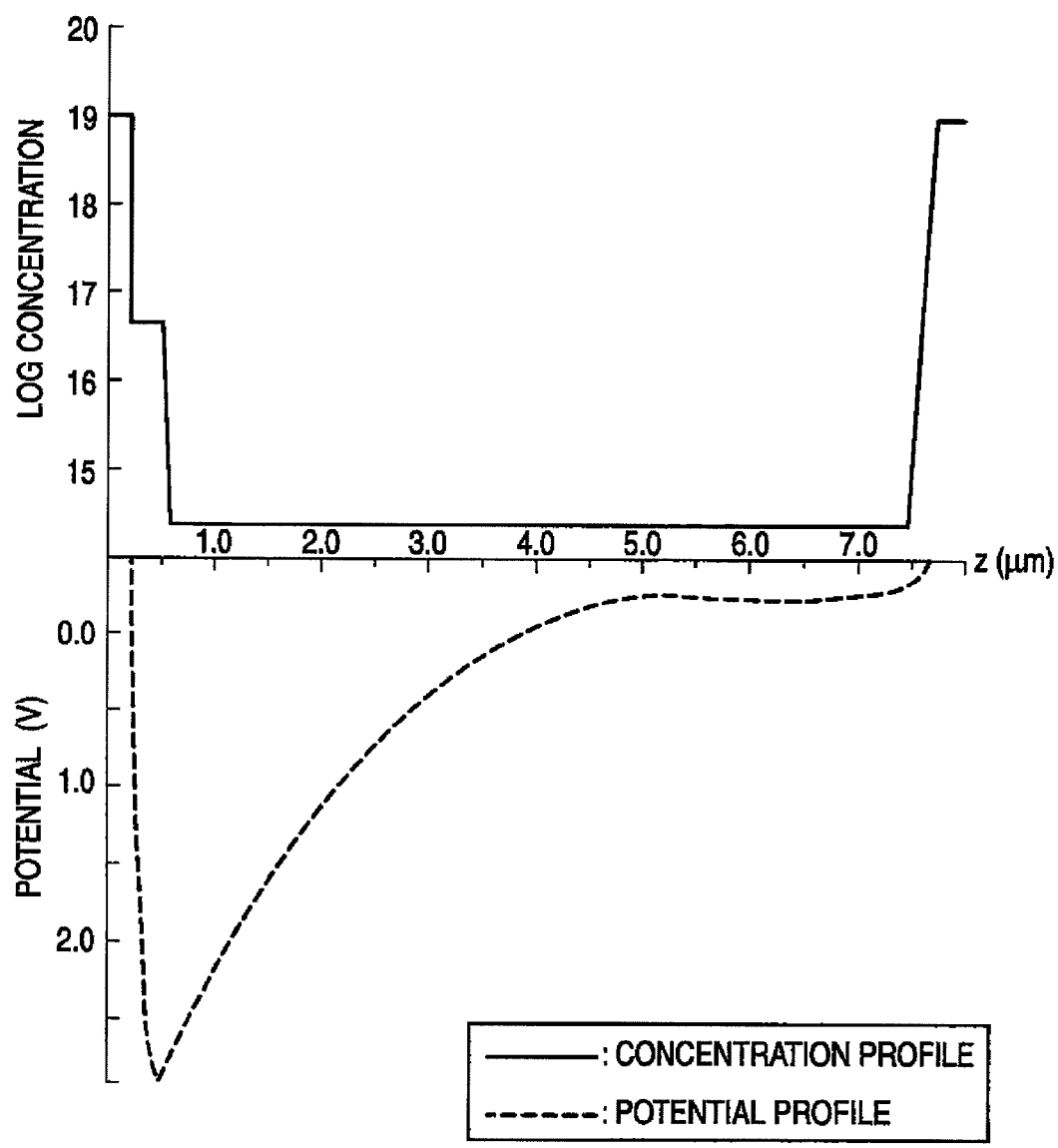
FIG. 13 is a view showing an impurity concentration and potential of a semiconductor substrate used in Simulation 1.
Figure 14:
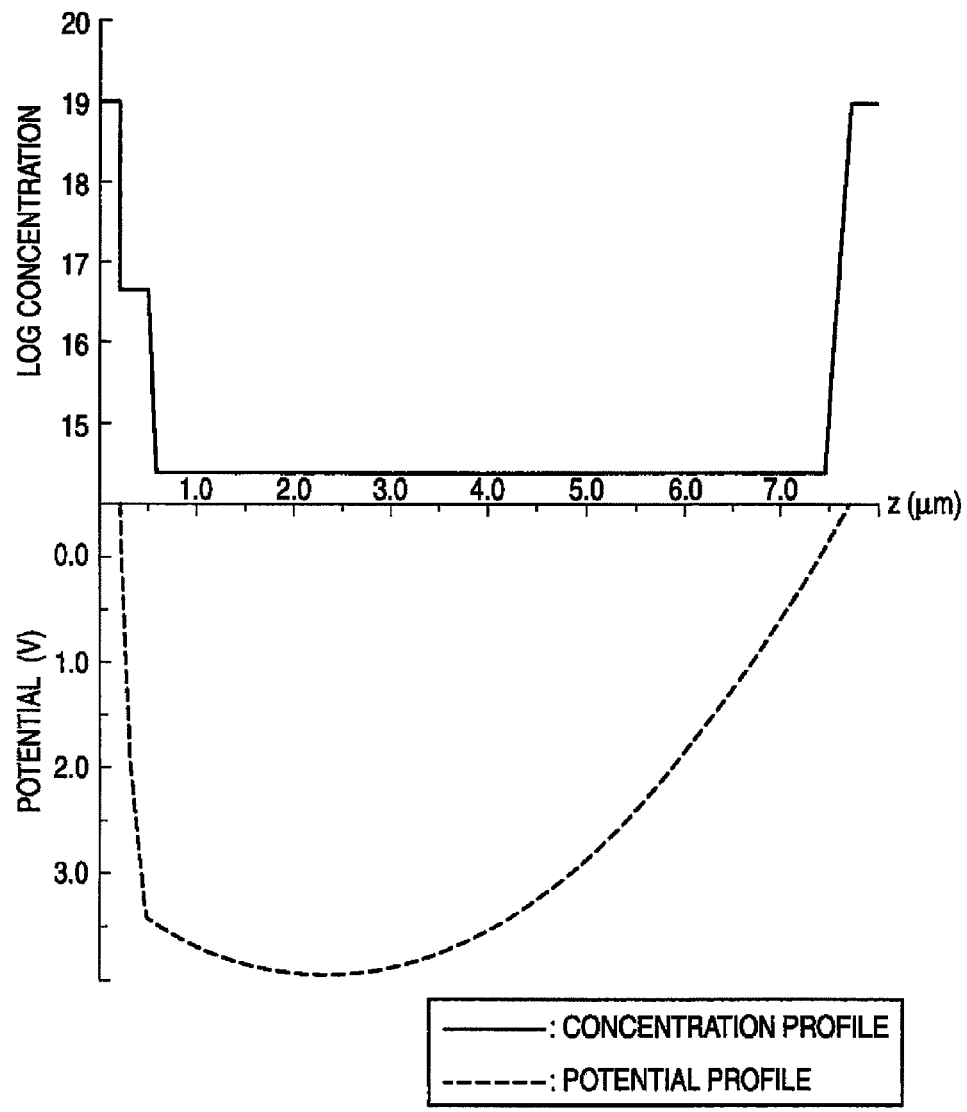
FIG. 14 is a view showing an impurity concentration and potential of a semiconductor substrate used in Simulation 1.

First, the inventors executed simulation using an n- or p-type semiconductor layer of an impurity concentration of 2×10¹⁴/cm³ as the middle layer 34. Simulation results in the case where the middle layer 34 is the p-type semiconductor layer are shown in FIG. 13. Simulation results in the case where the middle layer 34 is the n-type semiconductor layer are shown in FIG. 14.

When the middle layer 34 is the p-type semiconductor layer, the depletion layer does not extend to the p-type semiconductor layer 22 as shown in FIG. 13. When the middle layer 34 is the n-type semiconductor layer, an electron pool occurs in a deep portion of the semiconductor substrate as shown in FIG. 14. When a non-depleted layer is formed in the backside of the semiconductor substrate, electrons generated therein are diffused to another photoelectric conversion region and are eliminated by recombination. When the electron pool occurs in the deep portion of the semiconductor substrate, all photoelectric conversion regions are connected and an independent signal cannot be acquired from each photoelectric conversion region.

Upon computing concentrations in which a region of a zero potential gradient was absent between from the backside of the semiconductor substrate to the maximum potential point while varying the impurity concentrations of the n-type semiconductor layer and the p-type semiconductor layer applied to the middle layer 34, a computation result of $1 \times 10^{14}$/cm³ or less was obtained in the case of the n-type semiconductor layer and a computation result of $1.2 \times 10^{14}$/cm³ or less was obtained in the case of the p-type semiconductor layer.

Figure 15:
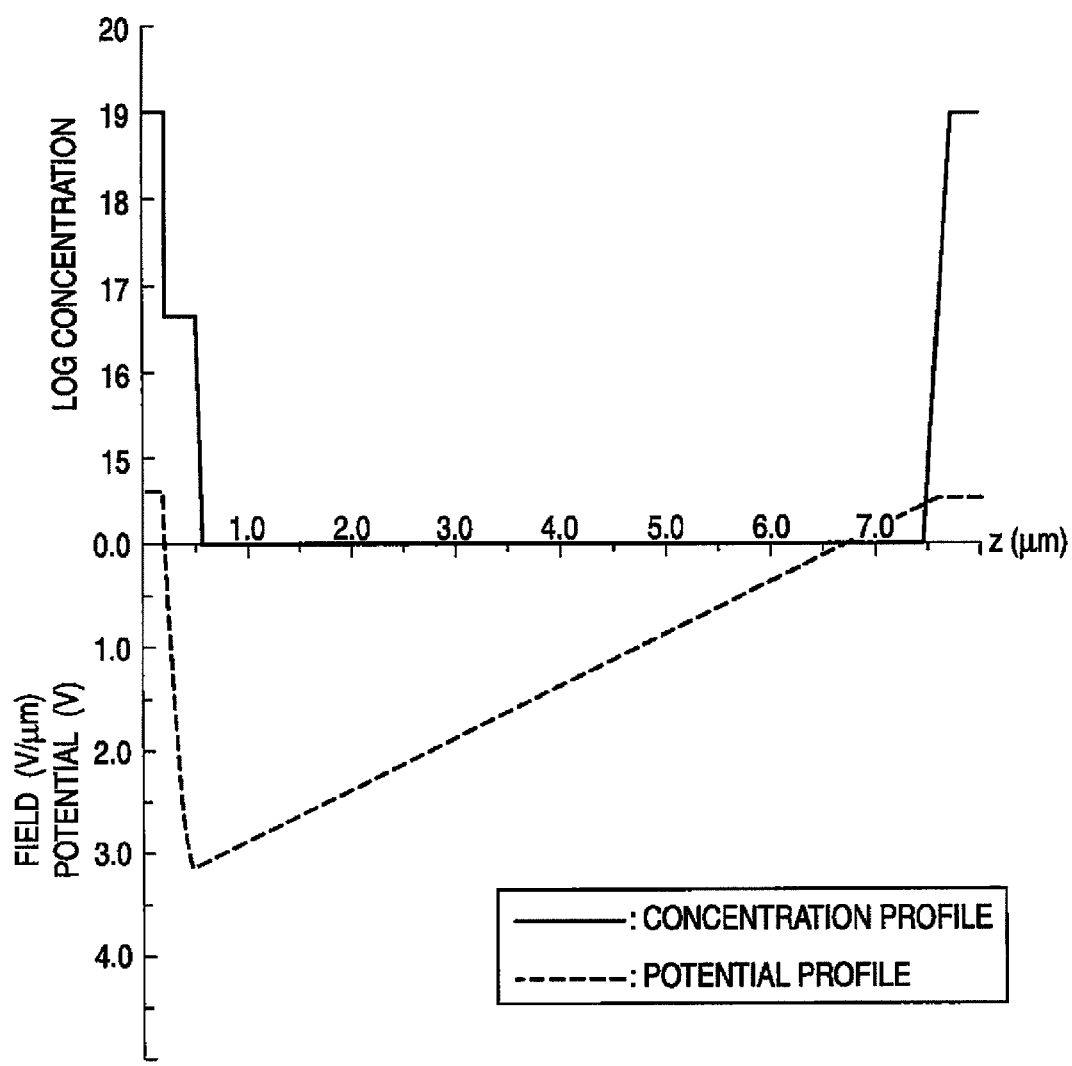
FIG. 15 is a view showing an impurity concentration and potential of a semiconductor substrate used in Simulation 1.
Figure 16:
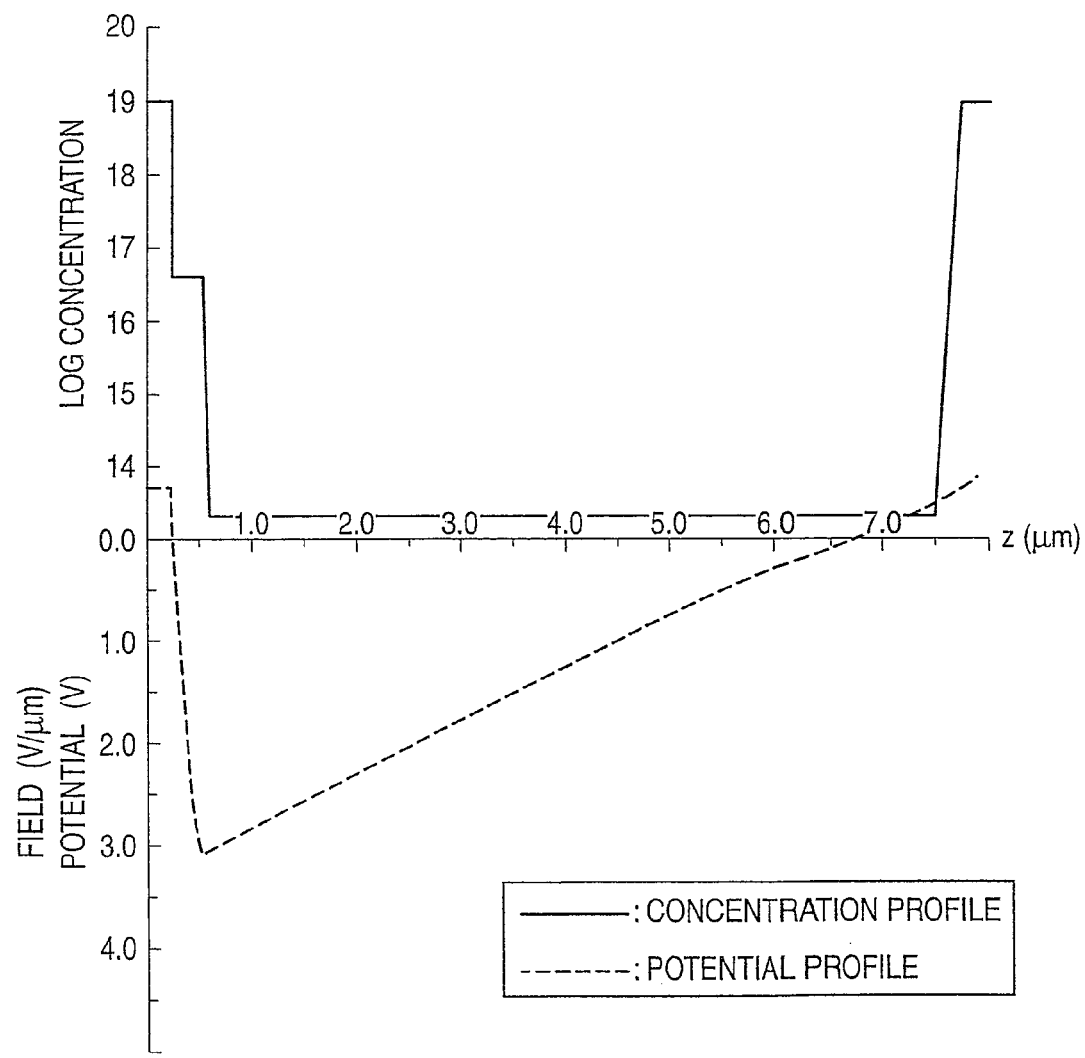
FIG. 16 is a view showing an impurity concentration and potential of a semiconductor substrate used in Simulation 1.

When the impurity concentration is set to 0 by further reducing the impurity concentrations of the n-type semiconductor layer and the p-type semiconductor layer applied to the middle layer 34, that is, when the middle layer 34 is an i-type semiconductor layer, simulation results are shown in FIG. 15. When the middle layer 34 is the p-type semiconductor layer of an impurity concentration of $2.0 \times 10^{13}$/cm³, simulation results are shown in FIG. 16. When the middle layer 34 is the n-type semiconductor layer of an impurity concentration of $2.0 \times 10^{13}$/cm³, simulation results are shown in FIG. 17.

Figure 17:
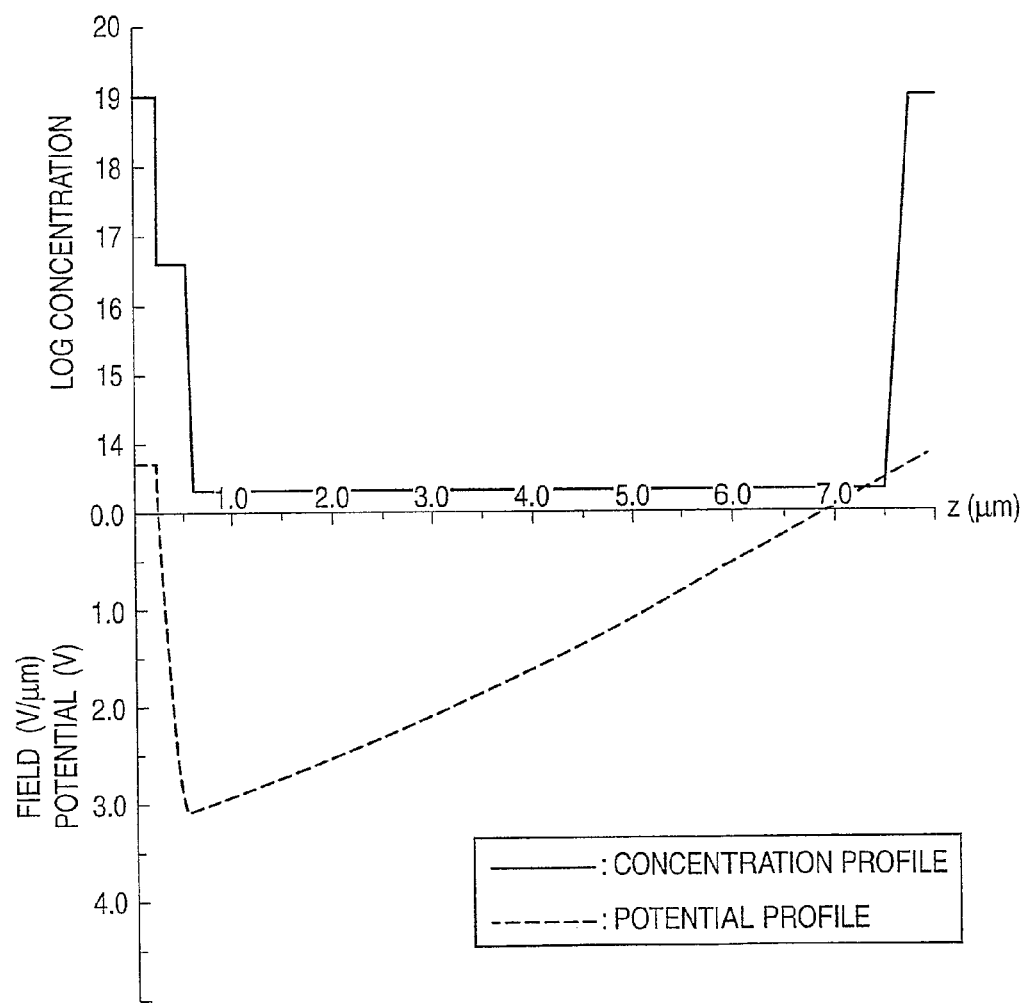
FIG. 17 is a view showing an impurity concentration and potential of a semiconductor substrate used in Simulation 1.

As shown in FIGS. 15 to 17, it can be seen that a potential distribution of the almost same form is obtained in any case of the case where the middle layer 34 is the n-type semiconductor layer of an impurity concentration of $2.0 \times 10^{13}$/cm³, the case where the middle layer 34 is the p-type semiconductor layer of an impurity concentration of $2.0 \times 10^{13}$/cm³, and the case where the middle layer 34 is the i-type semiconductor layer of an impurity concentration of 0. In other words, in the case where the middle layer 34 is the n- or p-type, the potential distribution is not changed even when its impurity concentration is less than $2.0\times10^{13}/cm^3$. Accordingly, it has been found that a signal charge separation between different photoelectric conversion regions can be surely realized even when the photoelectric conversion region is thick by setting the middle layer 34 to the n- or p-type semiconductor layer of more than $2.0\times10^{13}/cm^3$ and less than $1.0\times10^{14}/cm^3$ or the i-type semiconductor layer.

(Simulation 2)

Figure 18:
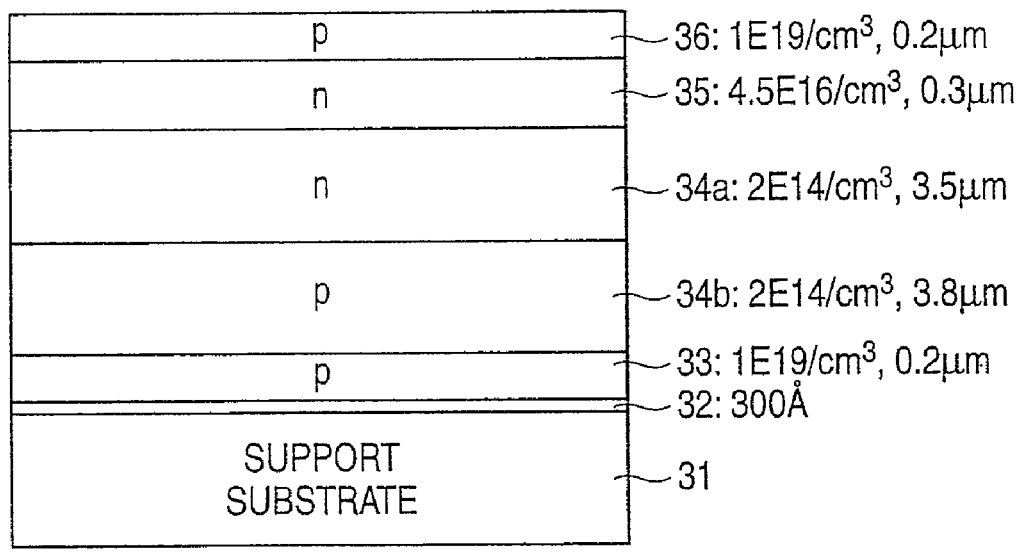
FIG. 18 is a view showing a model configuration of a semiconductor substrate used in Simulation 2.

FIG. 18 is a view showing a model configuration of a semiconductor substrate using Simulation 2.

The semiconductor substrate as shown in FIG. 18 is configured with the middle layer 34 of the semiconductor substrate as shown in FIG. 12 formed in a two-layer structure of a p-type semiconductor layer 34*b* (of an impurity concentration=$2\times10^{14}/cm^3$ and a thickness=3.8 μm) and an n-type semiconductor layer 34*a* (of an impurity concentration=$2.0\times10^{14}/cm^3$ and a thickness=3.5 μm) formed on the p-type semiconductor layer 34*b*.

Figure 19:
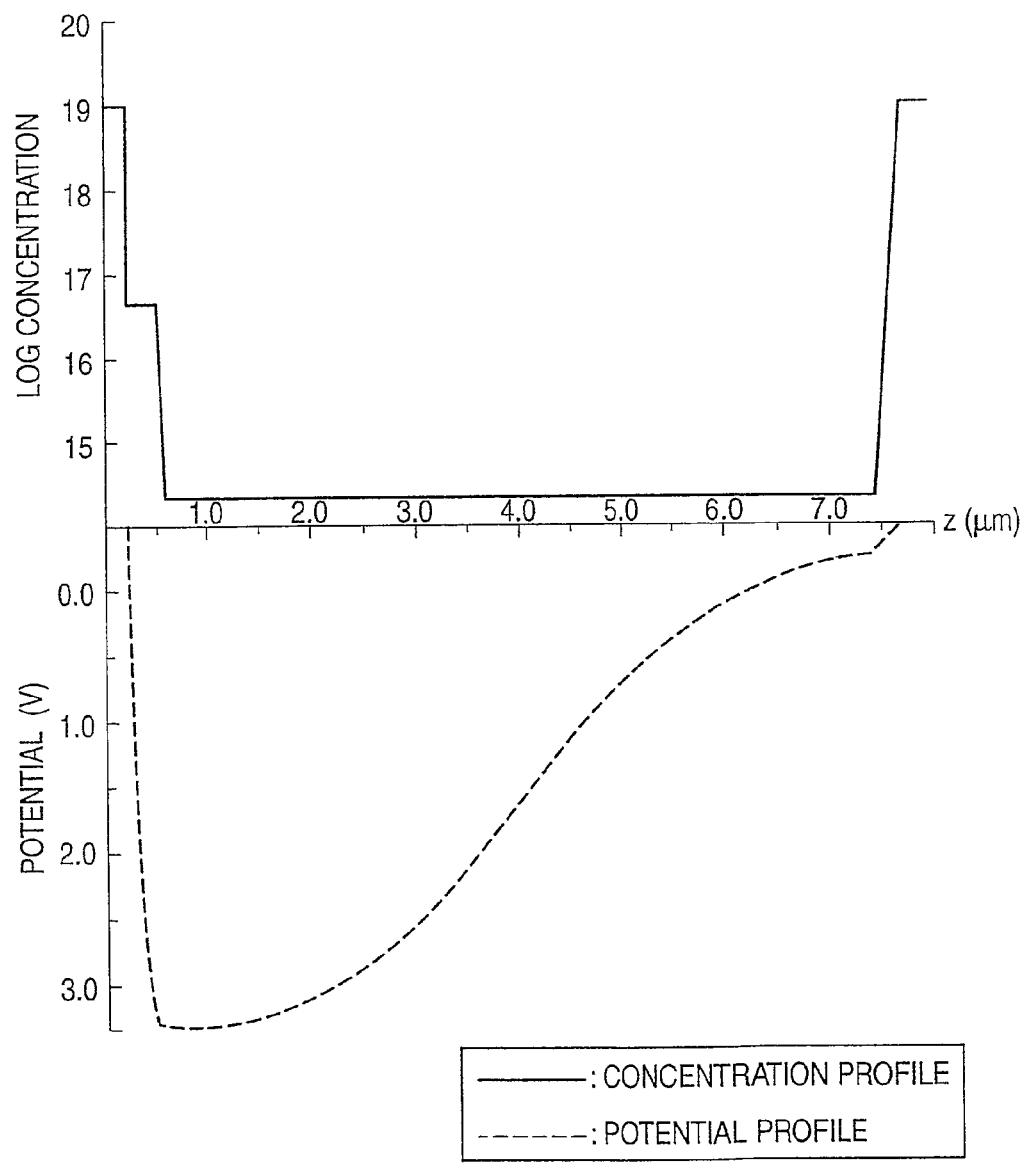
FIG. 19 is a view showing an impurity concentration and potential of a semiconductor substrate used in Simulation 2.

Simulation results of the configuration as shown in FIG. 18 are shown in FIG. 19. As shown in FIG. 19, it has been found that a region of a zero potential gradient is almost absent up to the maximum potential point of the photoelectric conversion region even when the impurity concentration of each of the two layers is $2.0\times10^{14}/cm^3$ by forming the middle layer 34 in the two layers of the n-type semiconductor layer and the p-type semiconductor layer. When the impurity concentration of each of the n-type semiconductor layer 34*a* and the p-type semiconductor layer 34*b* is less than $2.0\times10^{14}/cm^3$ in the configuration as shown in FIG. 18, the potential gradient is steeply formed as shown in FIGS. 15 to 17. From this result, it has been found that a signal charge separation between different photoelectric conversion regions can be surely realized even when the photoelectric conversion region is thick by forming the middle layer 34 in the two layers of the n-type semiconductor layer and the p-type semiconductor layer of $2.0\times10^{14}/cm^3$ or less.

Similar effects are achieved even when positions of the p-type semiconductor layer 34*b* and the n-type semiconductor layer 34*a* are reversed in the configuration as shown in FIG. 18.

(Simulation 3)

Figure 20:
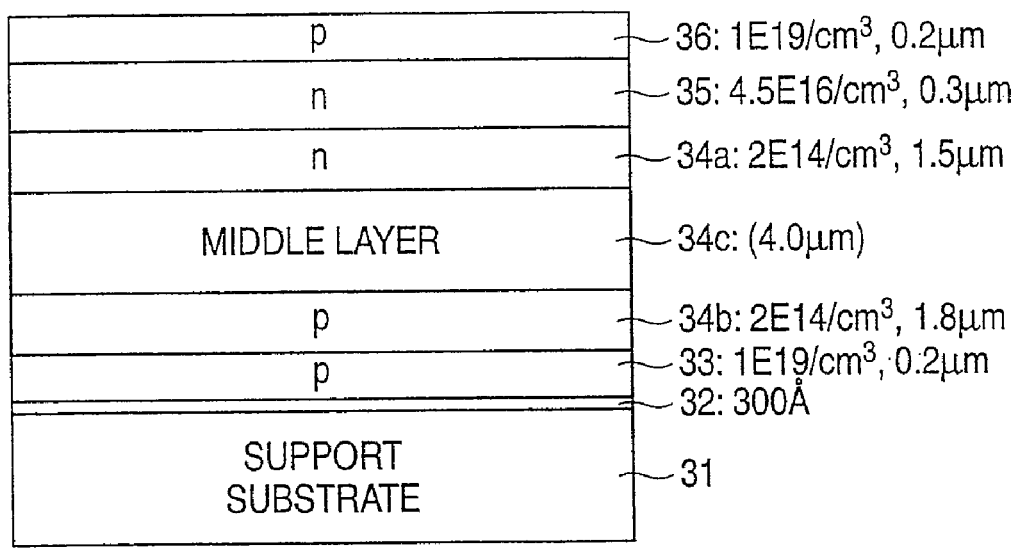
FIG. 20 is a view showing a model configuration of a semiconductor substrate used in Simulation 3.

FIG. 20 is a view showing a model configuration of a semiconductor substrate using Simulation 3.

The semiconductor substrate as shown in FIG. 20 is configured by setting a thickness of the p-type semiconductor layer 34*b* of the semiconductor layer as shown in FIG. 18 to 1.8 μm, setting a thickness of the n-type semiconductor layer 34*a* to 1.5 μm, and providing a middle layer 34*c* of a thickness of 4 μm between the n-type semiconductor layer 34*a* and the p-type semiconductor layer 34*b*.

It has been found that the potential gradient as shown in FIG. 19 can be steeply formed by setting the impurity concentration of the n- or p-type semiconductor layer to $1\times10^{14}/cm^3$ or less upon executing the simulation using the middle layer 34*c* serving as the n- or p-type semiconductor layer also in the configuration as shown in FIG. 20 as in Simulation 1.

Figure 21:
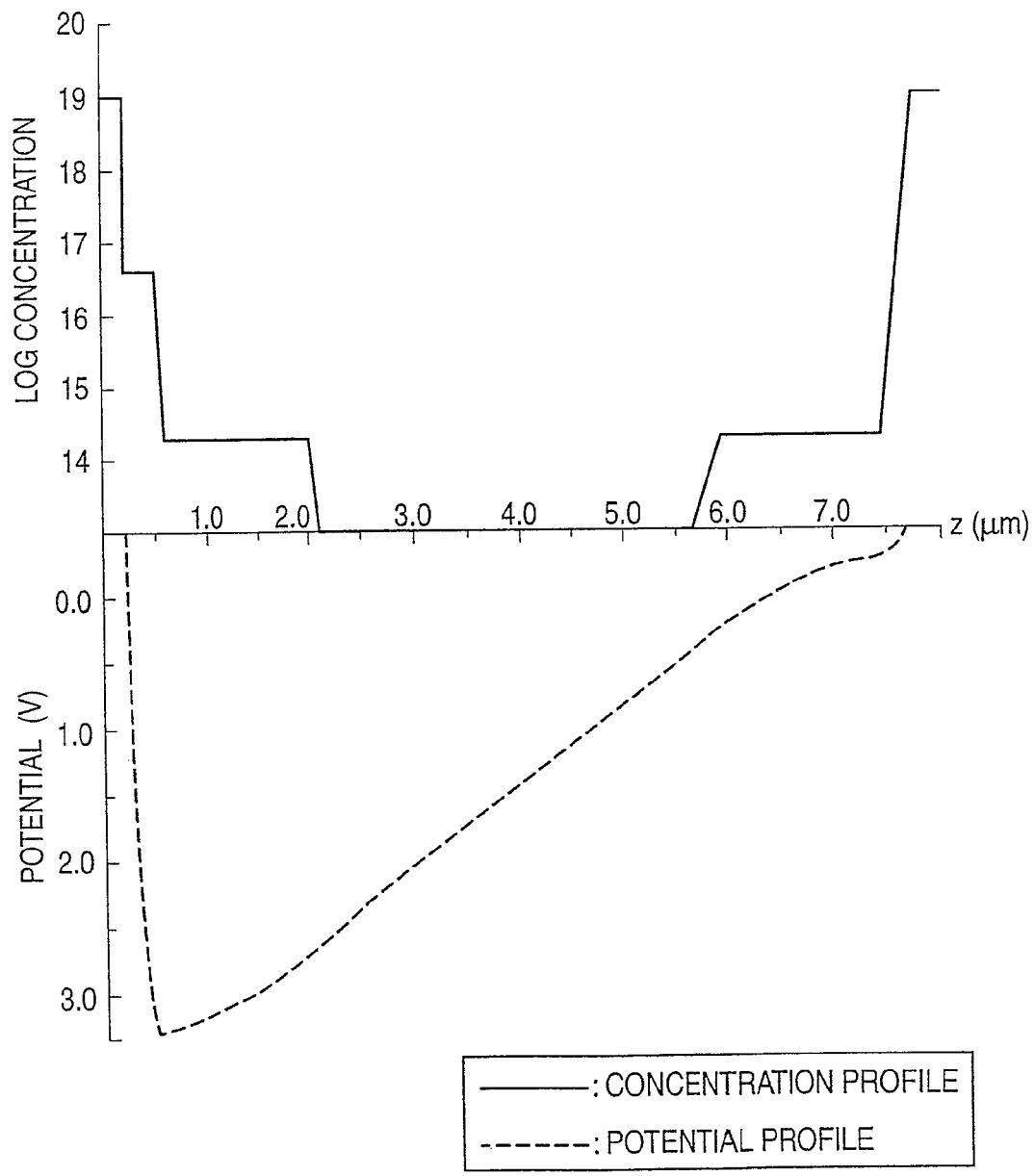
FIG. 21 is a view showing an impurity concentration and potential of a semiconductor substrate used in Simulation 3.
Figure 22:
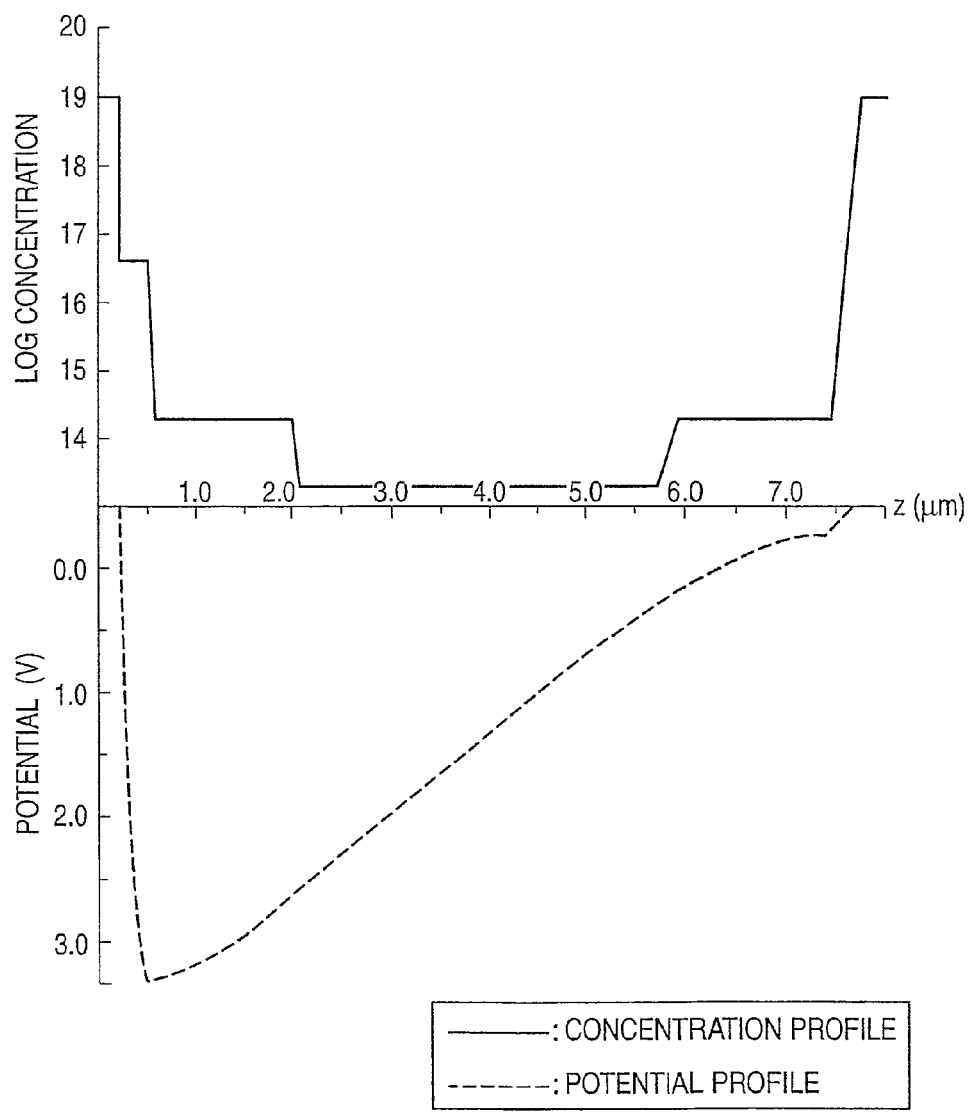
FIG. 22 is a view showing an impurity concentration and potential of a semiconductor substrate used in Simulation 3.

When the impurity concentration is set to 0 by further reducing the impurity concentrations of the n-type semiconductor layer and the p-type semiconductor layer applied to the middle layer 34*c*, that is, when the middle layer 34*c* is an i-type semiconductor layer, simulation results are shown in FIG. 21. When the middle layer 34*c* is the p-type semiconductor layer of an impurity concentration of $2.0\times10^{13}/cm^3$, simulation results are shown in FIG. 22. When the middle layer 34*c* is the n-type semiconductor layer of an impurity concentration of $2.0\times10^{13}/cm^3$, simulation results are shown in FIG. 23.

Figure 23:
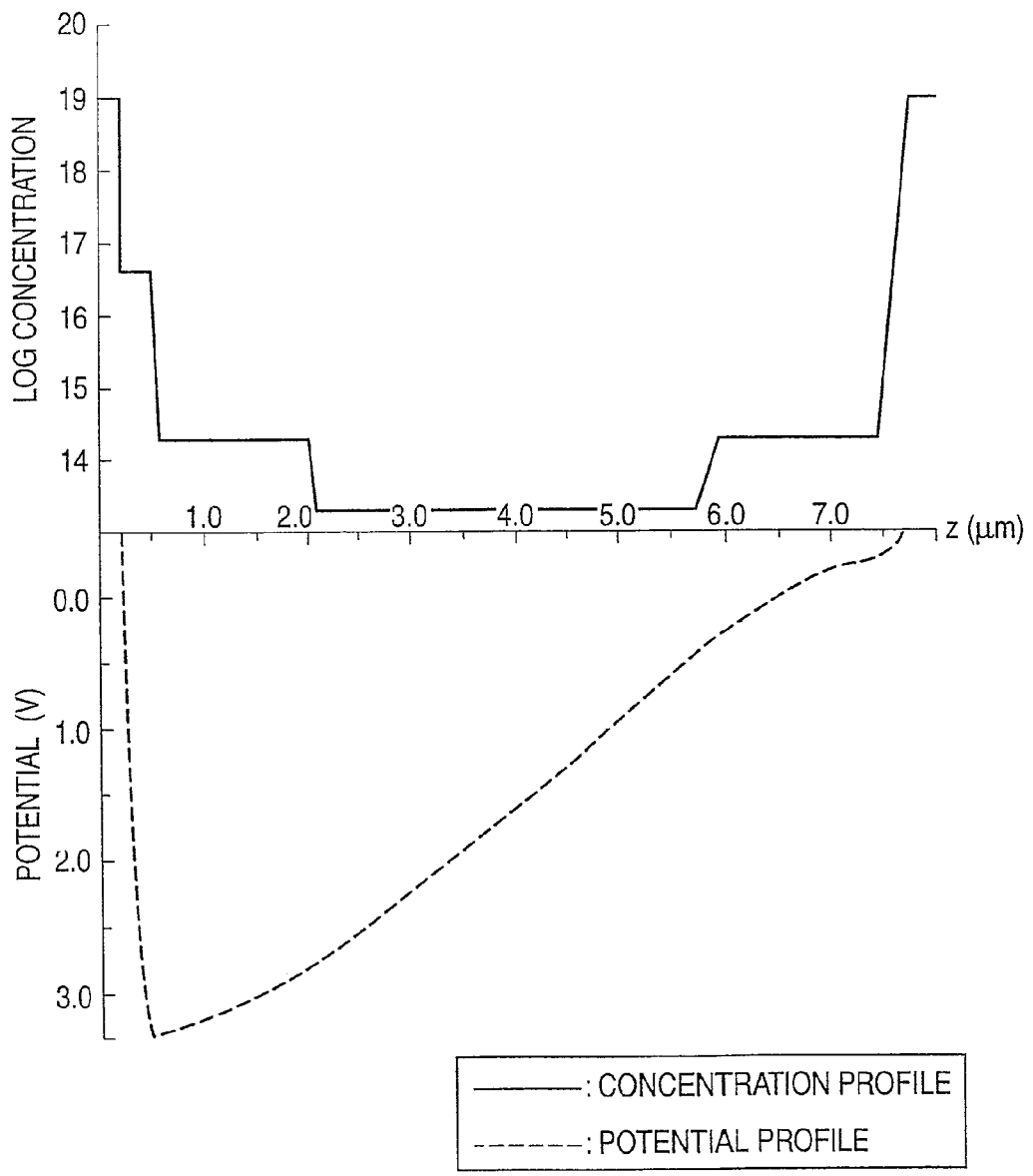
FIG. 23 is a view showing an impurity concentration and potential of a semiconductor substrate used in Simulation 3.

As shown in FIGS. 21 to 23, it can be seen that a potential distribution of the almost same form is obtained in any case of the case where the middle layer 34*c* is the n-type semiconductor layer of an impurity concentration of $2.0\times10^{13}/cm^3$, the case where the middle layer 34*c* is the p-type semiconductor layer of an impurity concentration of $2.0\times10^{13}/cm^3$, and the case where the middle layer 34*c* is the i-type semiconductor layer of an impurity concentration of 0. In other words, in the case where the middle layer 34*c* is the n- or p-type, the potential distribution is not changed even when its impurity concentration is less than $2.0\times10^{13}/cm^3$. Accordingly, it has been found that the potential as shown in FIG. 19 can be improved even when the photoelectric conversion region is thick by setting the middle layer 34*c* to the n- or p-type semiconductor layer of more than $2.0\times10^{13}/cm^3$ and less than $1.0\times10^{14}/cm^3$ or the i-type semiconductor layer.

When the p substrate 30 in the backside illuminated imaging device 100 as in FIG. 1 is configured by the model of the simulations 1 to 3, a signal charge separation between different photoelectric conversion regions can be surely realized even when the photoelectric conversion region is thick, and a backside illuminated imaging device 100 having a much higher sensitivity can be realized.

<Fourth Aspect>

The same configuration as in the backside illuminated imaging device 100 of FIG. 1 can be adopted as one of the fourth aspect.

An example of a method of manufacturing a silicon-on-insulator (SOI) substrate including the p substrate 30 and the insulating layer 3 of the backside illuminated imaging device 100 as shown in FIG. 1 will be described.

Figure 24:
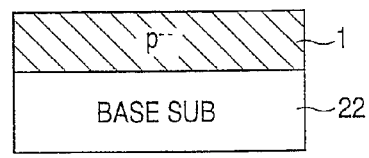
FIG. 24 is a cross-sectional view illustrating manufacturing processes (a)-(f) of an SOI substrate using a backside illuminated imaging device.
Figure 24:
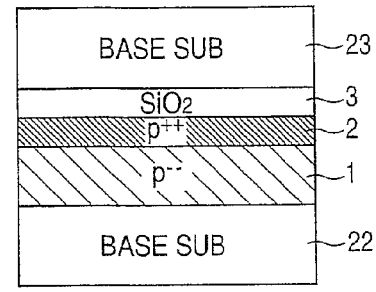
Figure 24:
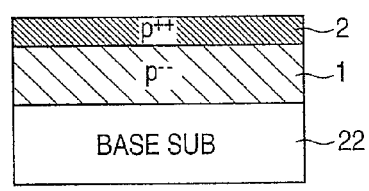
Figure 24:
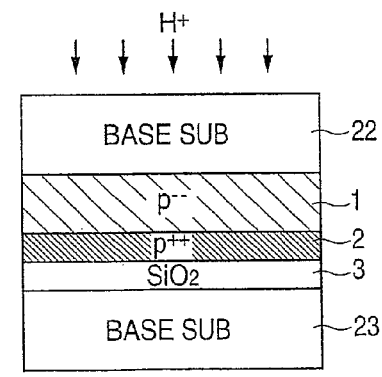
Figure 24:
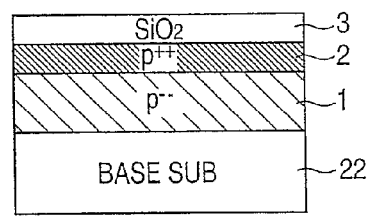
Figure 24:
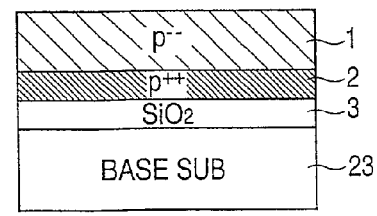

FIG. 24 is a view illustrating a process of manufacturing the SOI substrate using the backside illuminated imaging device. In FIG. 24, the same components as those of FIG. 1 are assigned the same reference numerals.

First, a p layer 1 is formed on a base substrate 22 of silicon or the like by epitaxial growth (FIG. 24(*a*)). In FIG. 24(*a*), an exposed surface of the p layer 1 becomes a back side surface of a p substrate 30. Next, a $p^{++}$ layer 2 is formed by carrying out ion implantation from the upper side of a p layer 1 (FIG. 24(*b*)). Accordingly, a p substrate 30 is formed.

Next, an insulating layer 3 containing oxide silicon is formed on the $p^{++}$ layer 2 by CVD, thermal oxidation, or the like (FIG. 24(*c*)). Then, a base substrate 23 of silicon or the like is connected on the insulating layer 3 (FIG. 24(*d*)). The base substrate 23 is rotated to the lower side such that base substrate 22 becomes the upper side, and hydrogen ions are implanted around an interface of the base substrate 22 and the p layer 1 from the upper side of the base substrate 22 (FIG. 24(*e*)). Since the base substrate 22 and the p layer 1 are separated by this ion implantation, the base substrate 22 is exfoliated from the p layer 1 in the next process (FIG. 24(*f*)).

From the state of FIG. 24(*f*), an element located around the surface of the p substrate 30 is formed. After formation, the base substrate 23 is etched and removed using the insulating layer 3 as a stopper. The process of manufacturing the backside illuminated imaging device 100 is completed by forming a color filter 18, a microlens 19, and the like.

In a method of removing the base substrate 23 in FIG. 24(*f*), a method is considered in which a plurality of slits are formed on the base substrate 23 by an optical excitation method and etching is performed using the insulating layer 3 serving as a stopper and a KOH etchant. The insulating layer 3 can use nitride silicon other than oxide silicon. In this case, etching can be used with the nitride silicon serving as the stopper.

As a method of forming the n+ layer 6 and the electrodes 7 and 8, the method in the first aspect can be adopted.

A more detailed embodiment related to a manufacturing process of the backside illuminated imaging device in accordance with this aspect will be described below with reference to FIGS. 25 to 28.

Figure 25:
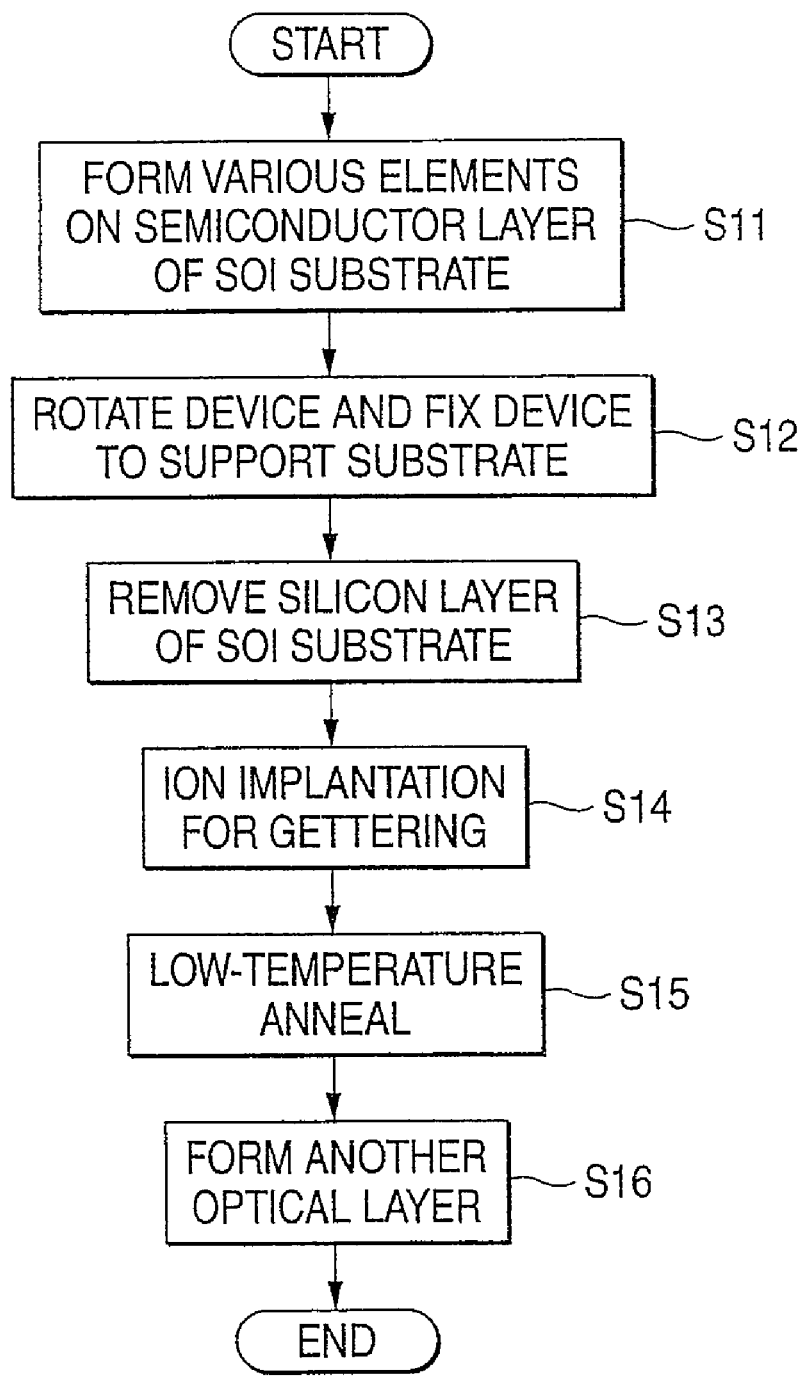
FIG. 25 is a flowchart schematically showing a process of manufacturing a backside illuminated imaging device in accordance with an exemplary embodiment of the fourth aspect.
Figure 26:
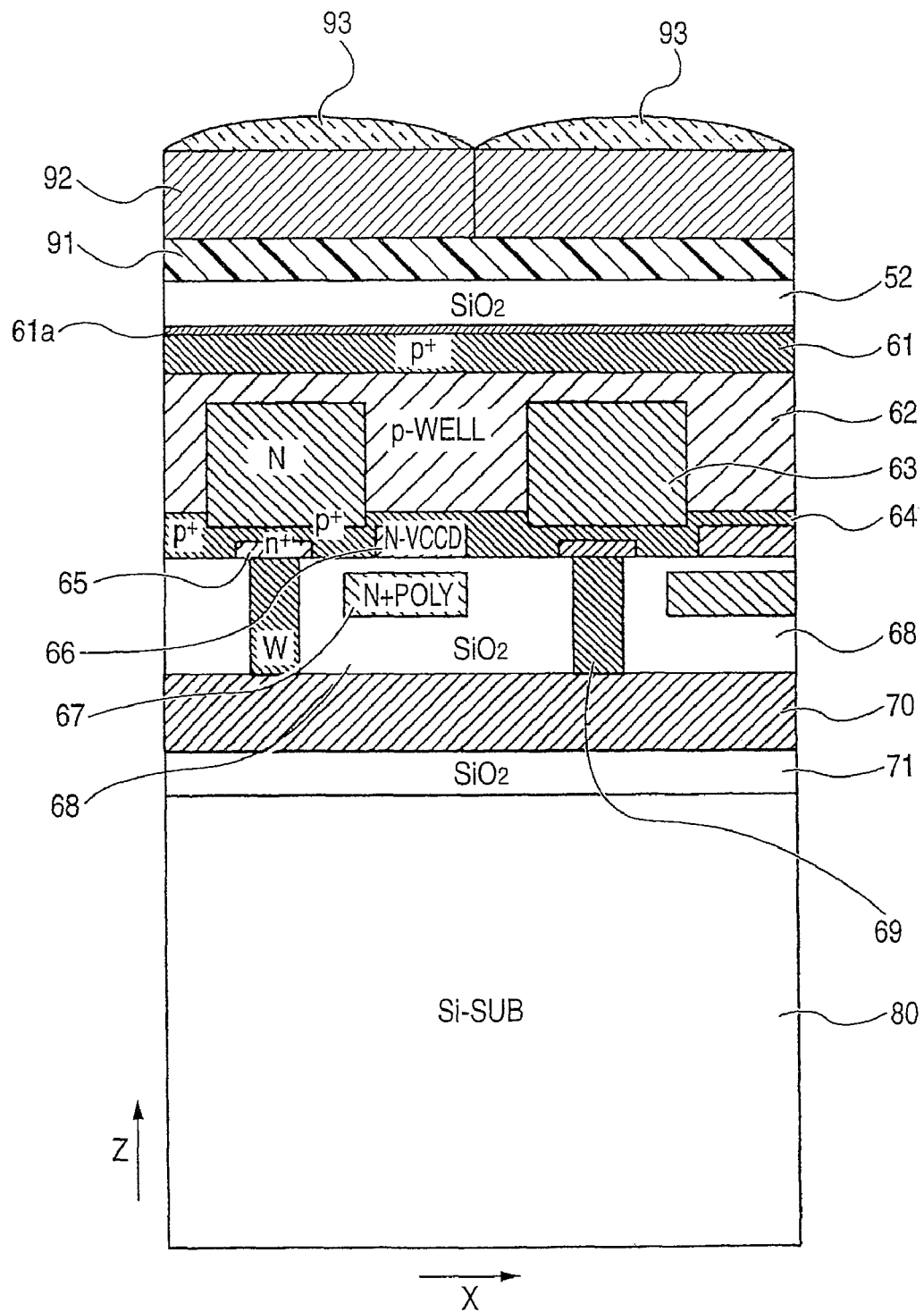
FIG. 26 is a longitudinal cross-sectional view showing a configuration of the backside illuminated imaging device of an exemplary embodiment of the fourth aspect.

FIG. 25 is a flowchart schematically showing a process of manufacturing the backside illuminated imaging device, FIG. 26 is a longitudinal cross-sectional view showing a configuration of the backside illuminated imaging device, and FIGS. 27 and 28 are longitudinal cross-sectional views showing a configuration of the backside illuminated imaging device in (a), (b), and (c) in processes.

That is, this embodiment considers the case where the backside illuminated imaging device shown in FIG. 26 is manufactured. The basic structure of the backside illuminated imaging device shown in FIG. 26 is similar to that shown in FIG. 1. For example, the n$^+$ layer (or overflow drain) 6 of FIG. 1 corresponds to an n$^+$ layer 65 of FIG. 26. It is should be noted that a direction of the backside illuminated imaging device shown in FIG. 26 is placed oppositely in top and bottom relationship with respect to the backside illuminated imaging device of FIG. 1.

First, the backside illuminated imaging device of FIG. 26 representing a completion state will be described. In the backside illuminated imaging device as shown in FIG. 8, a second semiconductor support substrate 80, an insulating layer 71, and an electrode (aluminum) 70 are formed in line order from the lower side in an arrow Z direction. In an insulating layer 68, an electrode (tungsten) 69 and an n$^+$ polysilicon region 67 are formed. In a p$^+$ layer 64, a charge transfer region (or n$^-$ region) 66 corresponding to the n$^+$ polysilicon region 67 and an n$^+$ region 65 connected to the electrode 69 are formed. A photoelectric conversion region (or n-type semiconductor region) 63 is formed from the p layer 62 to the p$^+$ layer 64, and a p+ layer 61, an insulating layer 52, a planarization layer (or resist) 91, a color filter 92, and a microlens 93 are formed thereon. The electrodes 69 and 70 can suitably use aluminum, high melting point metal of W, Mo, or the like, polysilicon, or the like other than the above-described materials.

In a semiconductor layer 51 (see FIG. 27(a)) serving as the semiconductor substrate of the final shape according to the above-described configuration, the photoelectric conversion region 63 including a light receiving portion and a transfer portion for transferring signal charges generated in the photoelectric conversion region 63 are formed. The insulating layer 52 is formed on a surface layer of the back side serving as an incident light side, that is, the surface of the p+ layer 61. Thus, an impurity layer 61a for gettering formed by ion implantation is formed in a deep position from an interface with the insulating film 52 of the p$^+$ layer 61 or an interface.

The upper side in FIG. 26 serves as the back surface of the backside illuminated imaging device. Light is incident into the microlens 93 formed from the upper side to the upper surface. The incident light is transmitted to the microlens 93, the color filter 92, the planarization layer 91, the insulating layer 52, the p$^+$ layer 61, and the p layer 62 and reaches the photoelectric conversion region (or n-type semiconductor region) 63 forming the photodiode. Accordingly, since the light incident into the photodiode is shielded by the electrode 70 or the electrode 69, a large opening area can be achieved even when a size of an image pickup cell (or an image pickup portion of one pixel) is small.

A schematic manufacturing process when the backside illuminated imaging device is manufactured is shown in FIG. 25. The process will be sequentially described with reference to FIGS. 27 and 28.

First, a semiconductor substrate 50 as shown in FIG. 27(a) is prepared as a wafer. In this example, a silicon-on-insulator (SOI) substrate configured with a first semiconductor layer (or SOI layer) 51, an insulating layer 52, and a first semiconductor support substrate 53 is used as the semiconductor substrate 50.

The first semiconductor support substrate 53 is a support substrate of silicon (Si), the insulating layer 52 is a SiO$_2$ layer (or a BOX layer) having compression stress, and the first semiconductor layer (or SOI layer) 51 is an epitaxial layer (Si-Epi) of defect-free silicon. When a backside illuminated imaging device for performing photography in a visible light wavelength range is manufactured, a thickness of the semiconductor layer (or SOI layer) 51 needs to be about 3-20 μm according to absorption property of visible light. If quality is sustainable in conventional LSI manufacturing, there is no special limitation in terms of the insulating layer 52.

In the process of step S11 as shown in FIG. 25, various types of components of a device are formed in a portion of the conductivity type semiconductor substrate (or SOI layer) 51 of the semiconductor substrate 50 shown in FIG. 27(a). In other words, the photoelectric conversion region including the light receiving portion and the charge transfer portion for transferring signal charges generated in the photoelectric conversion region to a signal output portion are formed in the SOI layer 51. The resulting state is shown in FIG. 27(b). In an example as shown in FIG. 27(b), important elements corresponding to one cell of the backside illuminated imaging device are formed. Specifically, the p$^+$ layer 61, the p layer 62, the photoelectric conversion region (or n-type semiconductor region) 63, the p$^+$ layer 64, the n$^+$ region 65, the charge transfer region (or n$^-$ region) 66, the n$^+$ polysilicon region 67, the insulating layer 68, the electrode (tungsten) 69, the electrode (aluminum) 70, and the insulating layer 71 are formed in line order from the lower side of the one cell.

The photoelectric conversion region (or n-type semiconductor region) 63 forms a photodiode for generating signal charges based on incident light, and the charge transfer region (or n$^-$ region) 66 forms a vertical transfer CCD for transferring the signal charges to a desired position. The electrodes 69 and 70 are used to apply a voltage for reading out or transferring the signal charges to each portion. Of course, a MOS structure can be used in place of the CCD configuration.

In the next step S12 as shown in FIG. 25, the second semiconductor support substrate (or silicon support substrate) 80 is prepared in advance. The top and bottom of the structure of the state as shown in FIG. 27(b) are reversed in the arrow Z direction and the lower surface of the insulating layer serving as the lower side is attached firmly to the upper surface of the second semiconductor support substrate 80, such that they are attached and fixed. In other words, the top and bottom of the semiconductor substrate (or SOI substrate) 50 are reversed and the surface opposite to the first semiconductor support substrate 53 of the semiconductor substrate 50 is fixed to the second semiconductor support substrate 80. The resulting state is shown in FIG. 27(c). The top and bottom are reversed in this embodiment, but the embodiment is not limited thereto. Of course, a junction with the second semiconductor support substrate 80 is possible in the natural state without reversal.

In the next step S13 as shown in FIG. 25, ion implantation for gettering is performed. The upper side of the drawing in the structure of the state of FIG. 27(c), that is, the first semiconductor support substrate 53, is removed. Specifically, after performing a treatment of mechanical polishing (MP), chemical-mechanical polishing (CMP), or the like, the first semiconductor support substrate 53 is removed by performing a fluorine treatment or the like. As a result, the surface of the insulating layer 52 serving as a boundary surface 82 is exposed on the upper side of the drawing as shown in FIG. 28(a). The insulating layer 52 functions as a stopper when the first semiconductor support substrate 53 is removed.

In the next step S14 as shown in FIG. 25, ion implantation for gettering is performed. That is, since the surface of the insulating layer 52 (or the interface of the insulating layer 52 and the $p^+$ layer 61) determined to be contaminated by heavy metal is exposed as shown in FIG. 28(b), ions for gettering are implanted into the exposed surface of the insulating layer 52 using a predefined ion implanter. Accordingly, an impurity layer 61a is formed by ion implantation into the surface of the $p^+$ layer 61 through the insulating layer 52.

This ion implantation process intentionally forms a defect by the ion implantation. This defect functions as a gettering side (whose region protects heavy metal). At this time, the ion implantation is performed while preventing the occurrence of another side effect to the silicon bulk or interface.

In terms of types of ions to be implanted in this process, any one of carbon, oxygen, fluorine, silicon, hydrogen, and nitride or a combination thereof can be selected. As is apparent from the contents described in a literature "T. Kuroi, et al.: SSDM '91, p 56 (1991)", a gettering effect is obtained by carbon, oxygen, fluorine, and silicon. As is apparent from the contents described in a literature "Ohyu: Research on Highly Reliable Technique for Fine P-N Junction, Dr's Archives Realize p. 97 (1999)", it can be understood that a side effect does not occur since hydrogen and nitride are ion types suitable for a (Si/$SiO_2$) interface.

It is desirable that an implantation-projected range Rp in the ion implantation process is as shallow as possible. Alternatively, it is desirable that the implantation-projected range Rp is in the vicinity of an interface of a through oxide film (or a through insulating film) and silicon or, for example, is slightly deep in order to obtain a uniform dose amount (or a uniform gettering capability). Specifically, for example, when nitride ions are implanted in a thickness of 50 nm of the through oxide film (or the insulating layer 52), it is desirable that an acceleration energy range is about 10-30 keV.

Since the gettering effect is small when an implantation amount in the ion implantation process is not enough and a bad effect occurs due to a side effect when the implantation amount is too large, the implantation amount should be determined by considering a difference of an actual device manufacturing process or a required property. Accordingly, for example, it is desirable that the dose amount is about $1\times10^{12}/cm^3$ to $1\times10^{16}/cm^3$.

In the next step S15 as shown in FIG. 25, a low-temperature anneal treatment is performed for a structure (FIG. 28(b)) in which the above-described ion implantation process has been completed in order to stabilize the property of the insulating film. In a specific example, heating is applied over one hour in a nitride atmosphere or a hydrogen atmosphere sufficiently diluted in nitride at an environmental temperature of a maximum of 400° C. Since the low-temperature anneal treatment is a thermal treatment after a metal wiring, the maximum temperature is to be limited to 400 to 500° C. When this low-temperature anneal treatment is performed, impurities of an ion implantation region are diffused and the gettering property is stabilized. Alternatively, the low-temperature anneal treatment process as described above can be omitted.

In the next step S16 as shown in FIG. 25, the remaining components are formed in the structure (FIG. 28(b)) for which the above-described process has been completed. That is, as shown in FIG. 28(c), the planarization layer (or resist) 91 is formed on the insulating layer 52, the color filter 92 is formed thereon, and the microlens 93 is formed thereon.

In the above-described manufacturing process, for example, the following modified examples are also considered. That is, in the process between step S13 and step S14 of FIG. 25, the ion implantation can be performed after the insulating layer (or BOX layer) 52 appeared on the upper surface is reduced to a desired thickness by performing a fluorine-nitric acid treatment or a total of the insulating layer 52 is removed by performing the fluorine-nitric acid treatment. In this case, since a layer contaminated by heavy metal is completely removed, the occurrence of a dark current can be surely prevented.

After the insulating layer 52 is removed, an insulating layer of a desired thickness (or a protection film) is newly set in place of the insulating layer 52 by a treatment of low-temperature chemical vapor deposition (CVD), low-temperature oxidation, or the like, such that ion implantation into the $p^+$ layer 61 can be performed through the protection layer. In this case, the protection film protects the $p^+$ layer 61 exposed on the surface, such that an unnecessary damage can be prevented. However, since the formation of the protection film is processed after the metal wiring, the maximum temperature is limited to 400-500° C.

A method of forming a gettering layer based on the above-described ion implantation is completed by only adding an ion implantation process during a manufacturing process and does not require a special preparation. Additionally, there can be considered methods of forming various gettering layers such as a method of generating a distortion in an interface, for example, by depositing thin polysilicon on a surface of a semiconductor substrate. However, in comparison with these methods, a manufacturing method according to the invention is superior in that a manufacturing process not only can be simplified, but also an extra layer does not need to be formed. The formation can be selectively made in a required depth position within the semiconductor substrate since ion implantation depth can be arbitrarily set, such that the gettering effect can be surely achieved.

Next, an imaging apparatus having a backside illuminated imaging device in accordance with the embodiment will be described.

Figure 29:
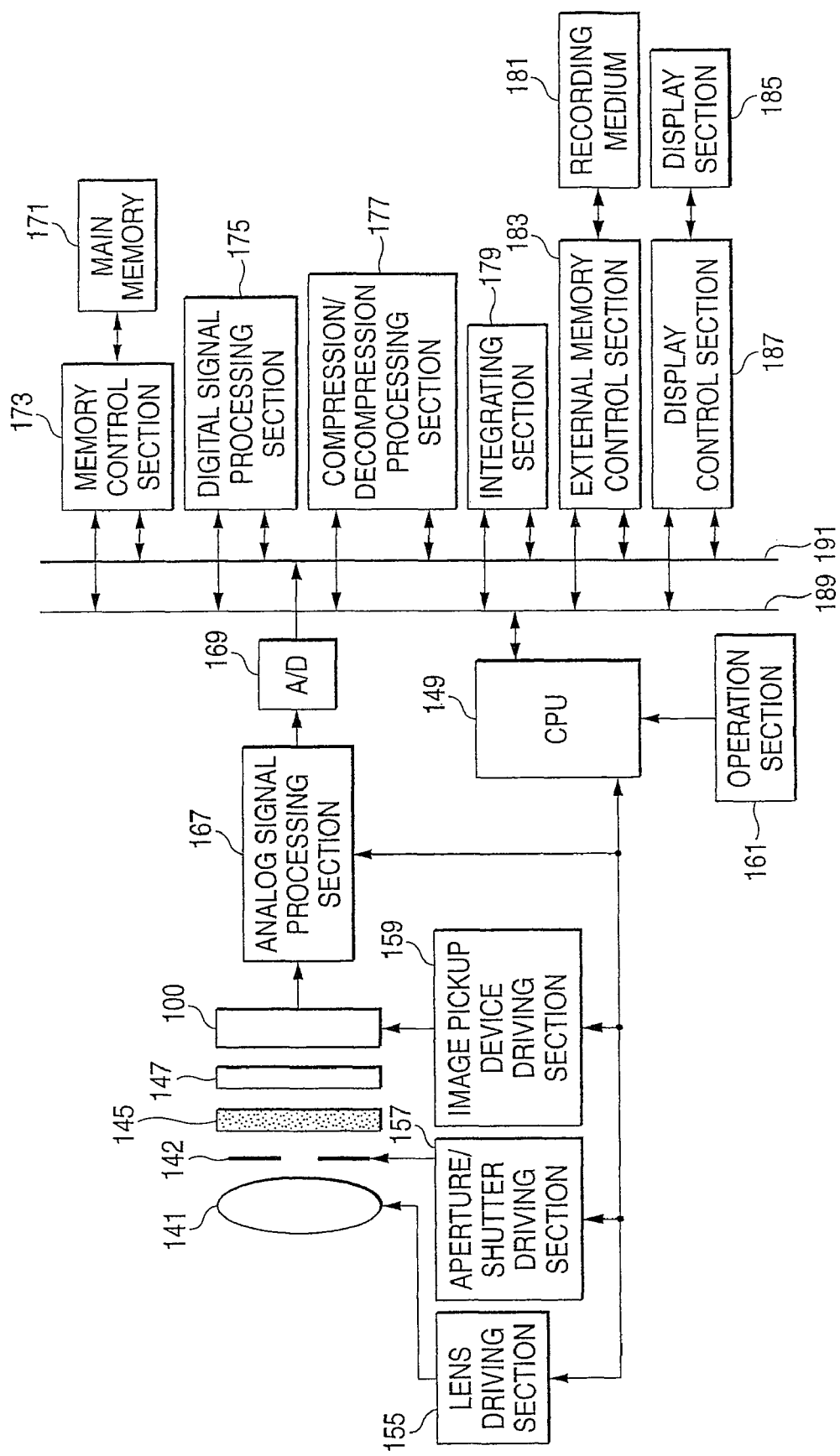
FIG. 29 is a block diagram of a digital camera having a built-in backside illuminated imaging device.

FIG. 29 is a block diagram showing a digital camera having a built-in backside illuminated imaging device in accordance with the invention.

The digital camera as shown in the FIG. 29 includes a imaging lens 141, the above-described backside illuminated imaging device 100, an aperture 142 provided therebetween, an infrared cut filter 145, and an optical low pass filter 147.

A central processing unit (CPU) 149 drives the backside illuminated imaging device 100 through an image pickup driving section 159, and outputs an image of an object photographed through the imaging lens 141 in a color signal. An instruction signal from a user is input to the CPU 149 through an operation section 161. The CPU 149 performs each control operation in response to an instruction.

An electrical control system of the digital camera includes an analog signal processing section 167 connected to an output of the backside illuminated imaging device 100, and an analog-to-digital (A/D) converting section 169 for converting a color signal of RGB output from the analog signal processing section 167 into a digital signal. The CPU 149 controls these components.

Moreover, the electrical control system of the digital camera includes a memory control section 173 connected to a main memory (or frame memory) 171, a digital signal processing section 175 for performing image processes such as a gamma correction arithmetic operation, an RGB/YC conversion process, an image synthesis process, and the like, a compression/decompression processing section 177 for compressing a pickup image into an Joint Photographic Experts Group (JPEG) image or decompressing a compressed image, an integrating section 179 for integrating photometry data and computing a gain of white balance correction to be performed by the digital signal processing section 175, an external memory control section 183 to which a removable recording medium 181 is connected, and a display control section 187 to which a liquid crystal display section 185 mounted in a camera back surface is connected. These components are connected to each other via a control bus 189 and a data bus 191 and are controlled in response to an instruction from the CPU 149. The electrical control system is configured to include an image signal generating means.

According to the digital camera of the above-described configuration, signal charges based on a received light amount of each pixel is read out from the backside illuminated imaging device 100 and object image data is generated from the digital signal processing section 175 or the like. Since the backside illuminated imaging device is adopted in the imaging apparatus, the obtained object image data can be an image in which the degradation of image quality due to a dark current is small, and can be constantly stable and high-quality image data. Since the imaging apparatus is configured with the backside illuminated imaging device, a solid-state imaging device is easily miniaturized, such that a high-resolution image can be obtained in the same device size.

The above-described digital camera can be applied to any of still image photography and motion image photography. Accordingly, the imaging apparatus according to the invention can be applied to various image pickup means such as a digital still camera, a video camera, and the like.

As described above, a method of manufacturing a backside illuminated imaging device, a backside illuminated imaging device, and an imaging apparatus having the same according to the invention can be applied to, for example, a visible light image sensor and the like, can prevent the degradation of sensitivity even when an area of each cell is small in the backside illuminated type, and can suppress an increase in a dark current since a high gettering capability can be obtained.

<Fifth Aspect>

The same configuration as in the backside illuminated imaging device 100 of FIG. 1 can be adopted as one of the fifth aspect.

A more detailed embodiment related to a manufacturing process of the backside illuminated imaging device in accordance with the fifth aspect will be described below with reference to FIGS. 30 to 36.

Figure 30:
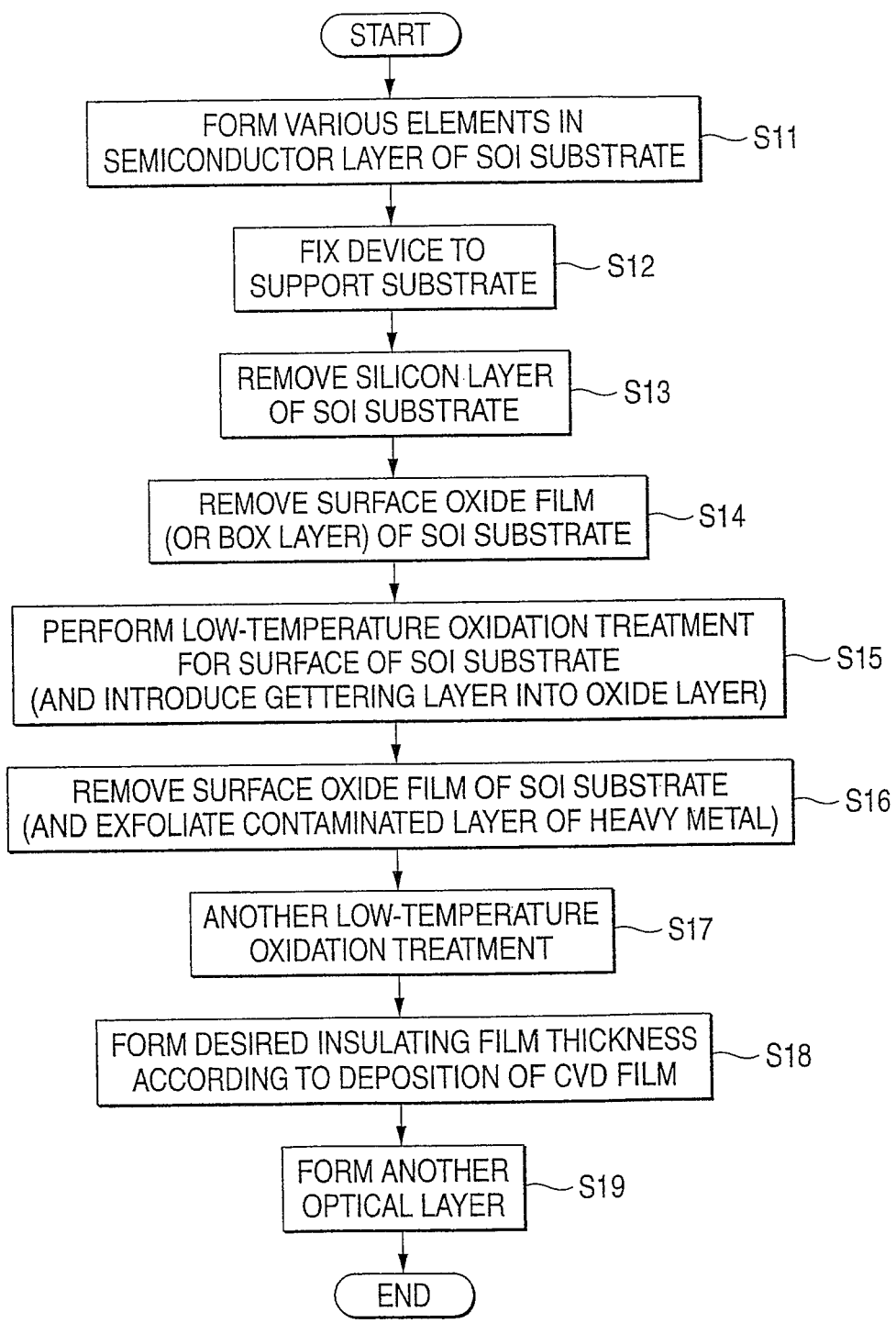
FIG. 30 is a flowchart schematically showing a procedure of important manufacturing processes for the backside illuminated imaging device in accordance with an exemplary embodiment of the fifth aspect.

FIG. 30 is a flowchart schematically showing a procedure of important manufacturing processes for the backside illuminated imaging device, and FIGS. 31 to 35 are cross-sectional views showing the backside illuminated imaging device and a configuration in a device thickness direction in each process in the course of manufacturing the same.

Figure 31:
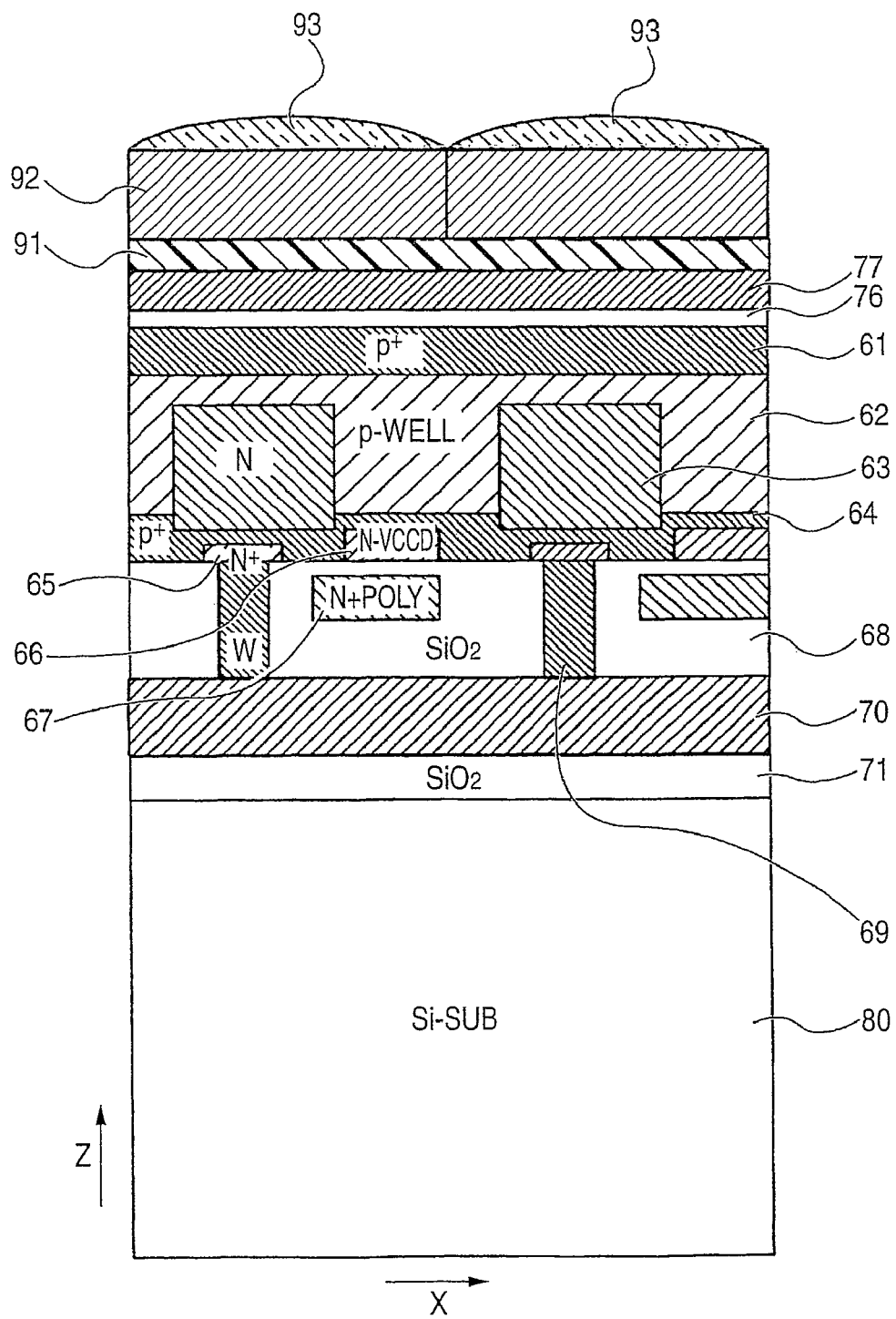
FIG. 31 is a cross-sectional view showing a configuration in a device thickness direction of the backside illuminated imaging device in accordance with an exemplary embodiment of the fifth aspect.

That is, this embodiment considers the case where the backside illuminated imaging device shown in FIG. 31 is manufactured. The basic structure of the backside illuminated imaging device shown in FIG. 31 is similar to that shown in FIG. 1. For example, the n$^+$ layer (or overflow drain) 6 of FIG. 1 corresponds to an n$^+$ layer 65 of FIG. 31. It is should be noted that a direction of the backside illuminated imaging device shown in FIG. 31 is placed oppositely in top and bottom relationship with respect to the backside illuminated imaging device of FIG. 1.

First, the backside illuminated imaging device of FIG. 31 representing a completion state will be described. In the backside illuminated imaging device as shown in FIG. 31, a second semiconductor support substrate 80, an insulating layer 71, and an electrode (aluminum) 70 are formed in line order from the lower side in an arrow Z direction. In an insulating layer 68, an electrode (tungsten) 69 and an n$^+$ polysilicon region 67 are formed. In a p$^+$ layer 64, a charge transfer region (or n$^-$ region) 66 corresponding to the n$^+$ polysilicon region 67 and an n$^+$ region 65 connected to the electrode 69 are formed. A photoelectric conversion region (or n-type semiconductor region) 63 is formed from the p layer 62 to the p$^+$ layer 64, and a p+ layer 61, an insulating layer 52, a planarization layer (or resist) 91, a color filter 92, and a microlens 93 are formed thereon. The electrodes 69 and 70 can suitably use aluminum, high melting point metal of W, Mo, or the like, polysilicon, or the like other than the above-described materials.

In a semiconductor layer 51 serving as the semiconductor substrate of the final shape according to the above-described configuration, the photoelectric conversion region 63 including a light receiving portion and a transfer portion for transferring signal charges generated in the photoelectric conversion region 63 are formed. A low-temperature oxide film 76 and a CVD film 77 on an outer side of the oxide film are formed in this order on the surface of the back side as the light incident side, i.e., the surface of a p$^+$ layer 61. The CVD film 77 serves as an incident light side surface to the semiconductor substrate, and a color filter 92 and a microlens 93 are formed on the outer side of the CVD film 77 through a planarization layer 91.

The upper side in FIG. 31 serves as the back surface of the backside illuminated imaging device. Light is incident into the microlens 93 formed from the upper side to the upper surface. The incident light is transmitted to the microlens 93, the color filter 92, the planarization layer 91, the insulating layer 52, the p$^+$ layer 61, and the p layer 62 and reaches the photoelectric conversion region (or n-type semiconductor region) 63 forming the photodiode. Then, signal charges generated in a photoelectric conversion region 63 are transferred to a transfer portion. Accordingly, since the light incident into the photodiode is shielded by the electrode (aluminum) 70 or the electrode (tungsten) 69, a large opening area can be achieved even when a size of an image pickup cell (or an imaging portion of one pixel) is small.

A schematic manufacturing process when the backside illuminated imaging device is manufactured is shown in FIG. 30. The process will be sequentially described with reference to FIGS. 31 to 35.

Figure 32:
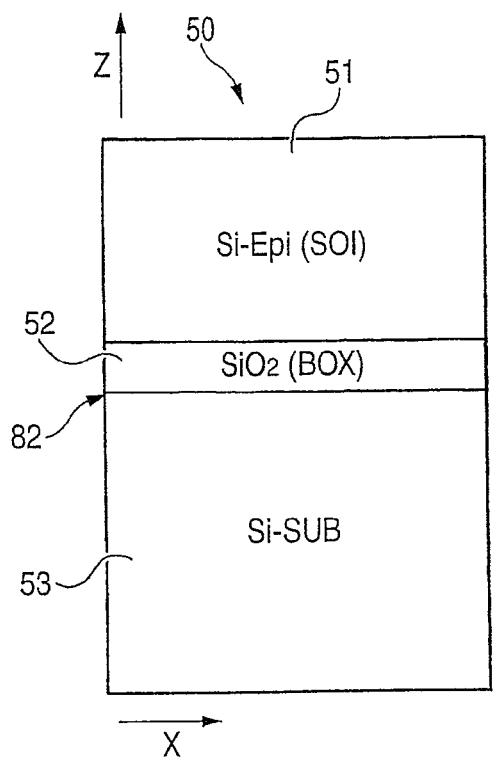
FIG. 32 is a cross-sectional view showing a configuration in a device thickness direction in each process in the course of manufacturing the backside illuminated imaging device in accordance with an exemplary embodiment of the fifth aspect.
Figure 32:
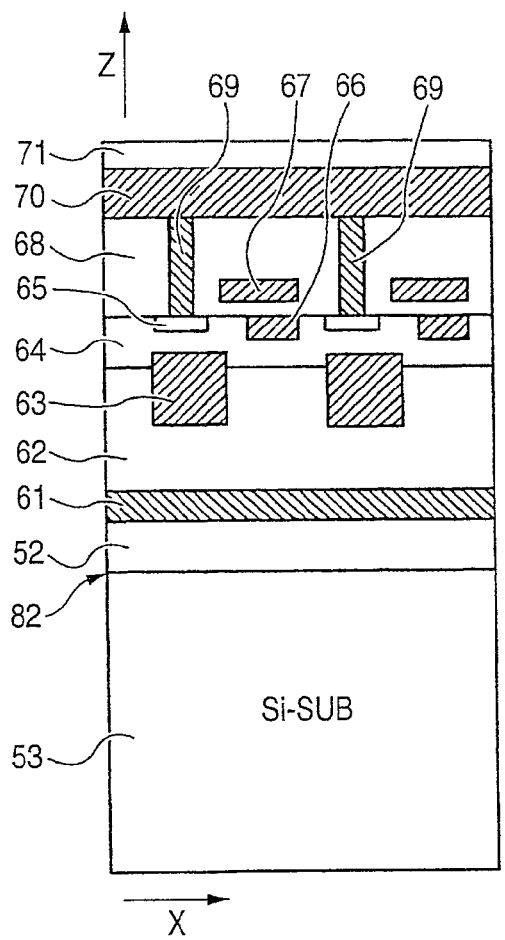
Figure 33:
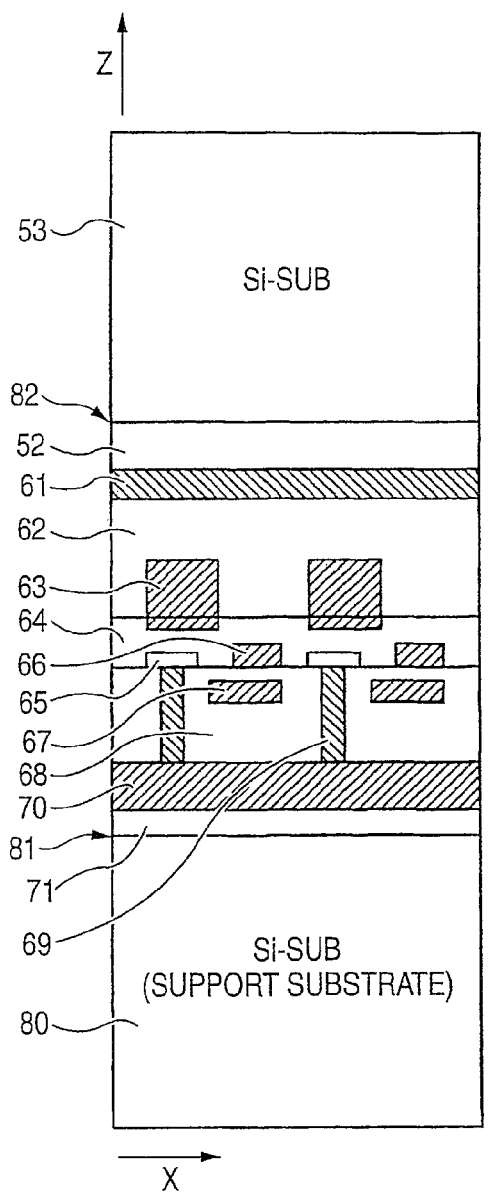
FIG. 33 is a cross-sectional view showing a configuration in a device thickness direction in each process in the course of manufacturing the backside illuminated imaging device in accordance with an exemplary embodiment of the fifth aspect.
Figure 33:
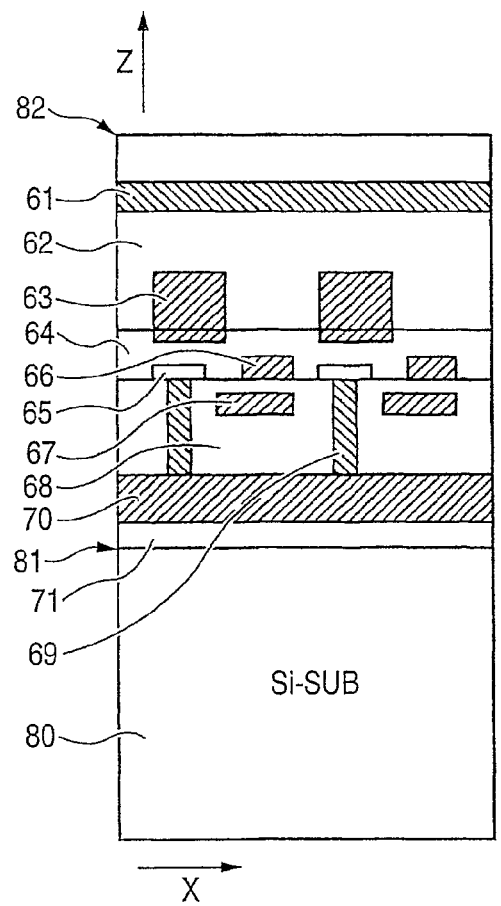

First, a semiconductor substrate 50 as shown in FIG. 32(*a*) is prepared as a wafer. In this example, a silicon-on-insulator (SOI) substrate configured with a first semiconductor layer (or SOI layer) 51, an insulating layer 52, and a first semiconductor support substrate 53 is used as the semiconductor substrate 50.

The first semiconductor support substrate 53 is a support substrate of silicon (Si), the insulating layer 52 is a SiO$_2$ layer (or a BOX layer) having compression stress, and the first semiconductor layer (or SOI layer) 51 is an epitaxial layer (Si-Epi) of defect-free silicon. When a backside illuminated imaging device for performing photography in a visible light wavelength range is manufactured, a thickness of the semiconductor layer (or SOI layer) 51 needs to be about 3-20 μm according to absorption property of visible light. If quality is sustainable in conventional LSI manufacturing, there is no special limitation in terms of the insulating layer 52.

In the process of step S11 as shown in FIG. 30, various types of components of a device are formed in a portion of the conductivity type semiconductor substrate (or SOI layer) 51 of the semiconductor substrate 50 shown in FIG. 32(a). In other words, the photoelectric conversion region including the light receiving portion and the charge transfer portion for transferring signal charges generated in the photoelectric conversion region to a signal output portion are formed in the SOI layer 51 (first step). The resulting state is shown in FIG. 32(b). In this example, important elements corresponding to one cell of the backside illuminated imaging device are formed. Specifically, the top and bottom of a configuration from the $p^+$ layer 61 to the insulating layer 71 as shown in FIG. 31 are reversed.

The photoelectric conversion region (or n-type semiconductor region) 63 forms a photodiode for generating signal charges based on incident light, and the charge transfer region (or $n^-$ region) 66 forms a vertical transfer CCD for transferring the signal charges to a desired position. The electrodes 69 and 70 are used to apply a voltage for reading out or transferring the signal charges to each portion. Of course, a MOS structure can be used in place of the CCD configuration.

In the next step S12 as shown in FIG. 30, the second semiconductor support substrate (or silicon support substrate) 80 is prepared in advance. The top and bottom of the structure of the state as shown in FIG. 32(b) are reversed in the arrow Z direction and the lower surface of the insulating layer serving as the lower side is attached firmly to the upper surface of the second semiconductor support substrate 80, such that they are attached and fixed (second step). In other words, the top and bottom of the semiconductor substrate (or SOI substrate) 50 are reversed and the surface opposite to the first semiconductor support substrate 53 of the semiconductor substrate 50 is fixed to the second semiconductor support substrate 80. The resulting state is shown in FIG. 33(a). The top and bottom are reversed in this embodiment, but the embodiment is not limited thereto. Of course, a junction with the second semiconductor support substrate 80 is possible in the natural state without reversal.

In the next step S13 as shown in FIG. 30, the upper side of the drawing in the structure of the state of FIG. 33(a), that is, the first semiconductor support substrate 53, is removed (third step (1)). Specifically, after performing a treatment of mechanical polishing (MP), chemical-mechanical polishing (CMP), or the like, the first semiconductor support substrate 53 is removed by performing a fluorine treatment or the like. As a result, the surface of the insulating layer 52 serving as a boundary surface 82 is exposed on the upper side of the drawing as shown in FIG. 33(b).

Herein, since it is considered that an interface of the $p^+$ layer 61 and an insulating layer (or oxide film) 52 is contaminated by heavy metal through the previous manufacturing process, ion implantation for gettering can be performed and an impurity layer (not shown) can be formed by ion implantation into the surface of the $p^+$ layer 61 through the insulating layer 52.

In the next step S14 as shown in FIG. 30, the insulating layer (or oxide film) 52 exposed on the surface, that is, a total of the BOX layer, is exfoliated by performing, for example, a fluorine-nitric acid treatment or the like (third Step (2)). The resulting state is shown in FIG. 34(a).

Herein, a portion exposed on the surface, that is, a portion serving as an interface of the $p^+$ layer 61 and the insulating layer 52 (hereinafter, referred to as a gettering side) has a powerful gettering capability (or a capability of getting heavy metal or the like) even when the above-described ion implantation is not performed. This gettering side has a function for preventing a bad influence due to the obtained heavy metal. However, since the gettering side is close to a device operation region (or a depletion region) in the case of the backside illuminated imaging device, there is a high possibility that the gettering side itself serves as a source for generating a dark current.

In the next step S15 as shown in FIG. 30, a low-temperature anneal treatment (or a low-temperature oxidation treatment) is performed in the vicinity of the surface of the SOI substrate of the state as shown in FIG. 34(a) in order to suppress the dark current occurring due to the gettering side (Fourth Step). Accordingly, since a low-temperature oxide film 75 of the compact structure as shown in FIG. 34(b) is formed, the gettering side is introduced into the low-temperature oxide film 75. That is, the gettering side is electrically separated from other regions by the low-temperature oxide film 75, such that a dark current is suppressed from being generated.

Since the low-temperature oxidation treatment in step S15 is a heat treatment after a metal wiring, a consideration is required to avoid a bad influence to the wiring. Accordingly, a maximum temperature of the heat treatment should be limited to about 400 to 500° C. The thickness of the oxide film to be formed should be about 5 to 10 nm.

A specific example related to the low-temperature oxidation treatment of step S15 will be described.

Specific Example 1

Temperature: 300 ti 500° C.
Pressure: 100 to 200 Pa
Used Gases: $Ar/O_2/H_2$ (of a mixture ratio of 100/1/1)

In the above conditions, oxygen gas is plasmanized with microwaves. Accordingly, the oxygen gas becomes highly active oxygen radical and sacrificial oxidation can be performed in the vicinity of the surface on which the SOI substrate is exposed. Actually, a high-quality oxide film having a film thickness of 10 nm is generated by radiating the microwaves for 150 seconds. However, the gases other than oxygen of the available gases are not essential. Argon (Ar) is an inactive carrier gas and hydrogen is used for the purpose of promoting oxidation.

Since oxidation is performed in only a reaction rate control region also for the highly active oxygen radical, a range up to a film thickness of 10 nm is a practical region in the low-temperature oxidation treatment. When an oxide film of more than the film thickness of 10 nm is formed, productivity is lowered since the continuous reaction is required for a long time.

Specific Example 2

Temperature: 400° C.
Pressure: 100 to 200 Pa
Used Gas: High-concentration ozone

In the above conditions, the low-temperature oxidation treatment is performed. Also in this case, a practical thickness range of a film to be formed is about 10 nm.

Figure 35:
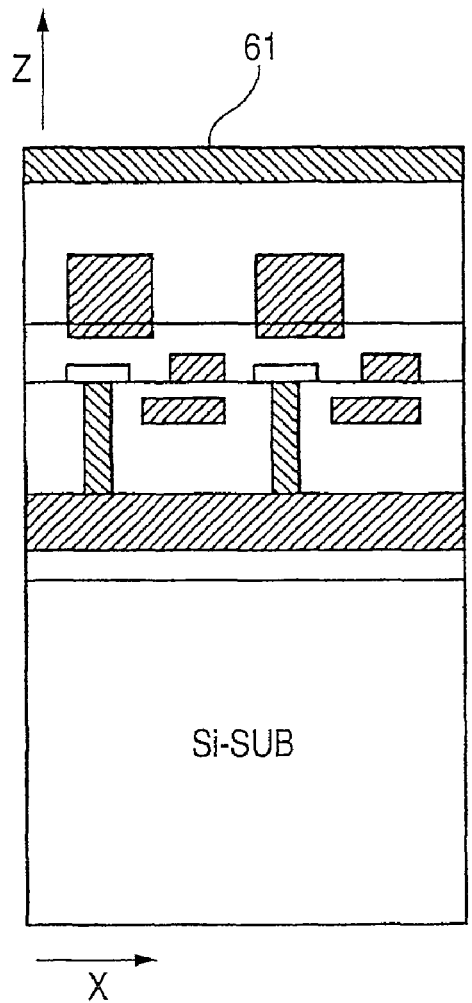
FIG. 35 is a cross-sectional view showing a configuration in a device thickness direction in each process in the course of manufacturing the backside illuminated imaging device in accordance with an exemplary embodiment of the fifth aspect.
Figure 35:
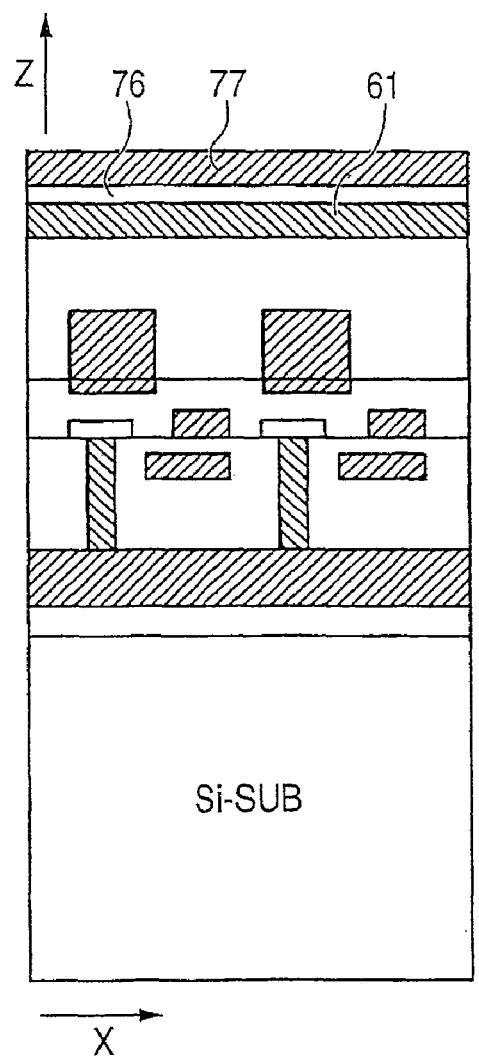

In the next step S16 as shown in FIG. 30, the low-temperature oxide film 75 of the surface (see FIG. 34(b)) formed in step S15 is removed (Fifth Step). For example, the low-temperature oxide film can be removed by performing a fluorine-nitric acid treatment or the like. That is, since the low-temperature oxide film 75 contains the gettering layer contaminated by heavy metal, the contaminated layer can be completely removed by exfoliating a total of the low-temperature oxide film 75. The resulting state is shown in FIG. 35(*a*).

In the next step S17 as shown in FIG. 30, another low-temperature oxidation treatment is performed in the vicinity of the surface on which the SOI substrate is exposed. An uncontaminated clean low-temperature oxide film 76 (of a thickness of 5 to 10 nm) is newly formed on the surface on which the low-temperature oxide film 75 has been removed (see FIG. 35(*b*)) (sixth Step). The other low-temperature oxidation treatment can be the same as that of step S15. The formed low-temperature oxide film does not contain the above-described heavy metal.

The film thickness of the low-temperature oxide film 76 formed in step S17 is not sufficient for an insulating layer thickness required for the device. In order to form the insulating layer of a desired thickness, a chemical vapor deposition (CVD) film 77 is deposited on the surface of the low-temperature oxide film 76 in the next step S18, such that the desired thickness is obtained (seventh Step). The film thickness of the CVD film 77 is set to, for example, 50 nm. As a result, the device as shown in FIG. 35(*b*) is formed.

When the CVD film 77 is formed in step S18, for example, a low-temperature (400° C.) CVD treatment of normal pressure plasma can be performed. That is, a gas containing the base material is plasmanized at a high frequency, such that the base material is highly reactive in a radical state and is absorbed and deposited on the substrate.

In the next step S19 as shown in FIG. 30, the remaining components are formed in the structure (FIG. 35(*b*)) for which the above-described process has been completed. That is, as shown in FIG. 31, the planarization layer (or resist) 91 is formed on the insulating layer 52, the color filter 92 is formed thereon, and the microlens 93 is formed thereon.

According to this embodiment as described above, there is a high possibility that the gettering side becomes a dark current source, that is, a noise source since an interface itself of the SOI layer and the BOX layer forming the semiconductor substrate is close to a device operation region (or a depletion region). However, the gettering side can be introduced into the oxide film by low-temperature oxidation, such that a dark current is suppressed from being generated.

Next, a modified embodiment of the fifth aspect will be described below.

Figure 36:
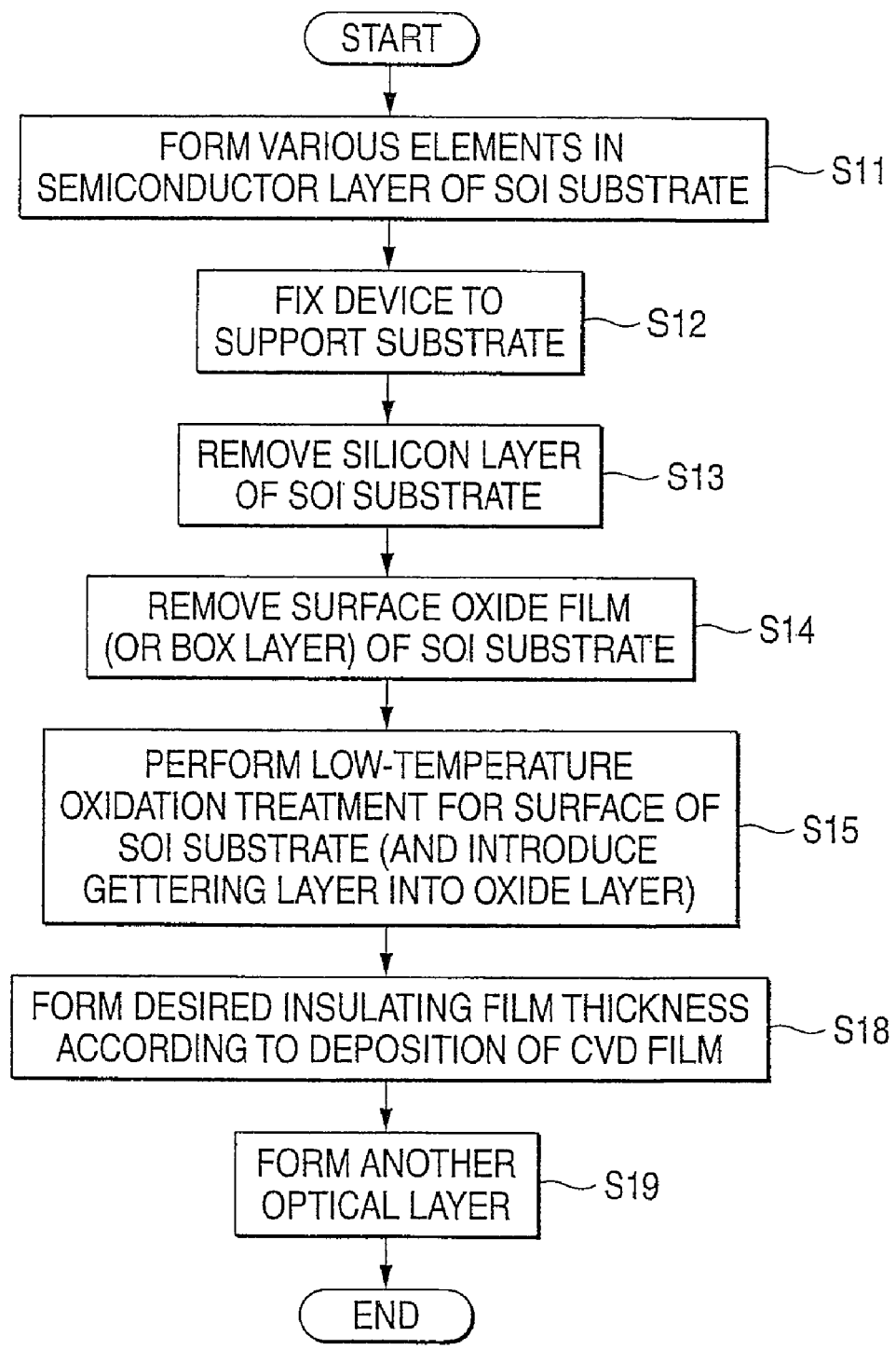
FIG. 36 is a flowchart showing a modified example of a procedure of important manufacturing processes for the backside illuminated imaging device in accordance with an exemplary embodiment of the fifth aspect.

FIG. 36 is a flowchart showing a modified example of a procedure of important manufacturing processes for the backside illuminated imaging device in accordance with the fifth aspect.

It is considered that the above-described manufacturing processes as shown in FIG. 30 are changed as shown in FIG. 36. For example, steps S16 and S17 can be omitted.

In this embodiment, the CVD film 77 is deposited on the resulting surface in step S18 without removing the low-temperature oxide film 75 after the low-temperature oxide film 75 is formed and the gettering layer is introduced into the low-temperature oxide film 75 in step S15. In this modified example, a region containing the gettering layer contaminated by heavy metal or the like is residual on the device as it is. Since the gettering layer is introduced into the low-temperature film 75, the contaminated region is electrically separated from other regions by the low-temperature oxide film, thereby suppressing a dark current from being generated. Since steps S16 and S17 as shown in FIG. 30 are omitted, the fabrication can be more simplified.

Figure 37:
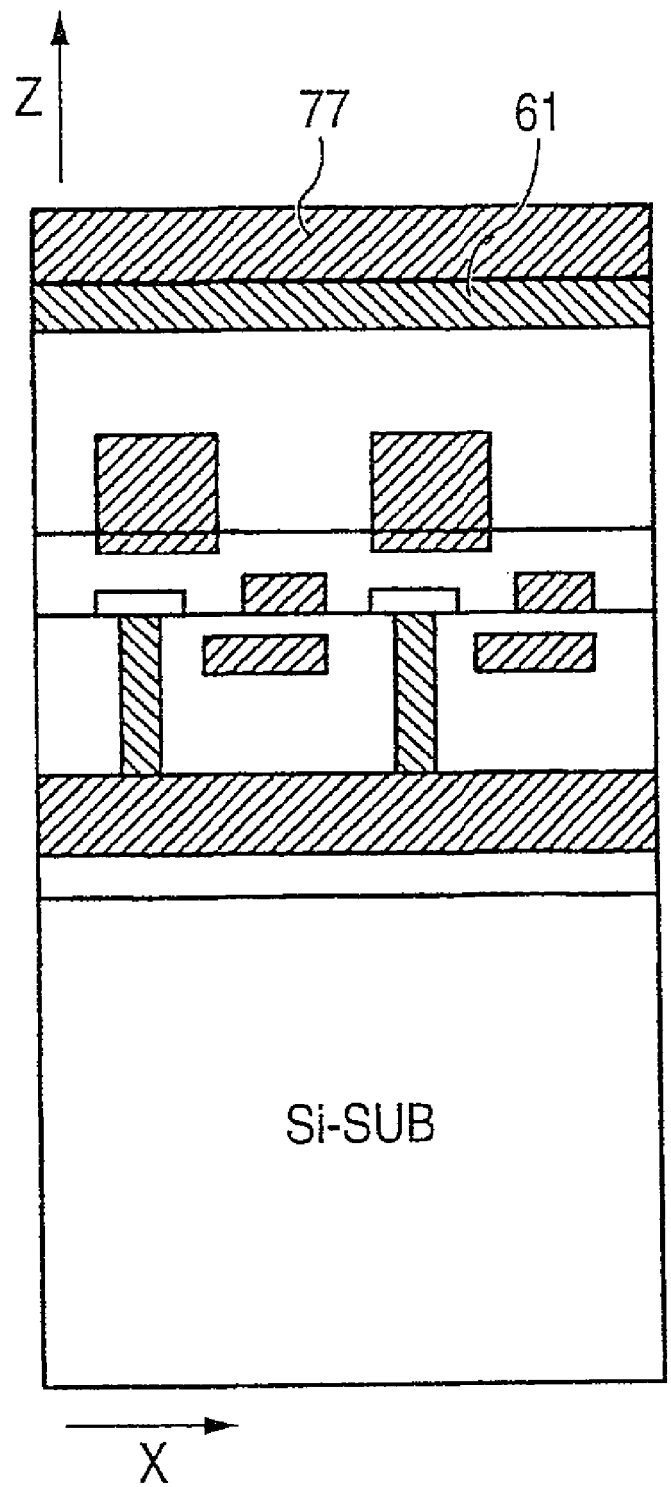
FIG. 37 is a cross-sectional view showing a configuration in a device thickness direction in a modified example in which a low-temperature oxidation treatment in accordance with an exemplary embodiment of the fifth aspect is not performed.
Figure 38:
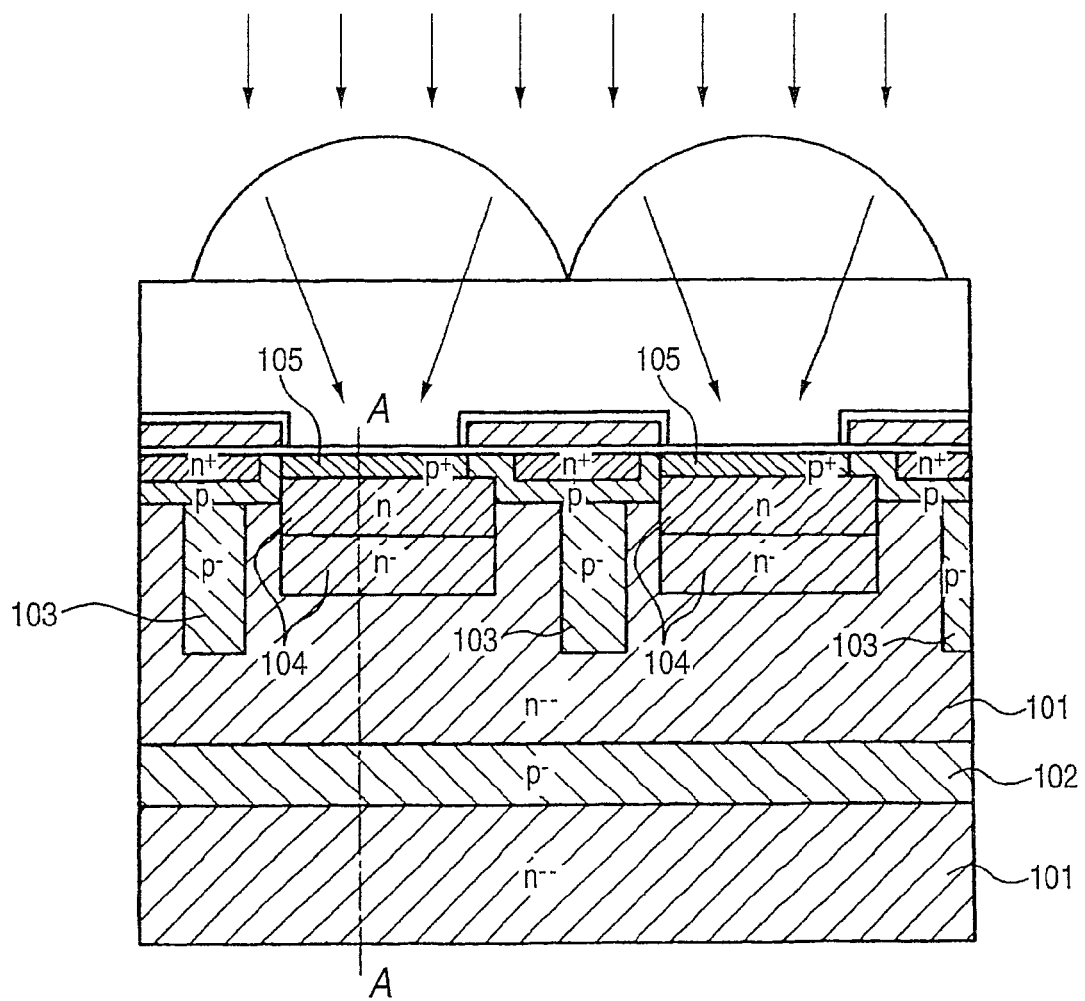
FIG. 38 is a schematic cross-sectional view of a general CCD type solid-state imaging device.
Figure 39:
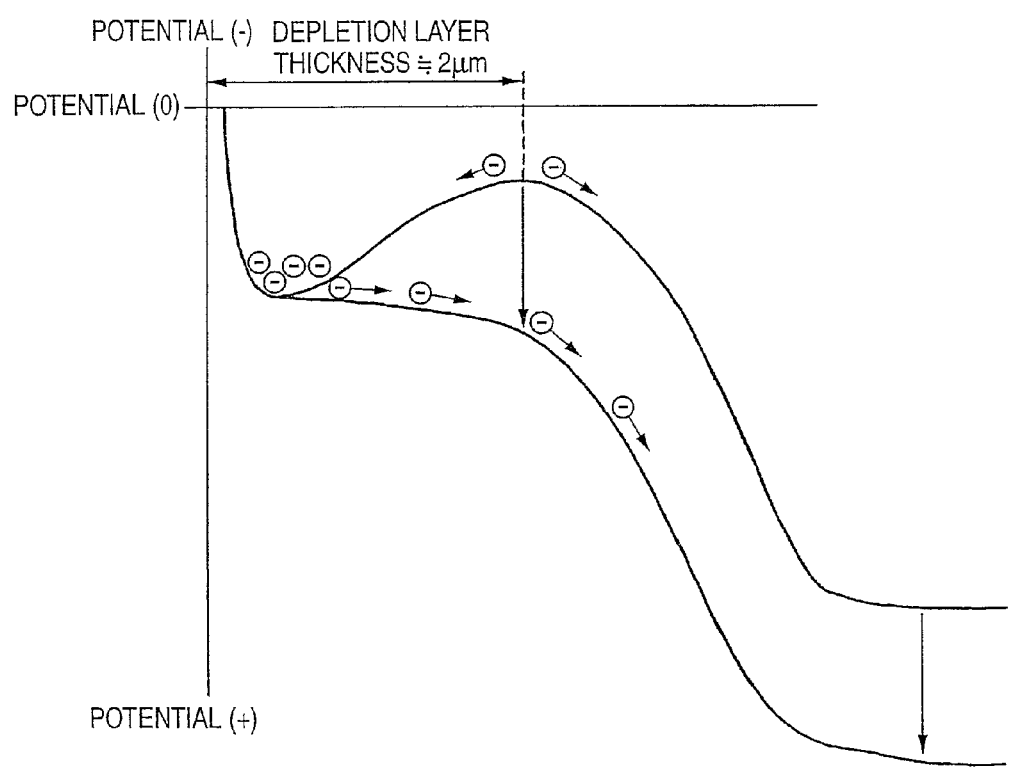
FIG. 39 is a view showing a potential profile taken along the line A-A of FIG. 38.

In another modified example, the CVD film 77 can be directly formed as shown in FIG. 37 without going through the low-temperature oxidation process after the low-temperature oxide film 75 is formed in step S15 of FIG. 30 and the low-temperature oxide film 75 is removed in step S16. Also in this case, a dark current is suppressed from being generated since the gettering layer contaminated by heavy metal or the like is removed.

As an imaging apparatus including the above-described backside illuminated imaging device, the same configuration as in the fourth aspect can be adopted.

While the invention has been described with reference to the exemplary embodiments, the technical scope of the invention is not restricted to the description of the exemplary embodiments. It is apparent to the skilled in the art that various changes or improvements can be made. It is apparent from the description of claims that the changed or improved configurations can also be included in the technical scope of the invention.

What is claimed is:

1. A method for manufacturing a backside illuminated imaging device that performs imaging by receiving light at a back side of a semiconductor substrate to generate electric charges in the semiconductor substrate based on the light and reading out the electric charges from a front side of the semiconductor substrate, the method comprising:
   forming a first impurity diffusion layer and a fourth impurity diffusion layer in the semiconductor substrate such that the fourth impurity diffusion layer is formed in a direction from a front side surface of the semiconductor substrate to an inner side of the semiconductor substrate and the first impurity diffusion layer having a first conductivity is formed below the fourth impurity diffusion layer, the fourth impurity diffusion layer having a second conductivity and preventing a dark current;
   forming an insulating layer on the semiconductor substrate in which the first impurity diffusion layer and the fourth impurity diffusion layer are formed;
   forming an opening in a portion of the insulating layer to expose a portion of a surface of the fourth impurity diffusion layer;
   forming a second impurity diffusion layer at the exposed portion in the fourth impurity diffusion layer by self-alignment in which the insulating layer serves as a mask; and
   embedding a conductive material in the opening to form an electrode,
   wherein a portion except the second impurity diffusion layer of the fourth impurity diffusion layer constitutes a third impurity diffusion layer.

2. The method according to claim 1, wherein the second impurity diffusion layer is formed by vertical ion implantation to a surface of the fourth impurity diffusion layer exposed from the opening.

3. The method according to claim 1, wherein the second impurity diffusion layer is formed by oblique ion implantation in at least four directions to a surface of the fourth impurity diffusion layer exposed from the opening.

4. The method according to claim 1, further comprising:
   forming a fifth impurity diffusion layer having the second conductivity below the second impurity diffusion layer by self-alignment in which the insulating layer serves as the mask, between the forming of the second impurity diffusion layer and the forming of the electrode,
   wherein a portion except the second impurity diffusion layer of the fourth impurity diffusion layer and the fifth impurity diffusion layer constitute the third impurity diffusion layer.

5. The method according to claim 4, wherein the fifth impurity diffusion layer includes impurities having a diffusion coefficient larger than that of impurities in the second impurity diffusion layer.

6. The method according to claim 4, wherein the fifth impurity diffusion layer is formed by vertical ion implantation to a surface of the fourth impurity diffusion layer exposed from the opening.

7. The method according to claim 4, wherein the fifth impurity diffusion layer is formed by oblique ion implantation in at least four directions to a surface of the fourth impurity diffusion layer exposed from the opening.

8. The method according to claim 1, wherein the conductivity material is tungsten.

* * * * *